United States Patent
Fujimaki

(10) Patent No.: US 7,416,835 B2
(45) Date of Patent: Aug. 26, 2008

(54) POLYMERIZABLE COMPOSITION

(75) Inventor: Kazuhiro Fujimaki, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 10/781,862

(22) Filed: Feb. 20, 2004

(65) Prior Publication Data

US 2005/0106495 A1 May 19, 2005

(30) Foreign Application Priority Data

Feb. 20, 2003 (JP) ............... P.2003-043087
Jul. 10, 2003 (JP) ............... P.2003-194852

(51) Int. Cl.
G03C 1/73 (2006.01)
G03C 1/76 (2006.01)
G03F 7/028 (2006.01)
G03F 7/09 (2006.01)

(52) U.S. Cl. ............ 430/281.1; 430/285.1; 430/271.1; 430/302; 430/916; 430/944

(58) Field of Classification Search ............ 430/270.1, 430/281.1, 944, 271.1, 302, 306
See application file for complete search history.

(56) References Cited

U.S. PATENT DOCUMENTS

| 4,708,925 A | 11/1987 | Newman |
| 6,309,792 B1 | 10/2001 | Hauck et al. |
| 2002/0025489 A1* | 2/2002 | Shimada et al. .......... 430/270.1 |
| 2002/0197564 A1 | 12/2002 | Timpe et al. |
| 2003/0118939 A1* | 6/2003 | Munnelly et al. ........ 430/273.1 |
| 2003/0124460 A1* | 7/2003 | Munnelly et al. ........ 430/273.1 |
| 2004/0091811 A1* | 5/2004 | Munnelly et al. ........ 430/270.1 |

FOREIGN PATENT DOCUMENTS

| EP | 1 369 232 A1 * | 12/2003 |
| JP | 8-276558 A | 10/1996 |
| JP | 11-65105 A | 3/1999 |
| JP | 2000-89455 A | 3/2000 |
| JP | 2002-82429 A | 3/2002 |
| JP | 2002-90985 A | 3/2002 |
| WO | WO 00/48836 A1 | 8/2000 |
| WO | WO 03/041962 A1 | 5/2003 |
| WO | WO 03/066338 A1 | 8/2003 |
| WO | WO 03/091022 A1 | 11/2003 |
| WO | WO 2004/041544 A1 | 5/2004 |
| WO | WO 2004/043935 A1 | 5/2004 |

OTHER PUBLICATIONS

European Search Report dated Mar. 23, 2005.

* cited by examiner

Primary Examiner—Sin J. Lee
(74) Attorney, Agent, or Firm—Sughrue Mion, PLLC

(57) ABSTRACT

A polymerizable composition comprising: (A) a compound which causes at least one of decarboxylation and dehydration by heat; (B) a radical initiator; (C) a compound having at least one ethylenically unsaturated bond; and (D) an infrared ray absorber.

7 Claims, No Drawings

POLYMERIZABLE COMPOSITION

FIELD OF THE INVENTION

The present invention relates to a polymerizable composition that is used in image recording materials of three-dimensional prototyping, holography, lithographic printing plate material, color proof, photo resist, color filter, and the like and inks, paints, adhesives, etc. In particular, the invention relates to a polymerizable composition that is suitably used as a recording material of negative working lithographic printing plate precursor capable of being subjected to so-called direct plate making from digital signals of a computer, etc. using an infrared laser.

BACKGROUND OF THE INVENTION

In recent years, development of laser is conspicuous. In particular, with respect to solid laser and semiconductor laser capable of radiating infrared rays having a wavelength of from 760 nm to 1,200 nm (may be referred to as "infrared laser", hereinafter), those having a high output and small size have become readily available. Especially, in the field of lithographic printing, these infrared lasers are very useful as a recording light source in direct plate making of printing plates according to digital data of a computer, etc. Following this, various investigations have been also made about recording materials of a lithographic printing plate precursor sensitive to a variety of laser beams. There are known positive working recording materials sensitive to infrared laser having a photosensitive wavelength of 760 nm or more (see U.S. Pat. No. 4,708,925) and negative working recording materials of an acid catalyst crosslinking type (see JP-A-8-276558).

Usually, negative working image recording materials capable of undergoing recording upon exposure with infrared rays contain an infrared ray absorber that absorbs energy of infrared beam to convert it into heat, a radical initiator that generates a radical by the heat obtained from the infrared ray absorber, and a polymerizable compound that is polymerized by the generated radical as an initiator, and utilize a recording mode in which a recording layer of an exposed area (image recording material) is cured due to the occurrence and progress of polymerization reaction of the polymerizable compound to form an image. These negative working image recording materials involved such a problem that the sensitivity is low as compared with positive working image recording materials of causing solubilization of a recording layer by energy of infrared rays. Accordingly, image recording materials made of a polymerizable composition having high sensitivity to such an infrared recording light source, i.e., negative working image recording materials whose solubility in a developing solution largely lowers upon exposure with infrared rays are being demanded.

As image recording materials that are aimed to enhance the sensitivity, there are known those containing a component having excellent reactivity with light or heat such as chemical amplification type photosensitive materials (see JP-A-11-65105) and photosensitive materials utilizing polymerization of an ethylenically unsaturated compound (see JP-A-2000-89455). Further, with respect to the photosensitive materials utilizing polymerization of an ethylenically unsaturated compound, there are known photosensitive materials to which a reduction type additive is added (see JP-A-2002-82429), photosensitive materials to which a dithio compound or the like is added (see JP-A-2002-90985), and photosensitive materials to which a polycarboxylic acid compound is added (see WO 00/48836). However, any of these photosensitive materials have not yet been satisfied with practically useful sensitivity.

Also, these recording materials involved a fear of inferior storage stability such that an undesired reaction occurs in handling under white light or due to changes in the circumferential temperature, or polymerization hindrance is generated due to oxygen in air.

SUMMARY OF THE INVENTION

Taking into the above-described defects of the related-art technologies, the invention has been made, an object of which is to provide a polymerizable composition that is useful as an image recording layer of a negative working lithographic printing plate precursor having excellent sensitivity and storage stability and a lithographic printing plate precursor wherein the foregoing polymerizable composition is used as its recording layer.

The present inventors made extensive and intensive investigations. As a result, it has been found as a first aspect of the preset invention that the foregoing object can be achieved by adding a compound which causes decarboxylation and/or dehydration by heat as a component of a polymerizable composition. Further, it has been found that the foregoing object can be achieved by adding a specific monocarboxylic acid compound as such compound or instead of such compound, leading to accomplishment of the invention.

Specifically, the polymerizable composition of the invention is characterized by comprising (A) a compound which causes decarboxylation and/or dehydration by heat, (B) a radical initiator, (C) a compound having at least one ethylenically unsaturated bond, and (D) an infrared ray absorber.

Here, (A) a compound which causes decarboxylation and/or dehydration by heat is preferably one which causes decarboxylation and/or dehydration at a temperature of 100° C. to 300° C. Specifically, it is a preferable embodiment wherein the compound has a structure capable of forming a 4 to 6-membered lactone ring, lactam ring or cyclic acid anhydride in the molecule by decarboxylation and/or dehydration by heat.

More specific embodiment of (A) a compound which causes decarboxylation and/or dehydration by heat is preferably a compound having at least one group represented by the following formula (I).

wherein:

X represents a divalent connection group selected from —O—, —S—, —SO$_2$—, —NH—, —N(R$^3$)—, and —CO—, R$^3$ represents a hydrogen atom or a monovalent substituent, R$^1$ and R$^2$ each independently represents a hydrogen atom or a monovalent substituent, provided that R$^1$ and R$^2$, either one of R$^1$ and R$^2$ and R$^3$ may be taken together to form a ring structure.

As the most preferable embodiment of (A) a compound, mention may be made of a monocarboxylic acid compound represented by the following formula (I-2).

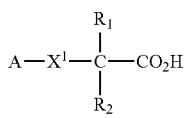

wherein:

A represents an aromatic group or a heterocyclic group, $R^1$ and $R^2$ each independently represents a hydrogen atom or a monovalent substituent, provided that $R^1$ and $R^2$, either one of $R^1$ and $R^2$ and $X^1$, either one of $R^1$ and $R^2$ and A, or A and $X^1$ may be taken together to form a ring structure, $X^1$ represents a divalent connection group selected from —O—, —S—, —SO$_2$—, —NH—, —N(R$^3$)—, —CH$_2$—, —CH(R$^4$)—, and —C(R$^4$)(R$^5$)—, and $R^3$, $R^4$, and $R^5$ each independently represents a hydrogen atom or a monovalent substituent.

In the present invention, particularly, $X^1$ in the foregoing formula (I-2) is preferably a divalent connection group selected from —NH—, —N(R$^3$)—, —CH$_2$—, —CH(R$^4$)—, and —C(R$^4$)(R$^5$)—, more preferably —NH—, and —N(R$^3$)—, and the most preferably —N(R$^3$)—.

As a substituent represented by $R^3$, are preferable those having at least one of —CO$^2$ and —CON(R$^8$) in its structure. The most preferable structure of $R^3$ is one represented by the following formula (i) or (ii). In particular, one having an snide structure represented by formula (ii) is more preferable than one having an ester structure represented by formula (i). In the following formulae, $R^6$, $R^7$ and $R^8$ each independently represents a hydrogen atom or a monovalent substituent, and Z represents a monovalent substituent. $R^8$ and Z may be taken together to form a ring structure

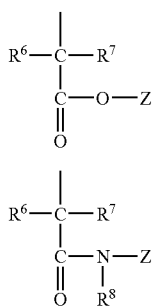

A polymerizable composition according to second aspect of the present invention is characterized by comprising (A-1) a monocarboxylic acid compound represented by the foregoing formula (I-2), (B) a radical initiator, (C) a compound having at least one ethylenically unsaturated bond, and (D) an infrared ray absorber.

A lithographic printing plate precursor of the third aspect of the present invention is characterized by comprising a support having thereon a recording layer comprising the polymerizable composition of the first aspect, while a lithographic printing plate precursor of the fourth aspect of the present invention is characterized by comprising a support having thereon a recording layer comprising the polymerizable composition described in the second aspect.

In a polymerizable composition generally used as a photosensitve layer of a negative working lithographic printing plate precursor, it is effective to lower an acid value of a binder polymer for the purpose of suppressing damage in an exposed area due to development. However, the lowering an acid value may cause such a problem that an alkali solubility of a non-exposed area (non-image area in a lithographic printing plate) may decrease. Contrary to this, in a composition having a high acid value to be excellent in elimination of a non-exposed area, an image area cured after exposure is liable to be subjected to a development damage, resulting in the decrease in printing resistance when the composition is formed into a lithographic printing plate.

Although the function of the present invention is not clear, it can be considered as follows. When in a polymerizable composition, (A) a compound which causes decarboxylation and/or dehydration by heat (optionally, hereinafter referred to as compound (A)) is used, compound (A) is subjected to decarboxylation and/or dehydration by heat generated by infrared laser exposure and, therefore, the polarity of an exposed area may become more hydrophobic compared with that before exposure. Accordingly, during developing treatment after exposure using an aqueous alkaline solution or the like, an exposed area is effectively prevented from infiltration of a developing solution so that an image area would not be readily damaged. Thus, when the composition is used as a recording layer of a lithographic printing plate precursor, it can provide a printing plate excellent in printing resistance.

While in a non-exposed area, compound (A) has a high solubility in an alkaline developing solution or the like and is excellent in developing ability because of inherently having a large amount of carboxylic acid capable of being subjected to decarboxylation or dehydration, or a hydroxyl group in its structure. Thus, when the composition is used as a recording layer of a lithographic printing plate precursor, it can provide a printing plate of which non-image area is hardly stained.

In a case where a monocarboxylic acid compound represented by formula (I-2) which is a preferable embodiment of the foregoing compound (A) (may be simply referred to as "monocarboxylic acid compound", hereinafter) is used, it may be thought that by adding this compound to a polymerizable compound, it interacts with the infrared ray absorber (D) at the time of exposure, thereby enhancing a decomposition rate of the radical initiator (B). Further, it may be considered that the generated polymerization initiation radical or polymerization growth radical causes radical chain transfer into the monocarboxylic acid compound, thereby accelerating polymerization reaction of the ethylenically unsaturated bond-containing compound (C) (may be properly referred to as "polymerizable compound", hereinafter). Accordingly, the polymerizable composition having such a monocarboxylic acid compound added thereto has high sensitivity, and it may be considered that a lithographic printing plate precursor using the polymerizable composition of the invention as a recording layer is enhanced with respect to film strength of an image area and is excellent with respect to printing resistance. It should be noted that such a (A-1) monocarboxylic acid compound is not necessarily limited to a compound which causes decarboxylation and/or dehydration by heat. Even a compound having no such physical properties is considered to develop the effects of the present invention owing to the foregoing properties such as the interaction and chain transfer property Hereinafter, compounds including (A-1) compounds which do not cause such a decarboxylation or the like are sometimes referred to as compound (A).

In general, when a compound capable of interacting with an infrared ray absorber or radical initiator to enhance the sensitivity as described above is added to such a polymerizable composition, there is caused an evil that storage stability of the composition itself lowers. However, compound (A) according to the present invention is a stable compound until it is decomposed by heat to cause a reaction such as decarboxylation. Particularly, in the case where the monocarboxylic acid compound is added, such an evil is not caused. Further, there gives rise to an effect that originally insufficient storage stability of a radical polymerization based photosensitive material is enhanced. It may be considered that the monocarboxylic acid compound according to the invention forms a complex with the radical initiator, thereby thermally stabilizing the radical initiator at the time of unprocessed stock storage.

DETAILED DESCRIPTION OF THE INVENTION

The polymerizable composition of the invention is characterized by containing (A) a compound which causes decarboxylation and/or dehydration by heat, (B) a radical initiator, (C) a compound having an ethylenically unsaturated bond(s), and (D) an infrared ray absorber. Further, the polymerizable composition of the invention can contain (E) a binder polymer for the purpose of enhancing film characteristics, etc.

Each of the compounds that can be used in the polymerizable composition of the invention will be described below in order.

[(A) Compound which Causes Decarboxylation and/or Dehydration by Heat]

A compound which causes decarboxylation and/or dehydration by heat to be used in the present invention is not particularly limited as long as it causes decarboxylation and/or dehydration by heat, preferably under temperature condition of 100° C. to 300° C. Namely, can be used a compound having at least one functional group which causes decarboxylation and/or dehydration by heat.

More preferably, mention may be made of a compound having a structure capable of forming a 4 to 6-membered lactone ring, a 4 to 6-membered lactam ring or a 4 to 6-membered cyclic acid anhydride by decarboxylation and/or dehydration at a temperature of 100° C. to 300° C.

As a specific example of such compound (A), mention may be made of a compound having at least one group represented by the following formula (I):

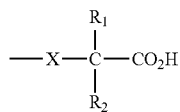

(I)

In the foregoing formula (I), X represents a divalent connection group selected from —O—, —S—, —SO$_2$—, —NH—, —N(R$^3$)—, and —CO—; R$^3$ represents a hydrogen atom or a monovalent substituent; and R$^1$ and R$^2$ each independently represents a hydrogen atom or a monovalent substituent. Incidentally, R$^1$ and R$^2$, either one of R$^1$ and R$^2$ and R$^3$ may be taken together to form a ring structure. These substituent will be described in detail in the description regarding compounds represented by formula (I-2) which is a more preferable embodiment, In the present invention, specific examples (1) to (72) of a compound having at least one group represented by the foregoing formula (I) which can be preferably used as compound (A) are enumerated. However, the present invention is not limited thereto.

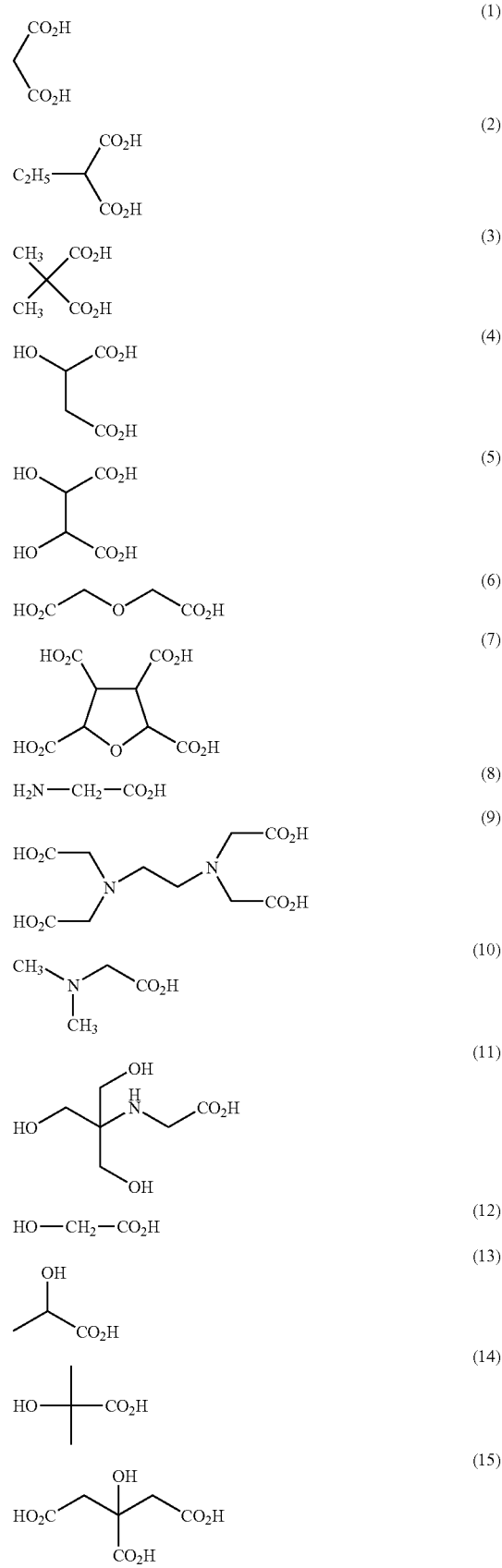

-continued
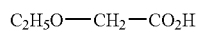 (16)
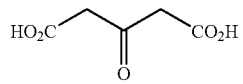 (17)
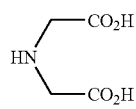 (18)
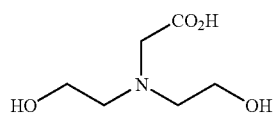 (19)
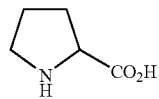 (20)
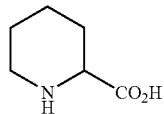 (21)
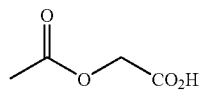 (22)
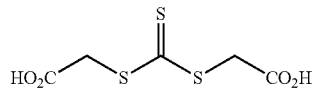 (23)
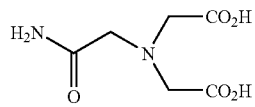 (24)
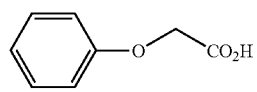 (25)
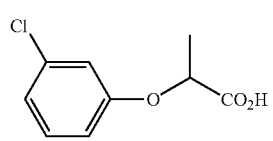 (26)
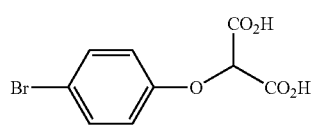 (27)
-continued
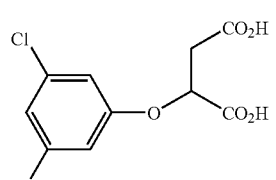 (28)
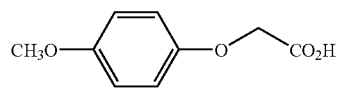 (29)
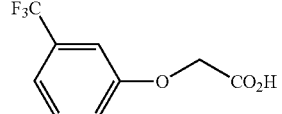 (30)
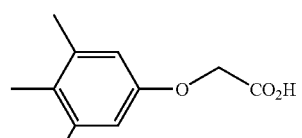 (31)
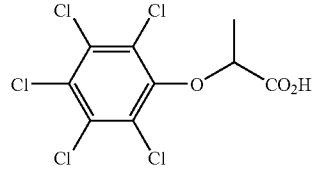 (32)
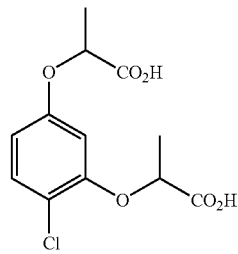 (33)
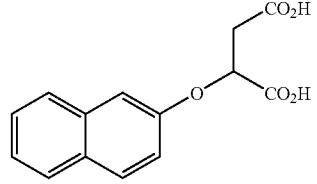 (34)
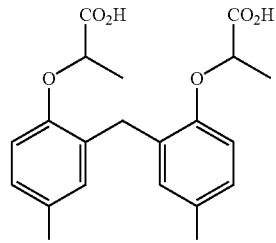 (35)
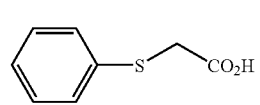 (36)

-continued
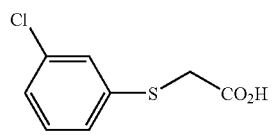 (37)
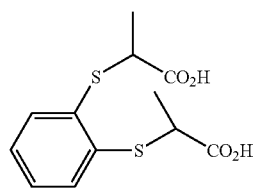 (38)
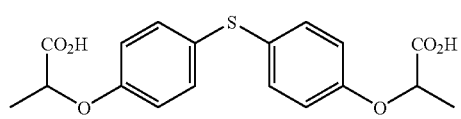 (39)
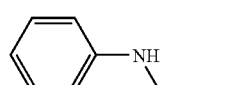 (40)
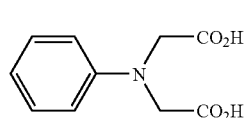 (41)
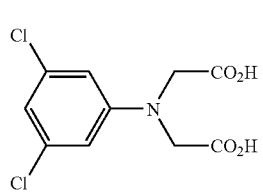 (42)
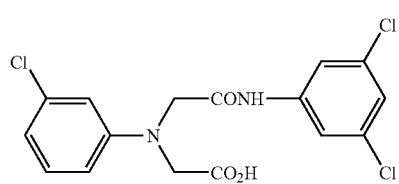 (43)
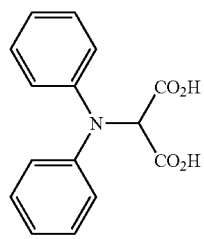 (44)
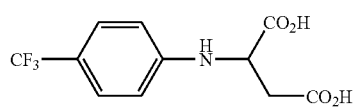 (45)
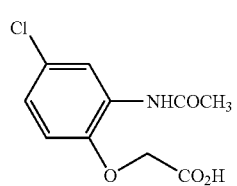 (46)
-continued
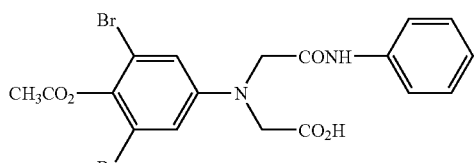 (47)
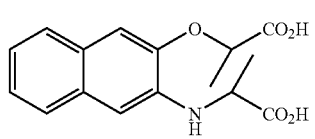 (48)
 (49)
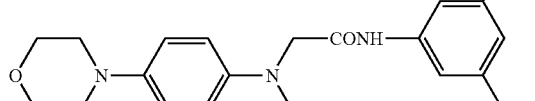 (50)
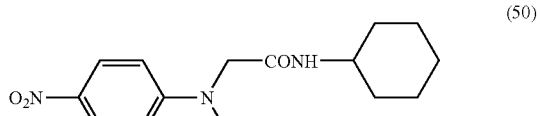 (51)
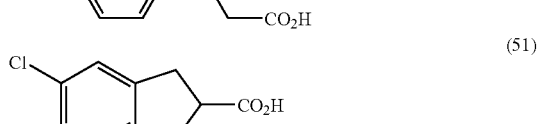 (52)
 (53)
 (54)
 (55)
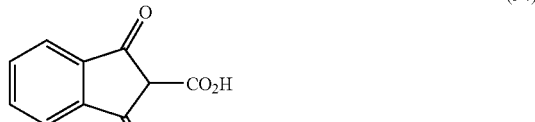 (56)

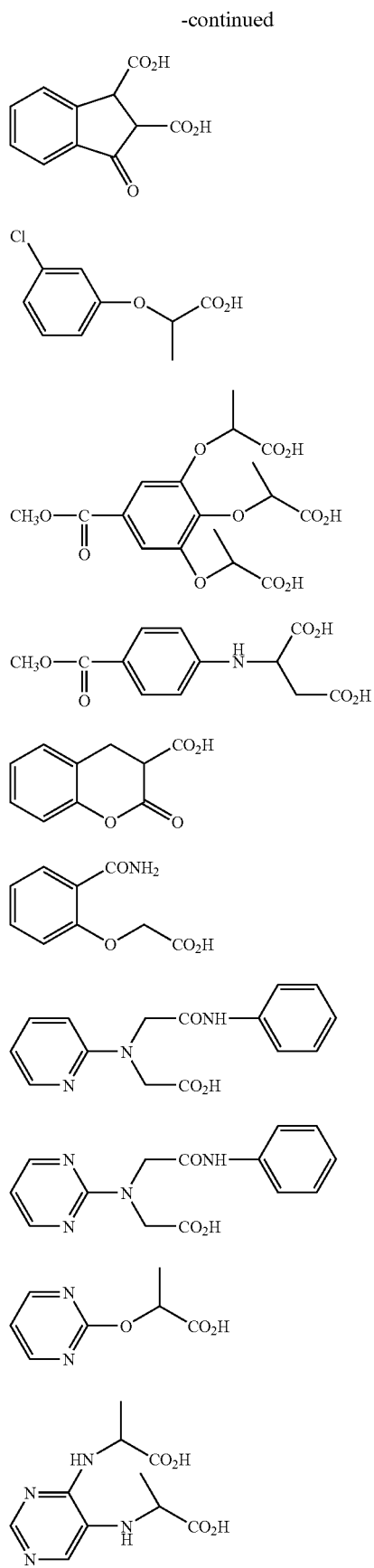

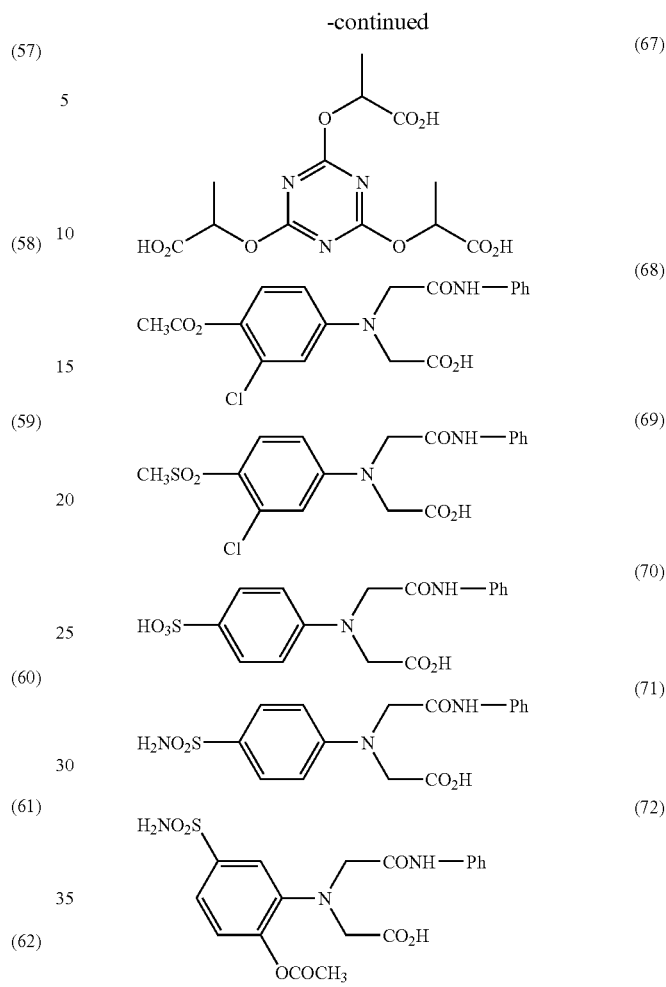

Next, representative synthesis examples of compound (A) according to the invention will be illustrated below, but it should not be construed that the invention is limited thereto.

<Synthesis of Compound (46)>

In a 200-mililiter eggplant type flask, 9.9 g of methyl 3-hydroxybenzoate and 8.4 g of methyl 2-chloropropionate were charged, to which was then added 65 ml of N,N-dimethylacetamide. Successively, 5.8 g of potassium carbonate and 2.8 g of potassium iodide were added thereto, followed by heating at 100° C. After reacting the resulting mixture for 10 hours, the reaction mixture obtained was charged into 300 ml of water and extracted with 300 ml of ethyl acetate. The organic solvent was distilled off in vacuo to obtain 14.5 g of residue. Then, 7.2 g of the residue obtained was charged into a 100-mililiter eggplant type flask, to which was then added 8 ml of water and 8 ml of methanol. The resulting mixture was cooled to 0° C. Successively, 2.4 g of sodium hydroxide was added thereto and was reacted at room temperature for 12 hours. The reaction mixture obtained was charged into 200 ml of water and adjusted to have pH of 2 with hydrochloric acid. A deposited product was filtered to obtain 5.0 g of compound (46). What the resulting compound was Compound (46) was confirmed by MM spectrum, IR spectrum, and mass analysis spectrum.

As the most preferable embodiment of (A) a compound which causes decarboxylation and/or dehydration by heat, a monocarboxylic acid compound represented by the following formula (I-2) can be mentioned. It should be noted that of the (A-1) monocarboxylic acid compounds, those which do not cause decarboxylation and/or dehydration can be similarly used instead of compound (A).

wherein:

A represents an aromatic group or a heterocyclic group, $R^1$ and $R^2$ each independently represents a hydrogen atom or a monovalent substituent, which is synonymous with that in $R^1$ and $R^2$ of the compound having at least one group represented by the foregoing formula (I). Provided that $R^1$ and $R^2$, either one of $R^1$ and $R^2$ and $X^1$, either one of $R^1$ and $R^2$ and A, or A and $X^1$ may be taken together to form a ring structure.

$X^1$ represents a divalent connection group selected from —O—, —S—, —SO$_2$—, —NH—, —N($R^3$)—, —CH$_2$—, —CH($R^4$)—, and —C($R^4$)($R^5$)—, and $R^3$, $R^4$, and $R^5$ each independently represents a hydrogen atom or a monovalent substituent.

Here, in the formula (I-2), examples of the aromatic group represented by A include a benzene ring, a fused ring formed of two or three benzene rings, and a fused ring formed of a benzene ring and a 5-membered unsaturated ring. Specific examples include a phenyl group, a naphthyl group, an anthryl group, a phenanthryl group, an indenyl group, an acenaphthenyl group, and a fluorenyl group. Of these, a phenyl group and a naphthyl group are more preferable.

Also, the aromatic group may have a substituent. Examples of the aromatic group having a substituent include ones having a group comprising a monovalent non-metallic atomic group other than a hydrogen atom as a substituent on the ring forming carbon atom or atoms of an aryl group as described later. Incidentally, examples of preferred substituents to be introduced herein include alkyl groups, substituted alkyl groups, and ones enumerated as a substituent in substituted alkyl groups as described later.

Examples of the heterocyclic group represented by A include a pyrrole ring group, a furan ring group, a thiophene ring group, a benzopyrrole ring group, a benzofuran ring group, a benzothiophene ring group, a pyrazole ring group, an isoxazole ring group, an isothiazole ring group, an indazole ring group, a benzoisoxazole ring group, a benzoisothiazole ring group, an imidazole ring group, an oxazole ring group, a thiazole ring group, a benzimidazole ring group, a benzoxazole ring group, a benzothiazole ring group, a pyridine ring group, a quinoline ring group, an isoquinoline group, a pyridazine ring group, a pyrimidine ring group, a pyrazine ring group, a phthalazine ring group, a quinazoline ring group, a quinoxaline ring group, a phenanthridine ring group, a carbazole ring group, a purine ring group, a pyran ring group, a piperidine ring group, a piperazine ring group, a morpholine ring group, an indole ring group, an indolizine ring group, a chromene ring group, a cinnoline ring group, an acridine ring group, a phenothiazine ring group, a tetrazole ring group, and a triazine ring group.

Also, the heterocyclic group may have a substituent. Examples of the substituent include ones having a group comprising a monovalent nonmetallic atomic group other than a hydrogen atom as a substituent on the ring forming carbon atom or atoms of an aryl group as described later. Preferred examples of the substituent include alkyl groups, substituted alkyl groups, and ones enumerated as a substituent in substituted alkyl groups as described later.

Next, in the formula (I) and (I-2), examples of the monovalent substituent represented by $R^1$ and $R^2$ include a halogen atom, an optionally substituted amino group, an alkoxycarbonyl group, a hydroxyl group, an ether group, a thiol group, a thioether group, a silyl group, a nitro group, a cyano group, an optionally substituted alkyl group, an optionally substituted alkenyl group, an optionally substituted alkynyl group, an optionally substituted aryl group, and an optionally substituted heterocyclic group.

As such an alkyl group, linear, branched or cyclic alkyl groups having from 1 to 20 carbon atoms can be enumerated. Specific examples include a methyl group, an ethyl group, a propyl group, a butyl group, a pentyl group, a hexyl group, a heptyl group, an octyl group, a nonyl group, a decyl group, an undecyl group, a dodecyl group, a tridecyl group, a hexadecyl group, an octadecyl group, an eicosyl group, an isopropyl group, an isobutyl group, a sec-butyl group, a t-butyl group, an isopentyl group, a neopentyl group, a 1-methylbutyl group, an isohexyl group, a 2-ethylhexyl group, a 2-methylhexyl group, a cyclohexyl group, a cyclopentyl group, and a 2-norbornyl group. Of these, linear alkyl groups having from 1 to 12 carbon atoms, branched alkyl groups having from 3 to 12 carbon atoms, and cyclic alkyl groups having from 5 to 10 carbon atoms are more preferable.

As the substituent that such an alkyl group can have, groups comprising a monovalent non-metallic atomic group other than a hydrogen atom are used. Preferred examples include a halogen atom (such as —F, —Br, —Cl, and —I), a hydroxyl group, an alkoxy group, an aryloxy group, a mercapto group, an alkylthio group, an arylthio group, an alkyldithio group, an aryldithio group, an amino group, an N-alkylamino group, an N,N-dialkylamino group, an N-arylamino group, an N,N-diarylamino group, an N-alkyl-N-arylamino group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, an acylthio group, an acylamino group, an N-alkylacylamino group, an N-arylacylamino group, an ureido group, an N'-alkylureido group, an N',N'-dialkylureido group, an N'-arylureido group, an N',N'-diarylureido group, an N'-alkyl-N'-arylureido group, an N-alkylureido group, an N-arylureido group, an N'-alkyl-N-alkylureido group, an N'-alkyl-N-arylureido group, an N',N'-dialkyl-N-alkylureido group, an N',N'-dialkyl-N-arylureido group, an N'-aryl-N-alkylureido group, an N'-aryl-N-arylureido group, an N',N'-diaryl-N-alkylureido group, an N',N'-diaryl-N-arylureido group, an N'-alkyl-N'-aryl-N-alkylureido group, an N'-alkyl-N'-aryl-N-arylureido group, an alkoxycarbonylamino group, an aryloxycarbonylamino group, an N-alkyl-N-alkoxy-carbonylamino group, an N-alkyl-N-aryloxycarbonylamino group, an N-aryl-N-alkoxycarbonylamino group, an N-aryl-N-aryl-oxycarbonylamino group, a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N,N-diarylcarbamoyl group, an N-alkyl-N-arylcarbamoyl group, an alkylsulfinyl group, an arylsulfinyl group, an alkyl-sulfonyl group, an arylsulfonyl group, a sulfogroup (—SO$_3$H) and its conjugated base group (hereinafter referred to as a "sulfonate group"), an alkoxysulfonyl group, an aryloxysulfonyl group, a sulfinamoyl group, an N-alkylsulfinamoyl group, an N,N-dialkylsulfinamoyl group, an N-arylsulfinamoyl group, an N,N-diarylaulfinamoyl group, an N-alkyl-N-arylsulfinamoyl group, a sulfamoyl group, an N-alkylsulfamoyl group, an N,N-dialkylsulfamoyl group, an N-arylsulfamoyl group, an N,N-diarylsulfamoyl group, an N-alkyl-N-arylsulfamoyl group, a phosphono group (—PO$_3$H$_2$) and its conjugated base group (hereinafter referred to as a "phosphonate group"), a dialkylphosphono group (—PO$_3$(alkyl)$_2$), a diarylphosphono group (—PO$_3$ (aryl)$_2$), an alkylarylphosphono group (—PO$_3$ (alkyl)-(aryl)), a monoalkylphosphono group (—PO$_3$(alkyl)) and its conjugated base group (hereinafter referred to as an "alkyl-phosphonate group"), a monoarylphosphono group (—PO$_3$H (aryl)) and its conjugated base group (hereinafter referred to as an "arylphosphonate group"), a phosphonooxy group (—OPO$_3$H$_2$) or its conjugated base group (hereinafter referred to as a "phosphonatooxy group"), a dialkylphosphonooxy group (—OPO$_3$H (alkyl)$^2$), a diarylphosphonooxy group (—OPO$_3$ (aryl)$_2$), an alkylarylphosphonooxy group (—OPO$_3$ (alkyl)(aryl)), a monoalkylphosphonooxy group (—PO$_3$H (alkyl)) and its conjugated base group (hereinafter referred to as an "alkylphosphonatooxy group"), a monoarylphosphonooxy group (—OPO$_3$H (aryl)) or its conjugated base group (hereinafter referred to as an "arylphosphonatooxy group"), a cyano group, a nitro group, an aryl group, an alkenyl group, an alkynyl group, a heterocyclic group, and a silyl group.

As specific examples of the alkyl group in such a substituent, the foregoing alkyl groups are enumerated. Specific examples of the aryl group in such a substituent include a phenyl group, a biphenyl group, a naphthyl group, a tolyl group, a xylyl group, a mesityl group, a cumenyl group, a chlorophenyl group, a bromophenyl group, a chloromethylphenyl group, a hydroxyphenyl group, a methoxyphenyl group, an ethoxyphenyl group, a phenoxyphenyl group, an acetoxyphenyl group, a benzoyloxyphenyl group, a methylthiophenyl group, a phenylthiophenyl group, a methylaminophenyl group, a dimethylaminophenyl group, an acetylaminophenyl group, a carboxyphenyl group, a methoxycarbonylphenyl group, an ethoxyphenylcarbonyl group, a phenoxycarbonylphenyl group, an N-phenylcarbamoylphenyl group, a cyanophenyl group, a sulfophenyl group, a sulfonatophenyl group, a phosphonophenyl group, and a phosphonatophenyl group.

Also, examples of the alkenyl group include a vinyl group, a 1-propenyl group, a 1-butenyl group, a cinnamyl group, and a 2-chloro-1-ethenyl group; and examples of the alkynyl group include an ethynyl group, a 1-propynyl group, a 1-butynyl group, and a trimethylsilylethynyl group.

As R$^{O1}$ of the acyl group (R$^{O1}$CO—), a hydrogen atom and the foregoing alkyl groups and aryl groups can be enumerated. Of these substituents, a halogen atom (such as —F, —Sr, —Cl, and —I), an alkoxy group, an aryloxy group, an alkylthio group, an arylthio group, an N-alkylamino group, an N,N-dialkylamino group, an acyloxy group, an N-alkylcarbamoyloxy group, an N-arylcarbamoyloxy group, an acylamino group, a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N-alkyl-N-arylcarbamoyl group, a sulfo group, a sulfonate group, a sulfamoyl group, an N-alkylsulfamoyl group, an N,N-dialkylsulfamoyl group, an N-arylsulfamoyl group, an N-alkyl-N-arylsulfamoyl group, a phosphono group, a phosphonate group, a dialkylphosphono group, a diarylphosphono group, a monoalkylphosphono group, an alkylphosphonate group, a monoarylphosphono group, an arylphosphonate group, a phosphonooxy group, a phosphonatooxy group, an aryl group, and an alkenyl group are more preferable.

As the heterocyclic group, a pyridyl group and a piperidinyl group are enumerated; and as the silyl group, a trimethylsilyl group is enumerated.

On the other hand, as the alkylene group in the substituted alkyl group, divalent organic residues after eliminating any one of hydrogen atoms on the foregoing alkyl group having from 1 to 20 carbon atoms can be enumerated. Of these, linear alkylene groups having from 1 to 12 carbon atoms, branched alkylene groups having from 3 to 12 carbon atoms, and cyclic alkylene groups having from 5 to 10 carbon atoms are preferable. Preferred examples of the substituted alkyl group obtained by combining such a substituent with the alkylene group include a chloromethyl group, a bromomethyl group, a 2-chloroethyl group, a trifluoromethyl group, a methoxymethyl group, an isopropoxymethyl group, a butoxymethyl group, a sec-butoxybutyl group, a methoxyethoxyethyl group, an allyloxymethyl group, a phenoxymethyl group, a methylthiomethyl group, a tolylthiomethyl group, a pyridylmethyl group, a tetramethylpiperidinylmethyl group, an N-acetyltetra-methylpiperidinylmethyl, group, a trimethylsilylmethyl group, a methoxyethyl group, an ethylaminoethyl group, a diethyl-aminopropyl group, a morpholinopropyl group, an acetyloxymethyl group, a benzoyloxymethyl group, an N-cyclohexyl-carbamoyloxyethyl group, an N-phenylcarbamoyloxyethyl group, an acetylaminoethyl group, an N-methylbenzoylaminopropyl group, a 2-oxoethyl group, a 2-oxopropyl group, a carboxypropyl group, a methoxycarbonylethyl group, an allyloxycarbonylbutyl group, a chlorophenoxycarbonylmethyl group, a carbamoylmethyl group, an N-methylcarbamoylethyl group, an N,N-dipropylcarbamoylmethyl group, an N-(methoxyphenyl)carbamoylethyl group, an N-methyl-N-(sulfophenyl)carbamoyethyl group, a sulfobutyl group, a sulfonatobutyl group, a sulfamoylbutyl group, an N-ethylsulfamoylmethyl group, an N,N-dipropylsulfamoylpropyl group, an N-tolyl-sulfamoylpropyl group, an N-methyl-N-(phosphonophenyl)sulfamoyloctyl group, a phosphonobutyl group, a phosphonatohezyl group, a diethylphosphonobutyl group, a diphenylphosphonopropyl group, a methylphosphonobutyl group, a methylphosphonatobutyl group, a tolylphosphonohexyl group, a tolylphosphonatohexyl group, a phosphonootypropyl group, a phosphonatooxybutyl group, a benzyl group, a phenethyl group, an α-methylbenzyl group, a 1-methyl-1-phenylethyl group, a p-methylbenzyl group, a cinnamyl group, an allyl group, a 1-propenylmethyl group, a 2-butenyl group, a 2-methylallyl group, a 2-methylpropenylmethyl group, a 2-propynyl group, a 2-butynyl group, and a 3-butynyl group.

As the aryl group, a benzene ring, a fused ring formed of two or three benzene rings, and a fused ring formed of a benzene ring and a 5-membered unsaturated ring can be enumerated. Specific examples include a phenyl group, a naphthyl group, an anthryl group, a phenanthryl group, an indenyl group, an acenaphthenyl group, and a fluorenyl group. Of these, a phenyl group and a naphthyl group are preferable.

As the substituted aryl group, ones having a group comprising a monovalent non-metallic atomic group other than a hydrogen atom as a substituent on the ring forming carbon atom or atoms of the foregoing aryl group are used. Preferred examples of the substituent include the foregoing alkyl groups and substituted alkyl groups, and ones enumerated as a substituent in the foregoing substituted alkyl groups.

Preferred examples of the substituted aryl groups include a biphenyl group, a tolyl group, a xylyl group, a mesityl group, a cumenyl group, a chlorophenyl group, a bromophenyl group, a fluorophenyl group, a chloromethylphenyl group, a trifluoromethylphenyl group, a hydroxyphenyl group, a methoxyphenyl group, a methoxyethoxyphenyl group, an allyloxyphenyl group, a phenoxyphenyl group, a methylthiophenyl group, a tolylthiophenyl group, an ethylaminophenyl group, a diethylaminophenyl group, a morpholinophenyl group, an aetyloxyphenyl group, a benzoyloxyphenyl group, an N-cyclohexylcarbamoyloxyphenyl group, an N-phenylcarbamoyloxyphenyl group, an acetylaminophenyl group, an N-methylbenzoylaminophenyl group, a carboxyphenyl group, a methoxycarbonylphenyl group, an allyloxycarbonylphenyl group, a chlorophenoxycarbonylphenyl group, a carbamaylphenyl group, an N-methylcarbamoylphenyl group, an N,N-dipropylcarbamoylphenyl group, an N-(methoxyphenyl)carbamoylphenyl group, an N-methyl-N-(sulfophenyl)carbamoylphenyl group, a sulfophenyl group, a sulfonatophenyl group, a sulfamoylphenyl group, an N-ethylsulfamoylphenyl group, an N,N-dipropylsulfamoylphenyl group, an N-tolylsulfamoylphenyl group, an N-methyl-N-(phosphonophenyl)sulfamoylphenyl group, a phosphonophenyl group, a phosphonatophenyl group, a diethylphosphonophenyl group, a diphenylphosphonophenyl group, a methylphosphonophenyl group, a methylphosphonatophenyl group, a tolylphosphonophenyl group, a tolylphosphonatophenyl group, an allylphenyl group, a 1-propenylmethylphenyl group, a 2-butenylphenyl group, a 2methylallylphenyl group, a 2-methylpropenylphenyl group, a 2-propenylphenyl group, a 2-butynylphenyl group, and a 3-butynylphenyl group.

As the alkenyl group, substituted alkenyl group, alkynyl group and substituted alkynyl group (—C($R^{02}$)=C($R^{03}$)($R^{04}$) and —C≡C ($R^{05}$)), groups wherein $R^{02}$, $R^{03}$, $R^{04}$, and $R^{05}$ each represents a group comprising a monovalent nonmetallic atomic group can be used. Preferred examples of $R^{02}$, $R^{03}$, $R^{04}$, and $R^{05}$ include a hydrogen atom, a halogen atom, an alkyl group, a substituted alkyl group, and aryl group, and a substituted aryl group. Specific examples include those enumerated previously. More preferred examples of $R^{02}$, $R^{03}$, $R^{04}$, and $R^{05}$ include a hydrogen atom, a halogen atom, and a linear, branched or cyclic alkyl group having from 1 to 10 carbon atoms.

Specific examples of the alkenyl group, substituted alkenyl group, alkynyl group and substituted alkynyl group include a vinyl group, a 1-propenyl group, a 1-butenyl group, a 1-pentenyl group, a 1-hexenyl group, a 1-octenyl group, a 1-methyl-1-propenyl group, a 2-methyl-1-propenyl group, a 2-methyl-1-butenyl group, a 2-phenyl-1-ethenyl group, a 2-chloro-1-ethenyl group, an ethynyl group, a 1-propynyl group, a 1-butynyl group, and a phenylethynyl group. As the heterocyclic group, a pyridyl group enumerated as the substituent of the substituted alkyl group is enumerated.

As the foregoing substituted oxy group ($R^{06}$O—), ones wherein $R^{06}$ represents a group comprising a monovalent nonmetallic atomic group other than a hydrogen atom can be used. Preferred examples of the substituted oxy group include an alkoxy group, an aryloxy group, an acyloxy group, a caxbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, a phosphonooxy group, and a phosphonatooxy group. As the alkyl group and aryl group in these groups, those enumerated as the foregoing alkyl group, substituted alkyl group, aryl group and substituted aryl group can be enumerated. Also, as the acyl group ($R^{07}$CO—) in the acyloxy group, ones in which $R^{07}$ represents the foregoing alkyl group, substituted alkyl group, aryl group or substituted aryl group can be enumerated. Of these substituents, an alkoxy group, an aryloxy group, an acyloxy group, and an arylsulfoxy group are more preferable. Preferred specific examples of the substituted oxy group include a methoxy group, an ethoxy group, a propyloxy group, an isopropyloxy group, a butyloxy group, a pentyloxy group, a hexyloxy group, a dodecyloxy group, a benzyloxy group, an allyloxy group, a phenethyloxy group, a carboxyethyloxy group, a methoxycarbonylethyloxy group, an ethoxycarbonylethyloxy group, a methoxyethoxy group, a phenoxyethoxy group, a methoxyethoxyethoxy group, an ethoxyethoxyethoxy group, a morpholinoethoxy group, a morpholinopropyloxy group, an allyloxyethoxyethoxy group, a phenoxy group, a tolyloxy group, a xylyloxy group, a mesityloxy group, a mesityloxy group, a cumenyloxy group, a methoxyphenyloxy group, an ethoxyphenyloxy group, a chlorophenyloxy group, a bromophenyloxy group, an acetyloxy group, a benzoyloxy group, a naphthyloxy group, a phenylsulfonyloxy group, a phosphonooxy group, and a phosphonatooxy group.

As the amide group-containing substituted amino group ($R^{08}$NH— or ($R^{09}$)($R^{010}$)N—), ones wherein $R^{08}$, $R^{09}$ and $R^{010}$ each represents a group comprising a monovalent nonmetallic atomic group other than a hydrogen atom can be used. Incidentally, $R^{09}$ and $R^{010}$ may be taken together to form a ring, Preferred examples of the substituted amino group include an N-alkylamino group, an N,N-dialkylamino group, an N-arylamino group; an N;N-diarylamino group, an N-alkyl-N-arylamino group, an acylamino group, an N-alkylacylamino group, an N-arylacylamino group, an ureido group, an N'-alkylureido group, an N',N'-dialkylureido group, an N'-arylureido group, an N',N'-diarylureido group, an N'-alkyl-N'-arylureido group, an N-alkylureido group, an N-arylureido group, an N'-alkyl-N-alkylureido group, an N'-alkyl-N:arylureido group, an N',N'-dialkyl-N-alkylureido group, an N'-alkyl-N'-aryl-ureido group, an N',N'-dialkyl-N-alkylureido group, an N',N'-dialkyl-N' arylureido group, an N'-aryl-N-alkylureido group, an N'-aryl-N-arylureido group, an N',N'-diaryl-N-alkylureido group, an N',N'-diaryl-N-arylureido group, an N'-alkyl-N'-aryl-N-alkylureido group, an N'-alkyl-N'-aryl-N-arylureido group, an alkoxycarbonylamino group, an aryloxycarbonylamino group, an N-alkyl-N-alkoxyoarbonylamino group, an N-alkyl-N-aryloxycarbonylamino group, an N-aryl-N-alkoxycarbonylamino group, and an N-aryl-N-aryl-oxycarbonylamino group. As the alkyl group and aryl group in these groups, those enumerated as the foregoing alkyl group, substituted alkyl group, aryl group and substituted aryl group can be enumerated. Also, $R^{07}$ of the acyl group ($R^{07}$CO—) in the acylamino group, N-alkylacylamino group and N-arylacylamino group is as described previously. Of these, an N-alkylamino group, an N,N-dialkylamino group, an N-arylamino group, and an acylamino group are more preferable. Specific examples of the preferred substituted amino group include a methylamino group, an ethylamino group, a diethylamino group, a morpholino group, a piperidino group, a pyrrolidino group, a phenylamino group, a benzoylamino group, and an acetylamino group.

As the substituted sulfonyl group ($R^{011}$—SO$_2$—), ones wherein $R^{011}$ represents a group comprising a monovalent non-metallic atomic group can be used. More preferred examples include an alkylsulfonyl group and an arylsulfonyl group. As the alkyl group and aryl group in these groups, those enumerated as the foregoing alkyl group, substituted alkyl group, aryl group and substituted aryl group can be enumerated. Specific examples of such substituted sulfonyl groups include a butylsulfonyl group, a phenylsulfonyl group, and a chlorophenylsulfonyl group.

The sulfonate group (—SO$_3$—) means a conjugated base anion group of a sulfo group (—SO$_3$H) as described previously, and usually, it is preferable that the anion group is used together with a counter cation. As such a counter cation, generally known cations, that is, various oniums (such as ammoniums, sulfoniums, phosphoniums, iodoniums, and aziniums) and metal ions (such as Na$^+$, K$^+$, Ca$^{2+}$, and Zn$^{2+}$) are enumerated.

As the substituted carbonyl group (R$^{O13}$—CO—), ones wherein R$^{O13}$ represents a group comprising a monovalent non-metallic atomic group can be used. Preferred examples of the substituted carbonyl group include a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N,N-diarylcarbamoyl group, and an N-alkyl-N'-arylcarbamoyl group. As the alkyl group and aryl group in these groups, those enumerated as the foregoing alkyl group, substituted alkyl group, aryl group and substituted aryl group can be enumerated. Of these substituted carbonyl groups, a formyl group, an acyl group, a carboxyl group, an alkoxycarbonyl group, an aryloxycarbonyl group, a carbamoyl group, an N-alkylcarbamoyl group, an N,N-dialkylcarbamoyl group, and an N-arylcarbamoyl group are more preferable; and a formyl group, an acyl group, an alkoxycarbonyl group, and an aryloxycarbonyl group are further preferable. Preferred specific examples of the substituted carbonyl group include a formyl group, an acetyl group, a benzoyl group, a carboxyl group, a methoxycarbonyl group, an ethoxycarbonyl group, an allyloxycarbonyl group, a dimethylaminophenylethenylcarbonyl group, a methoxycarbonylmethoxycarbonyl group, an N-methylcarbamoyl group, an N-phenylcarbamoyl group, an N,N-diethylcarbamoyl group, and a morpholinocarbonyl group.

As the substituted sulfinyl group (R$^{O14}$—SO—), ones wherein R$^{O14}$ represents a group comprising a monovalent non-metallic atomic group can be used. Preferred examples include an alkylsulfinyl group, an arylsulfinyl group, a sulfinamoyl group, an N-alkylsulfinamoyl group, an N,N-dialkylsulfinamoyl group, an N-arylsulfinamoyl group, an N,N-diarylsulfinamoyl group, and an N-alkyl-N-arylsulfinamoyl group; As the alkyl group and aryl group in these groups, those enumerated as the foregoing alkyl group, substituted alkyl group, aryl group and substituted aryl group can be enumerated. Of these, an alkylsulfinyl group and an arylsulfinyl group are preferable. Specific examples of the substituted sulfinyl group include a hexylsulfinyl group, a benzylsulfinyl group, and a tolylsulfinyl group.

The substituted phosphono group as referred to herein means one in which one or two hydroxyl groups on a phosphono group are substituted with other organic oxo group. Preferred examples include the foregoing dialkylphosphono group, diarylphosphono group, alkylarylphosphono group, monoalkylphosphono group and monoarylphosphono group. Of these, a dialkylphosphono group and a diarylphosphono group are more preferable. Specific examples include a diethylphosphono group, a dibutylphosphono group, and a diphenylphosphono group.

The phosphonate group (—PO$_3$H$_2$— or PO$_3$H—) as referred to herein means a conjugated base anion group of a phosphono group derived from acid first dissociation or acid second dissociation of a phosphono group (—PO$_3$H$_2$), Usually, it is preferable that the anion group is used together with a counter cation. As such a counter cation, generally known cations, that is, various oniums (such as ammoniums, sulfoniums, phosphoniums, iodoniums, and aziniums) and metal ions (such as Na$^+$, K$^+$, Ca$^{2+}$, and Zn$^{2+}$) are enumerated.

The substituted phosphonate group as referred to herein means a conjugated base anion group in which one hydroxyl group on the foregoing phosphono group is substituted with an organic oxo group. Specific examples include conjugated bases of the foregoing monoalkylphosphono group (—PO$_3$H (alkyl)) and monoarylphosphono group (—PO$_3$H (aryl)).

Next, X in the foregoing formula (I) and X$^1$ in the foregoing formula (I-2) will be described below. X represents a divalent connection group selected from —O—, —S—, —SO$_2$—, —NH—, —N(R$^3$)—, and —CO—. Of these, —O—, —S—, —NH—, —N(R$^3$)— are preferable, and —O—, and —N(R$^3$)— are particularly preferable from the standpoint of sensitivity. X$^1$ represents a divalent connection group selected from —O—, —S—, —SO$_2$—, —NH—, —N(R$^3$)—, —CH$_2$—, —CH(R$^4$)—, and —C(R$^4$)(R$^5$)—. Of these, —NH—, —N(R$^3$)—, —CH$_2$—, —CH(R$^4$)—, and —C(R$^4$)(R$^5$)— are preferable from the standpoint of sensitivity; and —NH— and —N(R$^3$)— are more preferable. —N(R$^3$)— is the most preferable from the viewpoints of sensitivity and storage stability.

Here, R$^3$ in the foregoing X, and R$^3$, R$^4$, and R$^5$ in the foregoing X$^1$ each independently represents a hydrogen atom or a monovalent substituent. The monovalent substituent is synonymous with that in R$^1$ and R$^2$ in the foregoing formula (I).

Especially, R$^3$ preferably represents an alkyl group, an alkenyl group, an alkynyl group, an aryl group, or a heterocyclic group, each of which may have a substituent. Also, it is preferable that R$^3$ contains at least one of —CO$_2$— and —CON(R$^8$)— in its structure. The most preferred structure of R$^3$ is one having an ester structure represented by the following formula (i) or a structure having an amide structure represented by the following formula (ii). Particularly, those having an amide structure represented by the following formula (ii) are preferable.

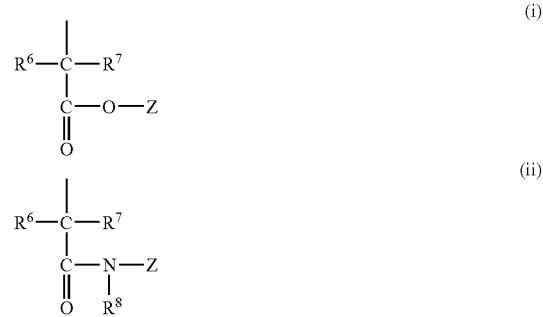

In the foregoing formulae, R$^6$, R$^7$, and R$^8$ each independently represents a hydrogen atom or a monovalent substituent; and Z represents a monovalent substituent. The monovalent substituent is synonymous with that in R$^1$ and R$^2$ in the foregoing formulae (X) and (I-2).

Also, in the foregoing X$^1$, the monovalent substituent represented by R$^4$ and R$^5$ is synonymous with that in R$^1$ and R$^2$ in the foregoing formulae (I) and (I-2).

Specific examples (A-1) to (A-87) of the monocarboxylic acid compound represented by formula (I-2) will be given below, but it should not be construed that the invention is limited thereto.

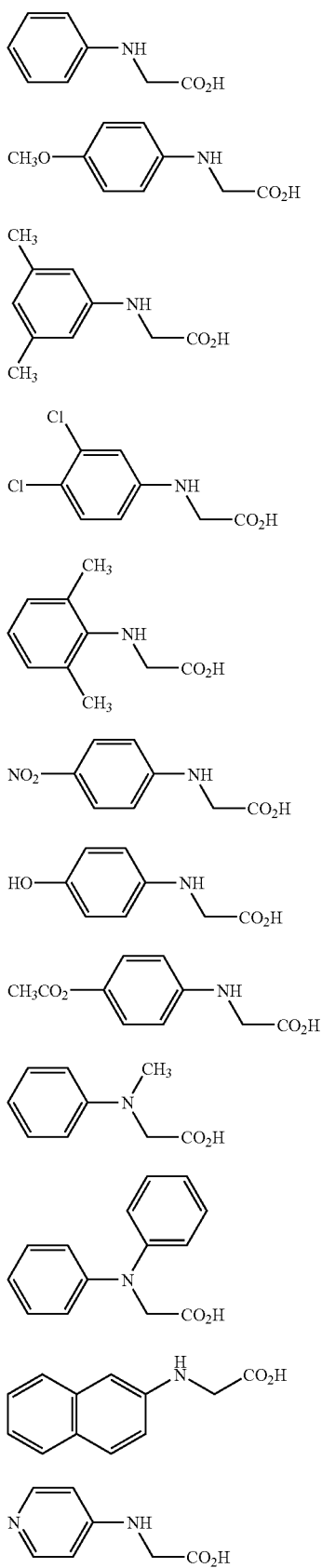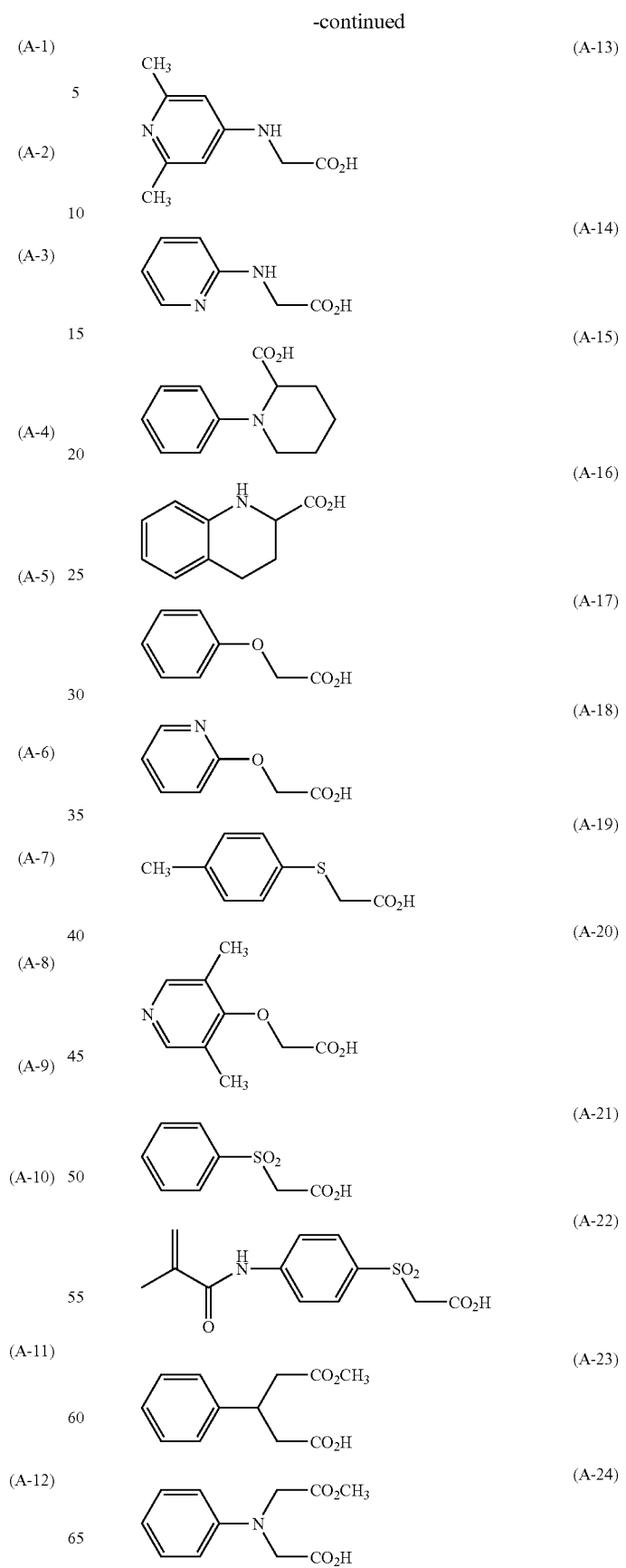

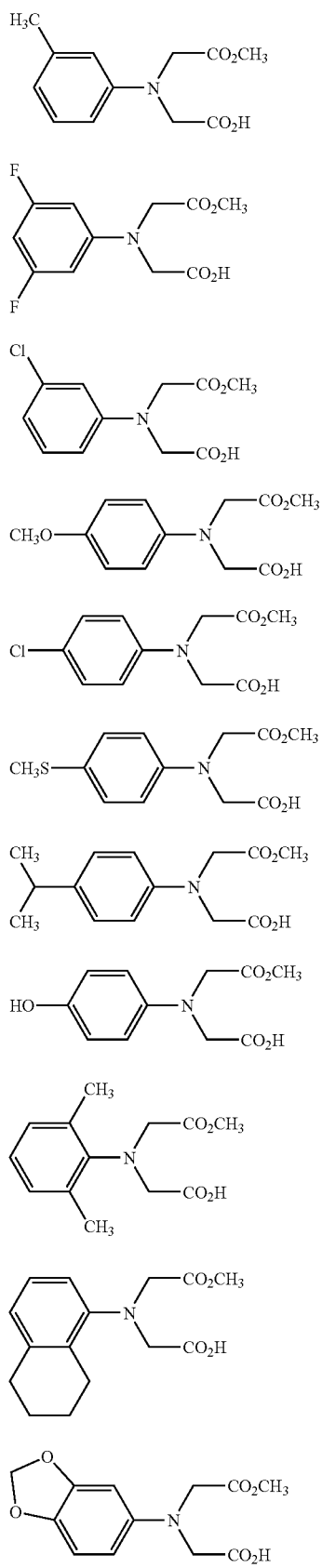
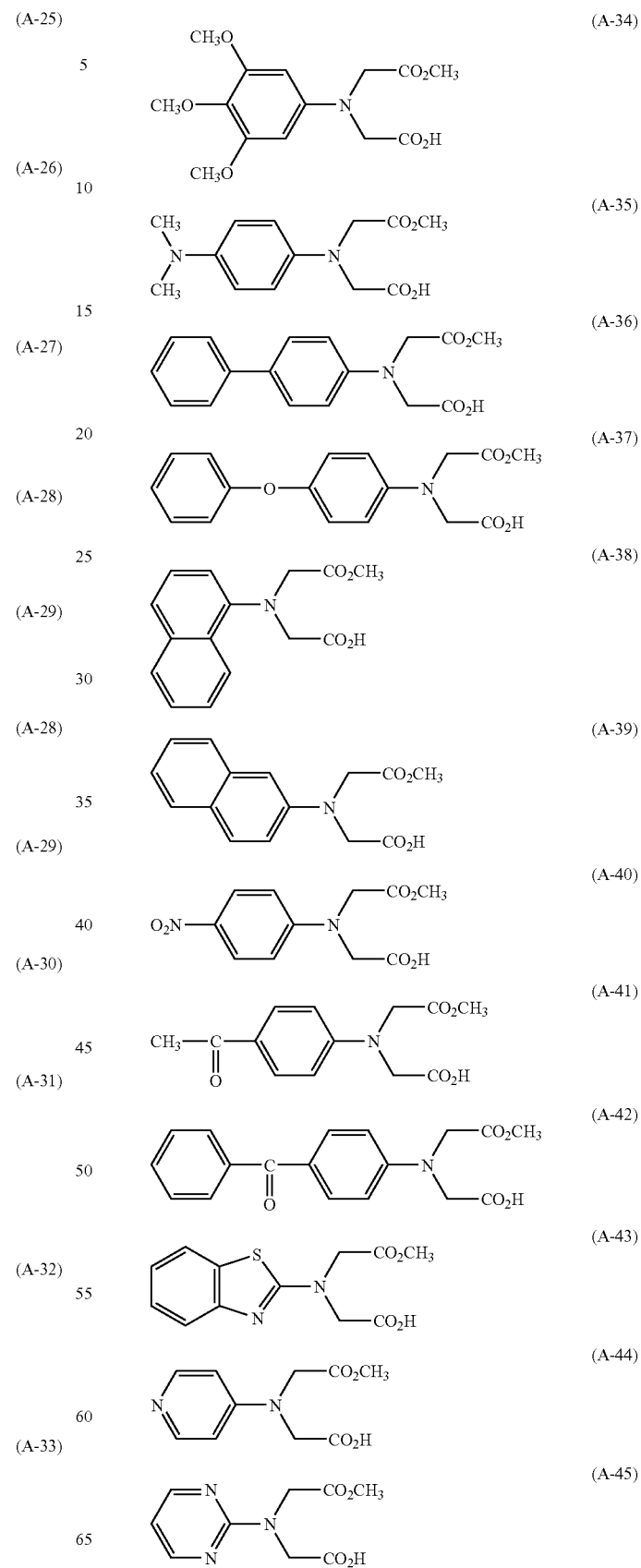

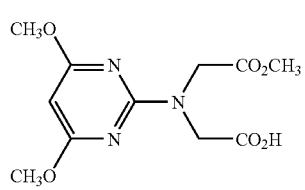
(A-46)
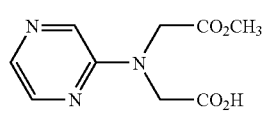
(A-47)
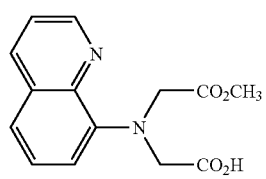
(A-48)
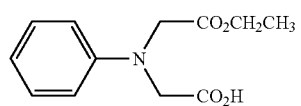
(A-49)
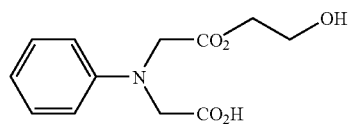
(A-50)
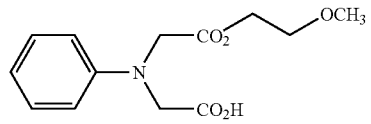
(A-51)
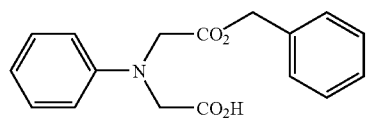
(A-52)
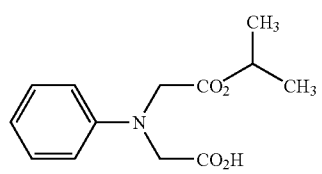
(A-53)
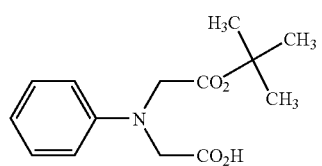
(A-54)
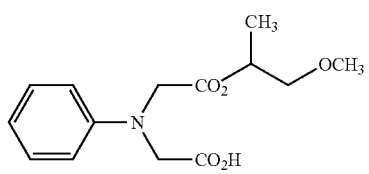
(A-55)
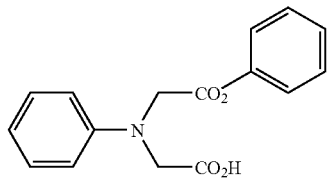
(A-56)
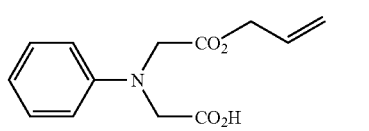
(A-57)
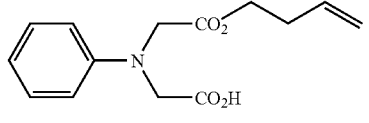
(A-58)
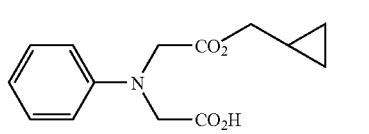
(A-59)
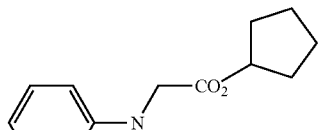
(A-60)
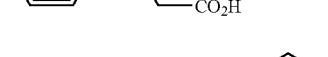
(A-61)
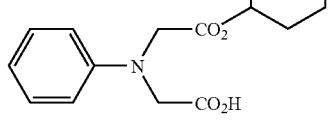
(A-62)
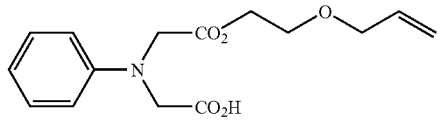
(A-63)
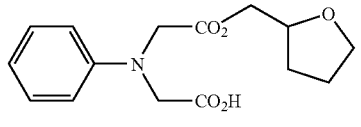
(A-64)

-continued
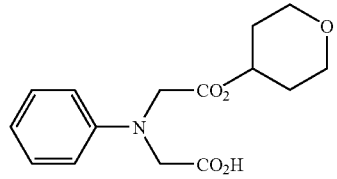 (A-65)
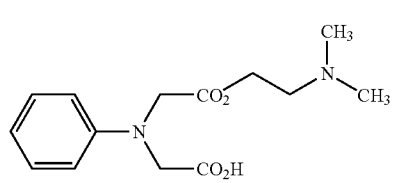 (A-66)
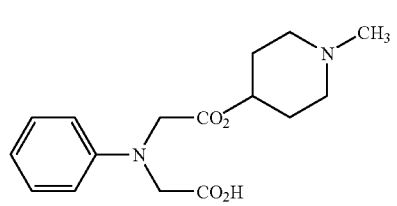 (A-67)
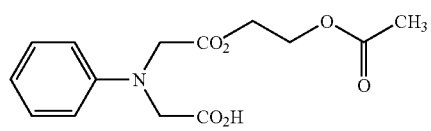 (A-68)
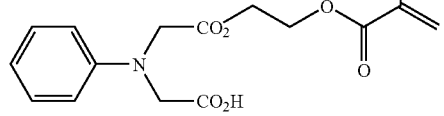 (A-69)
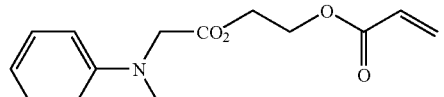 (A-70)
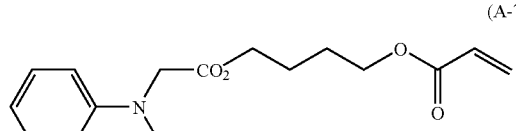 (A-71)
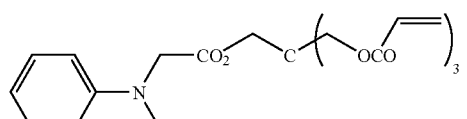 (A-72)
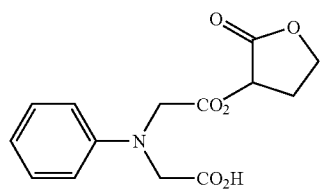 (A-73)
-continued
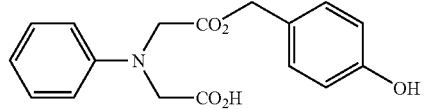 (A-74)
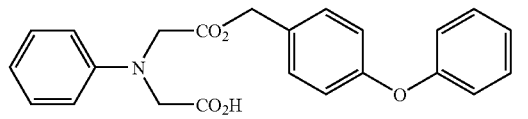 (A-75)
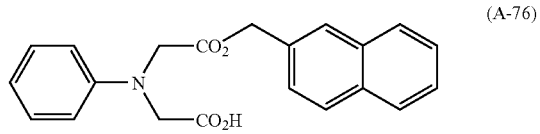 (A-76)
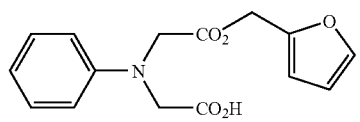 (A-77)
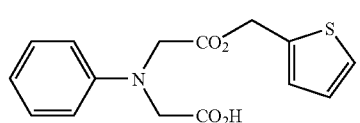 (A-78)
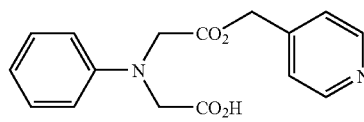 (A-79)
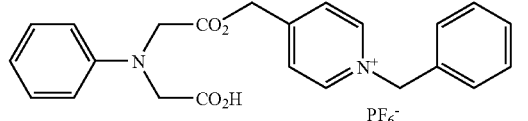 (A-80)
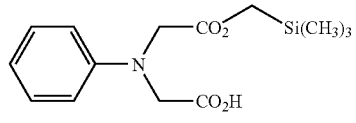 (A-81)
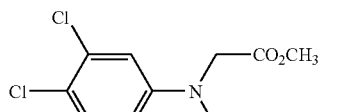 (A-82)
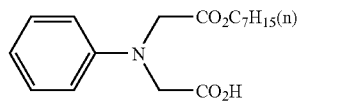 (A-83)
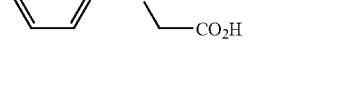 (A-84)

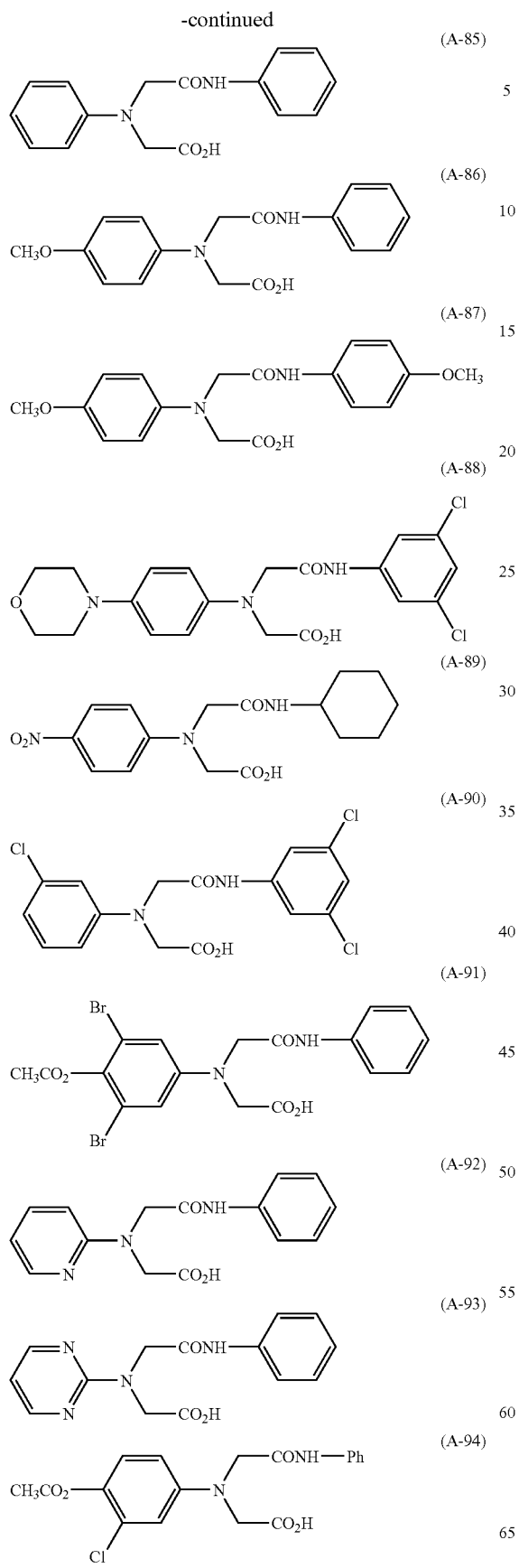
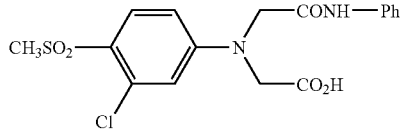
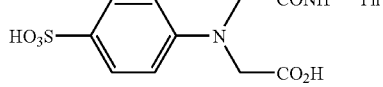
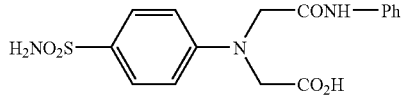
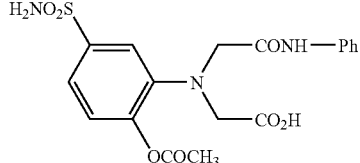
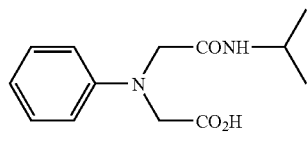
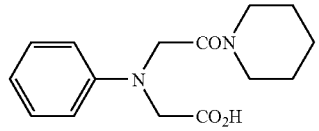
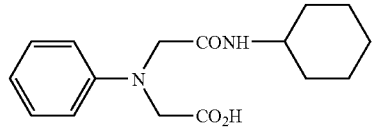

Further, as other preferable examples of compound (A), can be enumerated a compound represented by the following formula (I-3) having such a structure that the ring structure represented by A in the compound represented by the foregoing formula (I-2) is connected with plural groups represented by formula (I).

wherein

A, $R^1$ and $R^2$ are synonymous with those of formula (I). However, at least one of $R^1$ and $R^2$ is a carboxyl group, an alkyl group having 1 to 10 carbon atoms or an alkyl group having a terminal carboxyl group and having 1 to 10 carbon atoms. n represents an integer of 2 to 6.

Next, representative synthesis examples of the monocarboxylic acid compound represented by formula (I-2) according to the invention will be illustrated below, but it should not be construed that the invention is limited thereto.

<Synthesis of Compound (A-24)>

In a 2-liter eggplant type flask, 62.8 g of N-phenyl-iminodiacetic acid was charged and dissolved in 500 mL of toluene under a nitrogen gas stream, to which was then added 32.0 g of acetic anhydride. The mixture was refluxed under heating and stirred. One hour thereafter, the reaction mixture was cooled to room temperature, to which was then 3 L of hexane with stirring to undergo deposition. A reaction product was filtered to obtain 52.0 g of N-phenyliminodiacetic anhydride.

Next, 5.1 g of the resulting of N-phenyliminodiacetic anhydride was charged in a 200-mL eggplant type flask under a nitrogen gas stream, to which was then added 60 mL of methanol. After stirring at room temperature for 6 hours, the solvent was distilled off in vacuo. The residue was purified by silica gel chromatography (elution solvent: hexane/ethyl acetate) to obtain 5.7 g of Compound (A-24). What the resulting compound was Compound (A-24) was confirmed by MMR spectrum, IR spectrum, and mass analysis spectrum.

<Synthesis of Compound (A-52)>

In a 2-liter eggplant type flask, 62.8 g of N-phenyl-iminodiacetic acid was charged and dissolved in 500 mL of toluene under a nitrogen gas stream, to which was then added 32.0 g of acetic anhydride. The mixture was refluxed under heating and stirred. One hour thereafter, the reaction mixture was cooled to room temperature, to which was then 3 L of hexane with stirring to undergo deposition. A reaction product was filtered to obtain 52.0 g of N-phenyliminodiacetic anhydride.

Next, 5.1 g of the resulting of N-phenyliminodiacetic anhydride was charged in a 200-mL eggplant type flask under a nitrogen gas stream, to which was then added 50 mL of benzyl alcohol. After stirring at room temperature for 8 hours, the solvent was distilled off in vacuo. The residue was purified by silica gel chromatography (elution solvent: hexane/ethyl acetate) to obtain 7.2 g of Compound (A-52). What the resulting compound was Compound (A-52) was confirmed by MMR spectrum, IR spectrum, and mass analysis spectrum.

<Synthesis of Compound (A-55)>

In a 2-liter eggplant type flask, 62.8 g of N-phenyl-iminodiacetic acid was charged and dissolved in 500 mL of toluene under a nitrogen gas stream, to which was then added 32.0 g of acetic anhydride. The mixture was refluxed under heating and stirred. One hour thereafter, the reaction mixture was cooled to room temperature, to which was then 3 L of hexane with stirring to undergo deposition. A reaction product was filtered to obtain 52.0 g of N-phenyliminodiacetic anhydride.

Next, 5.1 g of the resulting of N-phenyliminodiacetic anhydride was charged in a 200-mL eggplant type flask under a nitrogen gas stream, to which was then added 50 mL of 1-methoxy-2-propanol. After stirring at room temperature for 4 hours, the solvent was distilled off in vacuo. The residue was purified by silica gel chromatography (elution solvent: hexane/ethyl acetate) to obtain 6.0 g of Compound (A-55). What the resulting compound was Compound (A-55) was confirmed by MMR spectrum, IR spectrum, and mass analysis spectrum, Compound, (A) or (A-1) according to the invention as described previously may be used singly or in admixture of two or more thereof. Compound (A) or the like can be added in an amount of from 0.1 to 70% by weight, preferably from 0.5 to 50% by weight, and more preferably from 1 to 30% by weight based on the whole of solids of the polymerizable composition from the stand point of attaining sufficiently improved sensitivity and ensuring excellent elimination of a non-exposed area. In a case where the polymerizable composition to which compound (A) or the like is added in the foregoing addition range is used as a recording material of a lithographic printing plate precursor, such advantages can be obtained that recording can be effected with a high sensitivity, stains are prevented from generation in a non-image area at the time of printing and film physical properties of the recording layer before and after curing are remarkably improved.

[(B) Radical Initiator]

The polymerizable composition of the invention is characterized by containing a radical initiator. The radical initiator as referred to herein means a compound that generates a radical by energy of light and/or heat and initiates and accelerates polymerization reaction of (C) a compound containing at least one ethylenically unsaturated bond (polymerizable compound) as described later.

In the invention, preferred examples of the radical initiator include (a) an aromatic ketone, (b) an onium salt compound, (c) an organic peroxide, (d) a thio compound, (e) a hezaaryl biimidazole compound, (f) a keto oxime ester compound, (g) a borate compound, (h) an azinium compound, (i) a metallocene compound, (j) an active ester compound, (k) a carbon-halogen bond-containing compound, and (l) Azo based compound. While specific examples of the foregoing (a) to (l) will be given below, it should not be construed that the invention is limited thereto.

(a) Aromatic Ketone:

As the aromatic ketone (a) that is preferable as the radical initiator to be used in the invention, compounds having a benzophenone skeleton or thioxanthone skeleton as described RADIATION CURING IN POLYMER SCIENCE AND TECHNOLOGY, J. P. Fousassier and J. F. Rabek (1993), pp. 77-117 are enumerated. For example, the following compounds are enumerated.

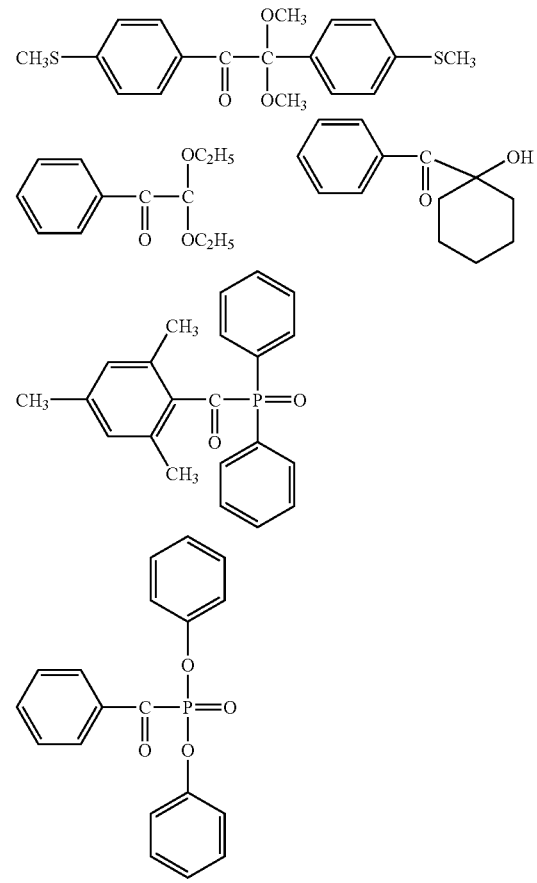

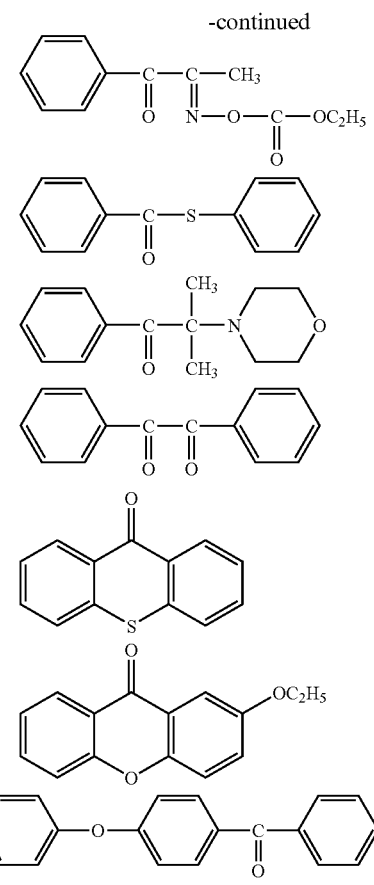

Above all, as especially preferred examples of the aromatic ketone (a), α-thiobenzaphenone compounds described in JP-B-47-6416 and benzoin ether compounds described in JP-B-47-3981, for example, the following compound, are enumerated.

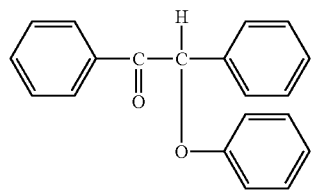

α-Substituted benzoin compounds described in JP-B-47-22326, for example, the following compound, are enumerated.

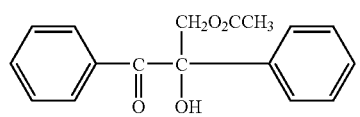

Benzoin derivatives described in JP-B-47-23664, aroylphosphonic acid esters described in JP-A-57-30704, and dialkoxybenzophenones described in JP-B-60-26483, for example, the following compound, are enumerated.

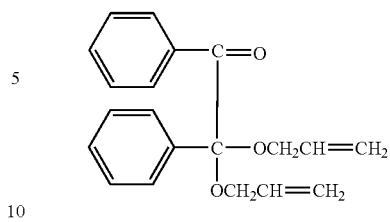

Benzoin ethers described in JP-B-60-26403 and JP-A-62-81345, for example, the following compound, are enumerated.

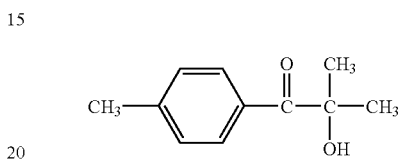

α-Aminobenzophenones described in JP-B-1-34242, U.S. Pat. No. 4,318,791, and European Patent No. 0284561A1, for example, the following compounds, are enumerated.

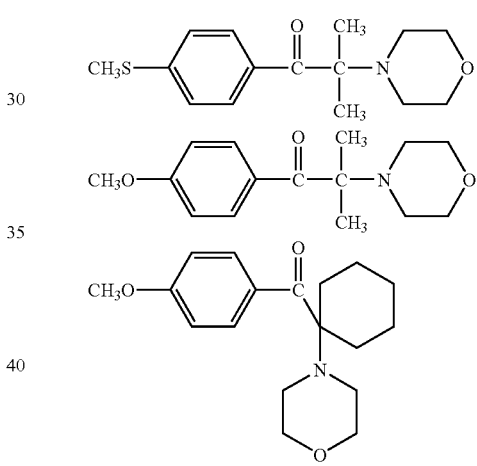

p-Di(dimethylaminobenzoyl)benzenes described in JP-A-2-211452, for example, the following compound, are enumerated.

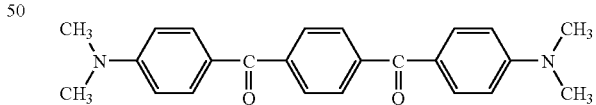

Thio substituted aromatic ketones described in JP-A-61-194062, for example, the following compound, are enumerated.

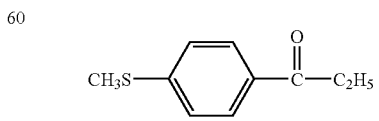

Acyl phosphine sulfides described in JP-B-2-9597, for example, the following compounds, are enumerated.

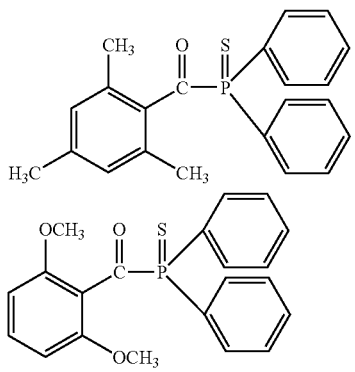

Acyl phosphines described in JP-B-2-9596, for example, the following compounds, are enumerated.

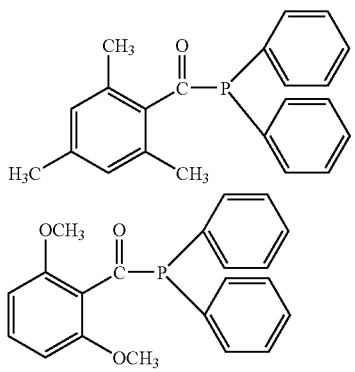

Also, thioxanthones described in JP-B-63-61950 and coumarins described in JP-B-59-42864 are enumerated.

(b) Onium Salt Compound:

As the onium salt compound (b) that is preferable as the radical initiator to be used in the invention, compounds represented by the following formulae (1) to (3) are enumerated.

In the formula (1), $Ar^1$ and $Ar^2$ each independently represents an optionally substituted aryl group having not more than 20 carbon atoms. In the case where this aryl group has a substituent, preferred examples of the substituent include a halogen atom, a nitro group, an alkyl group having not more than 12 carbon atoms, an alkoxy group having not more than 12 carbon atoms, and an aryloxy group having not more than 12 carbon atoms. $(Z^2)^-$ represents a counter ion selected from the group consisting of a halogen ion, a perchloric acid ion, a carboxylic acid ion, a tetrafluoroborate ion, a hexafluorophosphate ion, and a sulfonic acid ion, and preferably a perchloric acid ion, a hexafluorophosphate ion, and an arylsulfonic acid ion.

In the formula (2), $Ar^3$ represents an optionally substituted aryl group having not more than 20 carbon atoms. Preferred examples of the substituent include a halogen atom, a nitro group, an alkyl group having not more than 12 carbon atoms, an alkoxy group having not more than 12 carbon atoms, an aryloxy group having not more than 12 carbon atoms, an alkylamino group having not more than 12 carbon atoms, a dialkylamino group having not more than 12 carbon atoms, an arylamino group having not more than 12 carbon atoms, and a diarylamino group having not more than 12 carbon atoms. $(Z^3)^-$ represents a counter ion synonymous with $(Z^2)^-$.

In the formula (3), $R^{23}$, $R^{24}$, and $R^{25}$ may be the same as or different from each other and each represents an optionally substituted hydrocarbon group having not more than 20 carbon atoms. Preferred examples of the substituent include a halogen atom, a nitro group, an alkyl group having not more than 12 carbon atoms, an alkoxy group having not more than 12 carbon atoms, and an aryloxy group having not more than 12 carbon atoms, $(Z^4)^-$ represents a counter ion synonymous with $(Z^2)^-$.

In the invention, specific examples of the onium salt that can suitably be used include ones described in paragraph numbers [0030] to [0033] of Japanese Patent Application No. 11-310623, ones described in paragraph numbers [0015] to [0046] of Japanese Patent Application No. 2000-160323, and specific aromatic sulfonium salt compounds described in Japanese Patient Application Nos. 2000-266797, 2001-177150, 2000-160323, 2000-184603, 2000-310808, 2002-265467 and 2002-366539, all of which patent applications were previously proposed by the present assignee.

The onium slat to be used in the invention preferably has a maximum absorption wavelength of not longer than 400 nm, and more preferably not longer than 360 nm. When the absorption wavelength is made present in ultraviolet regions, it is possible to handle a lithographic printing plate precursor under white light.

(c) Organic Peroxide:

As the organic peroxide (c) that is preferable as the radical initiator to be used in the invention, almost all of organic compounds containing at least one oxygen-oxygen bond in the molecule are included. Examples include methyl ethyl ketone peroxide, cyclohexanone peroxide, 3,3,5-trimethylcyclohexanone peroxide, methylcyclohexane peroxide, acetylacetone peroxide, 1,1-bis(tertiary butyl per-oxy)-3,3,5-trimethylcyclohexanone,1,1-bis(tertiary butyl peroxy)cyclohexane, 2,2-bis(tertiary butyl peroxy)butane, tertiary butyl hydroperoxide, cumene hydroperoxide, diisopropylbenzene hydroperoxide, p-methane hydroperoxide, 2,5-dimethylhexane-2,5-dihydroperoxide, 1,1,3,3-tetramethylbutyl hydroperoxide, di-tertiary butyl peroxide, tertiary butylcumyl peroxide, dicumyl peroxide, bis(tertiary butyl peroxyisopropyl)benzene, 2,5-dimethyl-2,5-di(tertiary butyl peroxy)hexane, 2,5-xanoyl peroxide, succinic peroxide, benzoyl peroxide, 2,4-dichlorobenzoyl peroxide, m-toluoyl peroxide, diisopropyl peroxydicarhonate, di-2-ethylhexyl peroxydicarbonate, di-2-ethoxyethyl peroxydicarbonate, dimethoxyisopropyl peroxycarbonate, di(3-methyl-3-methoxy-butyl)peroxydicarbonate, tertiary butyl peroxyacetate, tertiary butyl peroxypivalate, tertiary butyl peroxyneodecanoate, tertiary butyl peroxyoctanoate, tertiary butyl per oxy-3,5,5-trimethylhexanoate, tertiary butyl peroxylaurate, tertiary butyl carbonate, 3,3,'4,4,'-tetra(t-butyl peroxy-carbonyl)benzophenone, 3,3',4,4'-tetra(t-amyl peroxycarbonyl)benzophenone, 3,3',4,4'-tetra(t- hexyl peroxycarbonyl)benzophenone, 3,3',4,4'-tetra(t-octyl peroxycarbonyl)benzophenone, 3,3',4,4'-tetra(cumyl peroxycarbonyl)benzophenone, 3,3',4,4'-tetra(p-isopropylcumyl peroxycarbonyl)benzophenone, carbonyl di(t-butyl peroxydihydrogendiphthalate), and carbonyl di(t-hexyl peroxydihydrogendiphthalate).

Of these, ester peroxides such as 3,3',4,4'-tetra(t-butyl peroxycarbonyl)benzophenone, 3,3',4,4'-tetra-(t-amyl peroxycaxbonyl)benzophenone, 3,3',4,4'-tetra-(t-hexyl peroxycarbonyl)benzophenone, 3,3',4,4'-tetra-(t-octyl peroxycarbonyl)benzophenone, 3,3',4,4'-tetra(cumyl peroxycarbonyl)benzophenone, 3,3',4,4'-tetra(p-isopropylcumyl peroxycarbonyl)benzophenone, and di-t-butyl diperoxyisophthalate are preferable.

(d) Thio Compound:

As the thio compound (d) that is preferable as the radical initiator to be used in the invention, compounds having a structure represented by the following formula (4) are enumerated.

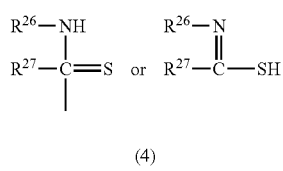

Formula (4)

(4)

Here, $R^{26}$ represents an alkyl group, an aryl group, or a substituted aryl group; and $R^{27}$ represents a hydrogen atom or an alkyl group. Also, $R^{26}$ and $R^{27}$ represent a non-metallic atomic group necessary for forming a 5-membered to 7-membered ring optionally containing a hetero atom selected from an oxygen atom, a sulfur atom, and a nitrogen atom, when taken together.

In the forgoing formula (4), the alkyl group is preferably an alkyl group having from 1 to 4 carbon atoms. Also, the aryl group is preferably an aryl group having from 6 to 10 carbon atoms, such as phenyl and naphthyl. The substituted aryl group includes the foregoing aryl groups which are, however, substituted with a halogen atom such as a chlorine atom, an alkyl group such as a methyl group, or an alkoxy group such as a methoxy group and an ethoxy group. $R^{27}$ is preferably an alkyl group having from 1 to 4 carbon atoms. As specific examples of the thio compound represented by the formula (4), the following compounds are enumerated.

| No. | $R^{26}$ | $R^{27}$ |
| --- | --- | --- |
| 1 | —H | —H |
| 2 | —H | —CH$_3$ |
| 3 | —CH$_3$ | —H |
| 4 | —CH$_3$ | —CH$_3$ |
| 5 | —C$_6$H$_5$ | —C$_2$H$_5$ |
| 6 | —C$_6$H$_5$ | —C$_4$H$_9$ |
| 7 | —C$_6$H$_4$Cl | —CH$_3$ |
| 8 | —C$_6$H$_4$Cl | —C$_4$H$_9$ |
| 9 | —C$_6$H$_4$—CH$_3$ | —C$_4$H$_9$ |
| 10 | —C$_6$H$_4$—OCH$_3$ | —CH$_3$ |
| 11 | —C$_6$H$_4$—OCH$_3$ | —C$_2$H$_5$ |
| 12 | —C$_6$H$_4$—OC$_2$H$_5$ | —CH$_3$ |
| 13 | —C$_6$H$_4$—OC$_2$H$_5$ | —C$_2$H$_5$ |
| 14 | —C$_6$H$_4$—OCH$_3$ | —C$_4$H$_9$ |
| 15 | —(CH$_2$)$_2$— | |
| 16 | —(CH$_2$)$_2$—S— | |
| 17 | —CH(CH$_3$)—CH$_2$—S— | |
| 18 | —CH$_2$—CH(CH$_3$)—S— | |
| 19 | —C(CH$_3$)$_2$—CH$_2$—S— | |
| 20 | —CH$_2$—C(CH$_3$)$_2$—S— | |
| 21 | —(CH$_2$)$_2$—O— | |
| 22 | —CH(CH$_3$)—CH$_2$—O— | |
| 23 | —C(CH$_3$)$_2$—CH$_2$—O— | |
| 24 | —CH=CH—N(CH$_3$)— | |
| 25 | —(CH$_2$)$_3$—S— | |
| 26 | —(CH$_2$)$_2$—CH(CH$_3$)—S— | |
| 27 | —(CH$_2$)$_3$—O— | |
| 28 | —(CH$_2$)$_5$— | |
| 29 | —C$_6$H$_4$—O— | |
| 30 | —N=C(SCH$_3$)—S— | |
| 31 | —C$_6$H$_4$—NH— | |
| 32 | 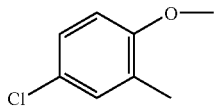 | |

(e) Hexaaryl Biimidazole Compound:

As the hexaaryl biimidazole compound (e) that is preferable as the radical initiator to be used in the invention, lophine dimers described in JP-B-45-37377 and JP-B-44-86516, such as 2,2'-bis(o-chlorophenyl)-4,4',5,5'-tetraphenyl biimidazole, 2,2'-bis(o-bromophenyl)-4,4',5,5'-tetraphenyl biimidazole, 2,2'-bis(o,p-dichlorophenyl)-4,4',5,5'-tetraphenyl biimidazole, 2,2'-bis(o-chlorophenyl)-4,4',5,5'-tetra(m-methoxypheny)biimidazole, 2,2'-bis-(o,o-dichlorophenyl)-4,4',5,5'-tetraphenyl biimidazole, 2,2'-bis(o-nitrophenyl)-4,4',5,5'-tetraphenyl biimidazole, 2,2'-bis(o-methylphenyl)-4,4',5,5'-tetraphenyl biimidazole, and 2,2'-bis(o-trifluorophenyl)-4,4',5,5'-tetraphenyl biimidazole, are enumerated.

(f) Keto Oxime Ester Compound:

As the keto oxime ester compound (f) that is preferable as the radical initiator to be used in the invention, 3-benzoyloxyiminobutan-2-one, 3-acetoxyiminobutan-2-one, 3-propionyloxyiminobutan-2-one, 2-acetoxyiminopentan-3-one, 2-acetoxyimino-1-phenylpropan-1-one, 2-benzoyloxyimino-1-phenylpropan-1-one, 3-p-toluenesulfonyloxyiminobutan-2-one, and 2-ethoxycarbonyloxyimino-1-phenylpropan-1-one are enumerated.

(g) Borate Compound:

As the borate compound (g) that is preferable as the radical initiator to be used in the invention, compounds represented by the following formula (5) are enumerated.

Formula (5)

(5)

Here, $R^{28}$, $R^{29}$, $R^{30}$, and $R^{31}$ may be the same as or different from each other and each represents a substituted or unsubstituted alkyl group, a substituted or unsubstituted aryl group, a substituted or unsubstituted alkenyl group, a substituted or unsubstituted alkynyl group, ox a substituted or unsubstituted heterocyclic group, and two or more of $R^{28}$, $R^{29}$, $R^{30}$, and $R^{31}$ may be taken together to form a cyclic structure. However, at least one of $R^{28}$, $R^{29}$, $R^{30}$, and $R^{31}$ represents a substituted or unsubstituted alkyl group. $(Z^5)^+$ represents an alkali metal cation or a quaternary ammonium cation.

Examples of the alkyl group represented by $R^{28}$, $R^{29}$, $R^{30}$, and $R^{31}$ include linear, branched or cyclic alkyl groups preferably having from 1 to 18 carbon atoms. Specific examples include methyl, ethyl, propyl, isopropyl, butyl, pentyl, hexyl, octyl, stearyl, cyclobutyl, cyclopentyl, and cyclohexyl. Also, examples of the substituted alkyl group include the foregoing alkyl groups which are, however, substituted with a halogen atom (such as —Cl and —Br), a cyano group, a nitro group, an aryl group (preferably a phenyl group), a hydroxyl group, —$COOR^{32}$ (wherein $R^{32}$ represents a hydrogen atom or an alkyl group or aryl group having from 1 to 14 carbon atoms), —$OCOR^{33}$ or —$OR^{34}$ (wherein $R^{33}$ and $R^{34}$ each represents an alkyl group or aryl group having from 1 to 14 carbon atoms), or a substituent represented by the following formula.

Here, $R^{35}$ and $R^{36}$ each independently represents a hydrogen atom or an alkyl group or aryl group having from 1 to 14 carbon atoms.

Examples of the aryl group represented by $R^{28}$, $R^{29}$, $R^{30}$, and $R^{31}$ include aryl groups having from one to three rings, such as a phenyl group and a naphthyl group. Examples of the substituted aryl group include the foregoing aryl groups which are, however, substituted with a substituent in the foregoing substituted alkyl group or an alkyl group having from 1 to 14 carbon atoms. Examples of the alkenyl group represented by $R^{28}$, $R^{29}$, $R^{30}$, and $R^{31}$ include linear, branched or cyclic alkenyl groups having from 2 to 18 carbon atoms. Examples of the substituent of the substituted alkenyl group include substituents enumerated in the foregoing substituted alkyl group. Examples of the alkynyl group represented by $R^{28}$, $R^{29}$, $R^{30}$ and $R^{31}$ include linear or branched alkynyl groups having from 2 to 28 carbon atoms. Examples of the substituent of the substituted alkynyl group include substituents enumerated in the foregoing substituted alkyl group. Also, examples of the heterocyclic group represented by $R^{28}$, $R^{29}$, $R^{30}$, and $R^{31}$ include heterocyclic rings having five or more members, and preferably from five to seven members, each containing at least one of N, S and O, and the heterocyclic ring may include a fused ring. Further, the heterocyclic ring may have a substituent enumerated in the foregoing substituted aryl group. Specific examples of the compound represented by the formula (5) include compounds described in U.S. Pat. Nos. 3,567,453 and 4,343,891 and European Patent Nos. 109,772 and 109,773 and the following compounds.

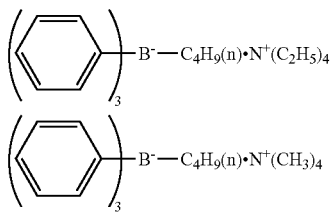

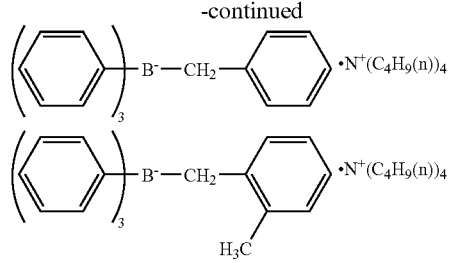

(h) Azinium Compound:

As the azinium compound (h) that is preferable as the radical initiator to be used in the invention, compounds containing an N—O bond as described in JP-A-63-138345, JP-A-63-142345, JP-A-63-142346, JP-A-63-143537, and JP-B-46-42363 can be enumerated.

(i) Metallocene Compound:

As the metallocene compound (i) that is preferable as the radical initiator to be used in the invention, titanocene compounds described in JP-A-59-152396, JP-A-61-151197, JP-A-63-41484, JP-A-2-249, and JP-A-2-4705, and iron-arene complexes described in JP-A-1-304453 and JP-A-1-152109 can be enumerated.

Specific examples of the foregoing titanocene compounds include dicyclopentadienyl-Ti-dichloride, dicyclopentadienyl-Ti-bis-phenyl, dicyclopentadienyl-Ti-bis-2,3,4,5,6-pentafluorophen-1-yl, dicyclopentadienyl-Ti-bis-2,3,5,6-tetrafluorophen-1-yl, dicyclopentadienyl-Ti-bis-2,4,6-trifluorophen-1-yl, dicyclopentadienyl-Ti-2,6-difluorophen-1-yl, dicyclopentadienyl-Ti-bis-2,4-difluorophen-1-yl, dimethylcyclopentadienyl-Ti-bis-2,3,4,5,6-pentafluorophen-1-yl, dimethylcyclopentadienyl-Ti-bis-2,3,5,6-tetrafluorophen-1-yl, dimethylcyclopentadienyl-Ti-bis-2,4-difluorophen-1-yl, bis(cyclopentadienyl)-bis(2,6-difluoro-3-(pyri-1-yl)phenyl)titanium, bis(cyclopentadienyl)bis[2,6-difluoro-3-(methylsulfonamido)phenyl]titanium, bis(cyclopentadienyl)bis[2,6-difluoro-3-(N-butylbiaroylamino)phenyl]titanium, bis(cyclopentadienyl)bis[2,6-difluoro-3-(N-butyl-(4-chlorobenzoyl)amino)phenyl]titanium, bis(cyclopentadienyl)bis[2,6-difluoro-3-(N-benzyl-2,2-dimethylpentanoylamino)phenyl]titanium, bis(cyclopentadienyl)bis-[2,6-difluoro-3-(N-(2-ethylhexyl)-4-tolylsulfonyl)amino]-phenyl]titanium, bis(cyclopentadienyl)bis[2,6-difluoro-3-(N-(3-oxaheptyl)benzoylamino)phenyl]titanium, bis(cyclopentadienyl)bis[2,6-difluoro-3-(N-(3,6-dioxadecyl)benzoylamino)phenyl]titanium, bis(cyclopentadienyl)bis[2,6-difluoro-3-(trifluoromethylsulfonylamino)phenyl]-titanium, bis(cyclopentadienyl)bis[2,6-difluoro-3-(trifluoroacetylamino)phenyl]titanium, bis(cyclopentadienyl)bis[2,6-difluoro-3-(2-chlorobenzoylamino)phenyl]titanium, bis(cyolopentadienyl)bis[2,6-difluoro-3-(4-chlorobenzoylamino)phenyl]titanium, bis(cyclopentadienyl)bis[2,6-difluoro-3-(N-(3,6-dioxadecyl)-2,2-dimethylpentanoylamino)phenyl]titanium, bis(cyclopentadienyl)bis[2,6-difluoro-3-(N-(3,7-dimethyl-7-methoxyoctyl)benzoylamino)phenyl]titanium, and bis(cyclopentadienyl)bis[2,6-difluoro-3-(N-cyclohexylbenzoylamino)phenyl]titanium.

(j) Active Ester Compound:

As the active ester compound (j) that is preferable as the radical initiator to be used in the invention, imidosulfonate compounds described in JP-B-62-6223 and active sulfonates described in JP-B-63-14340 and JP-A-59-174831 can be enumerated.

(k) Carbon-halogen Bond-containing Compound:

As the carbon-halogen bond-containing compound (k) that is preferable as the radical initiator to be used in the invention, compounds represented by the following formulae (6) to (12) can be enumerated.

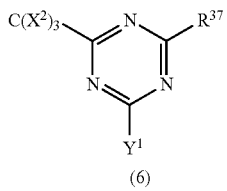

Formula (6)

In the formula (6), $X^2$ represents a halogen atom; and $Y^1$ represents $-C(X^2)_3$, $-NH_2$, $-NHR^{38}$, $-NR^{38}$, or $-OR^{38}$. Here, $R^{38}$ represents an alkyl group, a substituted alkyl group, an aryl group, or a substituted aryl group. Also, $R^{37}$ represents $-C(X^2)_3$, an alkyl group, a substituted alkyl group, an aryl group, a substituted aryl group, or a substituted alkenyl group.

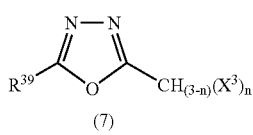

Formula (7)

In the formula (7), $R^{39}$ represents an alkyl group, a substituted alkyl group, an alkenyl group, a substituted alkenyl group, an aryl group, a substituted aryl group, a halogen atom, an alkoxy group, a substituted alkoxy group, a nitro group, or a cyano group; $X^3$ represents a halogen atom; and $n$ represents an integer of from 1 to 3.

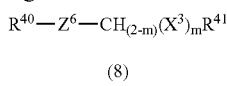

Formula (8)

In the formula (8), $R^{40}$ represents an aryl group or a substituted aryl group; $R^{41}$ represents any one of the following groups or a halogen atom; $Z^6$ represents $-C(=O)-$, $-C(=S)-$, or $-SO_2-$, $X^3$ represents a halogen atom; and $m$ is 1 or 2.

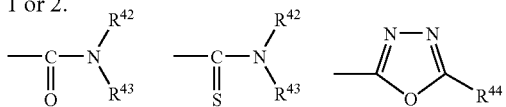

Here, $R^{42}$ and $R^{43}$ each represents an alkyl group, a substituted alkyl group, an alkenyl group, a substituted alkenyl group, an aryl group, or a substituted aryl group; and $R^{44}$ is the same as $R^{38}$ in the formula (6).

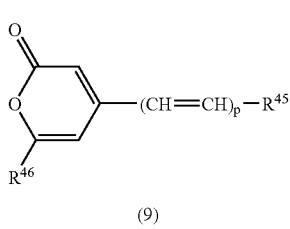

Formula (9)

In the formula (9), $R^{45}$ represents an optionally substituted aryl group or heterocyclic group: $R^{46}$ represents a trihaloalkyl group or trihaloalkenyl group having from 1 to 3 carbon atoms; and $p$ is 1, 2 or 3.

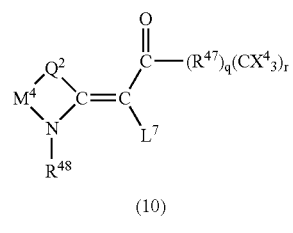

Formula (10)

The formula (10) stands for a carbonylmethylene heterocyclic compound containing a trihalogenomethyl group. $L^7$ represents a hydrogen atom or a substituent represented by the formula, $CO-(R^{47})_q(C(X^4)_3)_r$; $Q^2$ represents a sulfur atom, a selenium atom, an oxygen atom, a dialkylmethylene group, an alken-1,2-ylene group, a 1,2-phenylene group, or an N—R group; $M^4$ represents a substituted or unsubstituted alkylene group or alkenylene group, or a 1,2-arylene group; $R^{48}$ represents an alkyl group, an aralkyl group or an alkoxyalkyl group; $R^{47}$ represents a carbocyclic or heterocyclic divalent aromatic group; $X^4$ represents a chlorine atom, a bromine group, or an iodine atom; and q=0 and r=1, or q=1 and r=1 or 2.

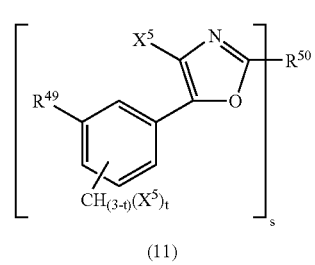

Formula (11)

The formula (ii) stands for a 4-halogeno-5-(halogenomethyl-phenyl)-oxazole derivative. $X^5$ represents a halogen atom; $t$ represents an integer of from 1 to 3; $s$ represents an integer of from 1 to 4; $R^{49}$ represents a hydrogen atom or a $CH_{3-t}X^5_t$ group; and $R^{50}$ represents an optionally substituted unsaturated organic group having a valence of $s$.

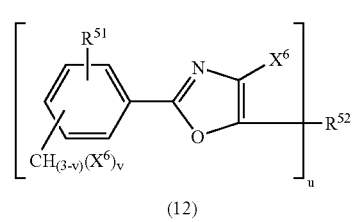

Formula (12)

The formula (12) stands for a 2-(halogeno-methyl-phenyl)-4-halogeno-oxazole derivative. $X^6$ represents a halogen atom; $v$ represents an integer of from 1 to 3; $u$ represents an integer of from 1 to 4; $R^{51}$ represents a hydrogen atom or a $CH_{3-v}X^6_v$ group; and $R^{52}$ represents an optionally substituted unsaturated organic group having a valence of $u$.

Specific examples of the carbon-halogen bond-containing compound include compounds described in Wakabayashi, et al., *Bull. Chem. Soc. Japan,* 42, 2924 (1969), such as 2-phenyl-4,6-bis(trichloromethyl)-S-triazine, 2-(p-chlorophenyl)-4,6-bis(trichloromethyl)-S-triazine, 2-(p-tolyl)-4,6-bis(trichloromethyl)-S-traizine, 2-(p-methoxyphenyl)-4,6-bis(trichloromethyl)-S-triazine, 2-(2',4'-dichlorophenyl)-4,6-bis(trichloromethyl)-S-triazine, 2,4,6-tris(trichloramethyl)-S-triazine, 2-methyl-4,6-bis(trichloromethyl)-S-triazine, 2-n-nonyl-4,6-bis(trichloramethyl)-S-triazine, and 2-(α,α,β-trichloroethyl)-4,6-bis(trichloromethyl)-S-triazine. Besides, compounds described in British Patent No. 1,388,492, such as 2-styryl-4,6bis(trichloromethyl)-S-triazine, 2-(p-methylstyryl)-4,6-bis(trichloxomethyl)-S-triazine, 2-(p-methoxystyryl)-4,6-bis(trichloromethyl)-S-triazine, and 2-(p-methoxystyryl)-4-amino-6-trichloromethyl-S-triazine;

compounds described in JP-A-53-133428, such as 2-(4-methoxy-naphtho-1-yl)-4,6-bis-trichloromethyl-S-triazine, 2-(4-ethoxy-naphtho-1-yl)-4,6-bis-trichloromethyl-S-triazine, 2-[4-(2-ethoxyethyl)-naphtho-1-yl]-4,6-bis-trichloromethyl-S-triazine, 2-(4,7-dimethoxy-naphtho-1-yl)-4,6-bis-trichloromethyl-S-triazine, and 2-(acenaphtho-5-yl)-4,6-bis-trichloromethyl-S-triazine; and compounds described in German Patent No. 3,337,024, such as the following compounds.

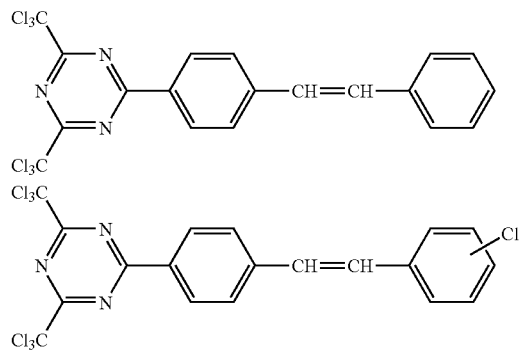

Also, compounds described in F. C. Schaefer, et al., *J. Org. Chem.,* 29, 1527 (1964), such as 2-methyl-4,6-bis(tribromomethyl)-S-triazine, 2,4,6-tris(tribromomethyl)-S-triazine, 2,4,6-tris(tribromomethyl)-S-triazine, 2-amino-4-methyl-6-tribromomethyl-S-triazine, and 2-methoxy-4-methyl-6-trichloramethyl-S-triazine, can be enumerated. Further, compounds described in JP-A-62-58241, such as the following compounds, can be enumerated.

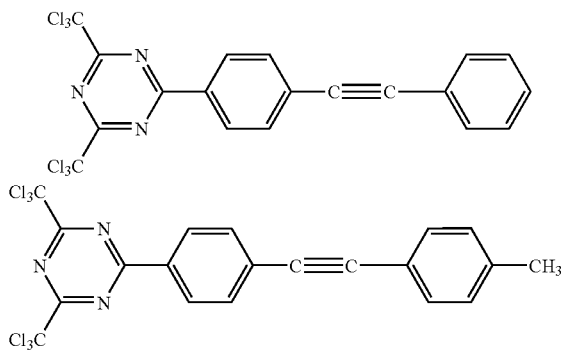

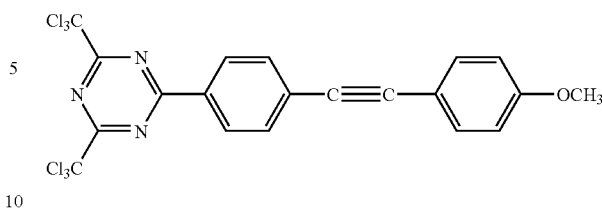

Further, compounds described in JP-A-5-281728, such as the following compounds, can be enumerated.

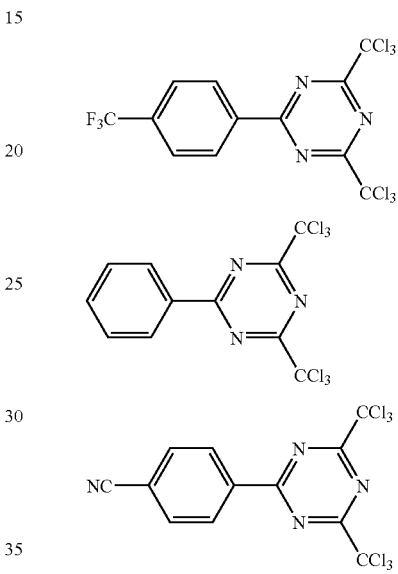

Alternatively, the following group of compounds which those skilled in the art can easily synthesize according to the synthesis method described in M. P. Hutt, E. F. Elslager and L. K. Herbel, *Journal of Heterocyclic Chemistry,* Vol. 7 (No. 3), page 511, et seq. (1970) such as the following compounds, can be enumerated.

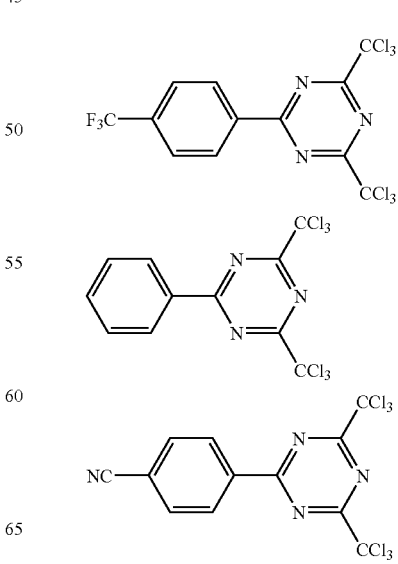

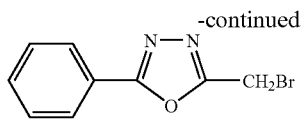

(l) Azo Based Compound:

As the azo based compound (l) that is preferable as the radical initiator to be used in the invention, 2,2'-azobisisobutyronitrile, 2,2'-azobispropionitrile, 1,1'-azobis(cyclohexane-1-carbonitrile), 2,2'-azobis(2methylbutyronitrile), 2,2'-azobis(2,4-dimethylvaleronitrile), 2,2'-azobis(4-methoxy-2,4-dimethylvaleronitrile), 4,4'-azobis(4-cyanovaleric acid), dimethyl 2,2'-azobisisobutyrate, 2,2'-azobis(2methylpropionamidoxime), 2,2'-azobis[2-(2-imidazolin-2-yl)propane], 2,2'-azobis{2-methyl-N-[1,1-bis(hydroxymethyl)-2-hydroxyethyl]propionamide}, 2,2'-azobis[2-methyl-N-(2-hydroxyethyl)propionamide], 2,2'-azobis(N-butyl-2-methylpropionamide), 2,2'-azobis-(N-cyclohexyl-2-methylpropionamide), 2,2'-azobis [N-(2-propenyl)-2-methylpropionamide], and 2,2'-azobis(2,4,4-trimethylpentane) can be enumerated.

In the invention, the foregoing aromatic ketone (a), onium salt compound (b), organic peroxide (c), hexaaryl biimidazole compound (e), metallocene compound (i), and carbon-halogen bond-containing compound (c) can be enumerated as more preferred examples of the radical initiator. Above all, aromatic iodonium salts, aromatic sulfonium salts, titanocene compounds, and trihalomethyl-S-triazine compounds represented by the formula (6) can be enumerated as the most preferred examples of the radical initiator.

The radical initiator can be added in the polymerizable composition in an amount of from 0.1 to 50% by weight, preferably from 0.5 to 30% by weight, and especially preferably from 5 to 20% by weight based on the whole of solids of the polymerizable composition.

In the invention, the radical initiator is suitably used singly or in admixture of two or more thereof.

[(C) Compound Containing at Least One Ethylenically Unsaturated Bond]

The compound containing at least one ethylenically unsaturated bond (polymerizable compound) that is used in the polymerizable composition of the invention is selected from compounds containing at least one ethylenically unsaturated bond, and preferably two or more ethylenically unsaturated bonds. A group of such compounds is widely known in the subject industrial field, and these compounds can be used in the invention without particular limitations. These compounds have a chemical form of, for example, a monomer or a prepolymer, that is, a dimer, a trimer, and an oligomer, or a mixture or copolymer thereof. Examples of monomers and copolymers thereof include unsaturated carboxylic acids (such as acrylic acid, methacrylic acid, itaconic acid, crotonic acid, isocrotonic acid, and maleic acid) and esters and amides thereof; and preferably esters between an unsaturated carboxylic acid and an aliphatic polyhydric alcohol compound and amides between an unsaturated carboxylic acid and an aliphatic polyhydric amine compound. Also, addition reaction products of an unsaturated carboxylic acid ester or amide containing a nucleophilic substituent (such as a hydroxyl group, an amino group, and a mercapto group) with a monofunctional or polyfunctional isocyanate or epoxy, and dehydration condensation reaction products thereof with a monofunctional or polyfunctional carboxylic acid are also suitably used. Also, addition reaction products of an unsaturated carboxylic acid ester or amide containing an electrophilic substituent (such as an isocyanate group and an epoxy group) with a monofunctional or polyfunctional alcohol, amine or thiol, and displacement reaction products of an unsaturated carboxylic acid ester or amide containing an eliminating substituent (such as a halogen group and a tosyloxy group) with a monofunctional or polyfunctional alcohol, amine or thiol are also suitable. Also, it is possible to use a group of compounds in which the foregoing unsaturated carboxylic acid is replaced by an unsaturated sulfonic acid, styrene, vinyl ether, etc.

Specific examples of monomers of the ester of an aliphatic polyhydric alcohol compound and an unsaturated carboxylic acid are as follows. Examples of acrylic acid esters include ethylene glycol diacrylate, triethylene glycol diacrylate, 1,3-butanediol diacrylato, tetramethylene glycol diacrylate, propylene glycol diacrylate, neopentyl glycol diacrylate, trimethylolpropane triacrylate, trimethylolpropane tri(acryloyloxypropyl)ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl)isocyanurate, and polyester acrylate oligomers.

Examples of methacrylic acid esters include tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamathacrylate, sorbitol trimethacrylate, sorbitol tetramethacrylate, bis-[p-(3-methacryloxy-2-hydroxypropoxy)phenyl]dimethylmethane, and bis [p-(methacryloxyethoxy)phenyl]dimethylmethane.

Examples of itaconic acid esters include ethylene glycol diitaconate, propylene glycol diitaconate, 1,3-butanediol diitaconate, 1,4-butanediol diitaconate, tetramethylene glycol diitaconate, pentaerythritol diitaconate, and sorbitol tetraitaconate. Examples of crotonic acid esters include ethylene glycol dicrotonate, tetramethylene glycol dicrotonate, pentaerythritol dicrotonate, and sorbitol tetradicrotonate. Examples of isocrotonic acid esters include ethylene glycol diisocrotonate, pentaerythritol diisocrotonate, and sorbitol tetraisocrotonate. Examples of maleic acid esters include ethylene glycol dimaleate, triethylene glycol dimaleate, pentaerythritol dimaleate, and sorbitol tetramaleate.

As other examples of esters, aliphatic alcohol based esters described in JP-B-46-27926, JP-B-51-47334, and JP-A-57-196231; esters having an aromatic skeleton described in JP-A-59-5240, JP-A-59-5241, and JP-A-2-226149; and esters containing an amino group described in JP-A-1-165613 are also suitably used. Further, the foregoing ester monomers can be used as a mixture.

Also, examples of monomers of the amide between an aliphatic polyhydric amine compound and an unsaturated carboxylic acid include methylenebis-acrylamide, methylenebis-methacrylamide, 1,6-hexaethylenebis-acrylamide, 1,6-hexaethylenebis-methacrylamide, diethylenetriamine trisacrylamide, xylylenebisacrylamide, and xylylenebismethacrylamide. An other preferred examples of amide based monomers, ones having a cyclohexylene structure as described in JP-B-54-21726 can be enumerated.

Also, urethane based addition polymerizable compounds produced using addition reaction between an isocyanate and a hydroxyl group are suitable. As specific examples, vinyl urethane compounds containing two or more polymerizable vinyl groups in one molecule, prepared by adding a hydroxyl group-containing vinyl monomer represented by the following formula to a polyisocyanate compound containing two or more isocyanate groups in one molecule, as described in JP-B-48-41708, are enumerated.

$$CH_2=C(R_4)COOCH_2CH(R_5)OH$$

In the formula, $R^4$ and $R^5$ each represents H or $CH_3$.

Also, urethane acrylates described in JP-A-51-37193, JP-B-2-32293, and JP-B-2-16765; and urethane compounds having an ethylene oxide based skeleton described in JP-B-58-49860, JP-B-56-17654, JP-B-62-39417, and JP-B-62-39418 are suitable. Further, by using a polymerizable compound having an amino structure or a sulfide structure in the molecule described in JP-A-63-277653, JP-A-63-260909, and JP-A-1-105238, it is possible to obtain a polymerizable composition having very excellent sensitivity speed.

Other examples include polyester acrylates and polyfunctional acrylates or methacrylates of epoxy acrylates obtained by reacting an epoxy resin and (meth)acrylic acid, as described in JP-A-48-64:83, JP-B-49-43191, and JP-B-52-30490. Also, specific unsaturated compounds described in JP-B-46-43946, JP-B-1-40337, and JP-B-1-40336; and vinyl phosphonic acid based compounds described in JP-A-2-25493 can be enumerated. Also, in some cases, compounds having a perfluoroalkyl group-containing structure described in JP-A-61-22048 are suitably used. Further, compounds introduced as photocurable monomers or oligomers in *Journal of The Adhesion Society of Japan*, Vol. 20, No. 7, pp. 300-308 (1984) can be used.

With respect to these polymerizable compounds, the details of the use method including their structures, single use or combined use, and addition amount can be arbitrarily set up depending upon the use purpose thereof, for example, in the case where the polymerizable composition of the invention is used as a lithographic printing plate precursor, a performance design of the ultimate lithographic printing plate precursor. Fox example, selection is made from the following viewpoints. From the standpoint of sensitivity speed, a structure wherein the unsaturated group content per molecule is high is preferable, and in many cases, bifunctional or polyfunctional compounds are preferable. Also, for the sake of enhancing the strength in an image area, i.e., a cured film, trifunctional or polyfunctional compounds are preferable. Further, a method in which both of sensitivity speed and film strength are adjusted by jointly using compounds having a different functionality and a different polymerizable group (such as acrylic acid esters, methacrylic acid esters, styrene based compounds, and vinyl ether based compounds) is effective. Though compounds having a high molecular weight or compounds having high hydrophobicity are excellent in sensitivity speed and film strength, they may possibly be undesired from the standpoints of development speed and deposition in the developing solution. Also, with respect to affinity with or dispersibility in other components in the recording layer (such as a binder polymer, an initiator, and a coloring agent), selection and use methods of addition polymerizable compounds are important factors. For example, the affinity may possibly be enhanced by using a low-purity compound or jointly using two or more kinds of the compounds. Also, for the purpose of enhancing adhesion to a substrate or an overcoat layer described later, a specific structure can be selected. With respect to a compounding ratio of the polymerizable compound in the recording layer, a high compounding ratio is advantageous from the standpoint of sensitivity. In the case where the compounding ratio is too high, undesirable phase separation may possibly occur, problems in the manufacturing step due to adhesiveness of the recording layer (such as transfer of the recording layer component and manufacturing failure derived from adhesion) may possibly be caused, and a problem such as deposition from the developing solution may possibly be caused. From these viewpoints, the polymerizable compound is preferably used in an amount ranging from 5 to 80% by weight, and more preferably from 25 to 75% by weight based on the non-volatile components in the polymerizable composition. These polymerizable compounds may be used singly or in admixture of two or more thereof. Besides, with respect to the use method of the polymerizable compound, adequate structure, compounding and addition amount can be arbitrarily selected from the viewpoints of degree of polymerization inhibition against oxygen, resolution, fogging properties, change in refractive index, surface adhesiveness, etc. Further, a layer construction or coating method such as undercoating and overcoating can be carried out as the need arises.

[(D) Infrared Ray Absorber]

The polymerizable composition of the invention is characterized by containing an infrared ray absorber that absorbs infrared rays and converts them into heat energy. By exposure with rays having a wavelength such that the infrared ray absorber can absorb, the radical generation reaction of the radical initiator and the polymerization reaction of the polymerizable compound caused thereby are accelerated. As such infrared ray absorbers, known spectral sensitizing dyes or dyestuffs or pigments that absorb light and mutually act with a photo radical initiator are enumerated.

<Spectral Sensitizing Dye or Dyestuff>

Preferred examples of spectral sensitizing dyes or dyestuffs that are used in the invention include polynuclear aromatics (such as pyrene, perylene, and triphenylene), xanthenes (such as Fluoresceine, Eosine, Erythrocin, Rhodamine B, and Rose Bengale), cyanines (such as thiacarbocyanine and oxacarbocyanine), merocyanines (such as merocyanine and carbomerocyanine), thiazines (such as Thionine, Methylene Blue, and Toluidine Blue), acridines (such as Acridine orange, chloroflavin, and acaiflavine), phthalocyanines (such as phthaloine and metal-phthalocyanine), porphyrins (such as tetraphenylprophyrin and central metal-substituted porphyrin), chlorophylls (such as chlorophyll, chlorophyllin, and central metal-substituted chlorophyll), metal complexes, anthraquinones (such as anthraquinone), squariums (such as squarium), and the following compound.

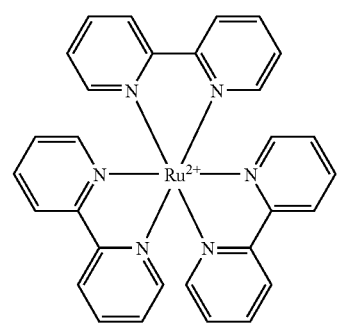

As more preferred spectral sensitizing dyes or dyestuffs, pyrylium salts described in JP-B-40-28499, for example, the following compounds:

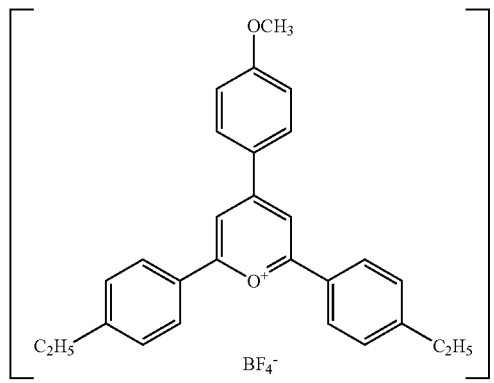

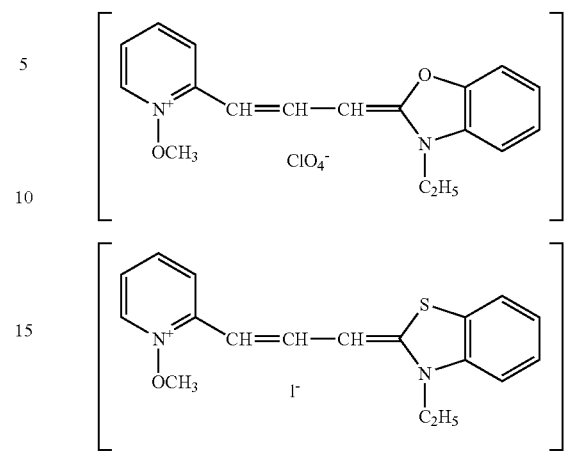

benzofuran dyes described in JP-A-2-63053, for example, the following compounds:

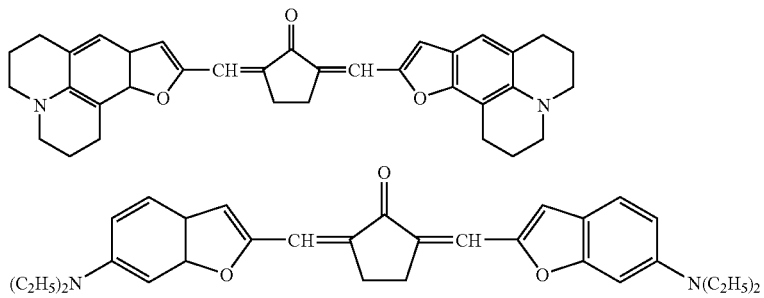

conjugated ketone dyes described in JP-A-2-85858 and JP-A-2-216154, for example, the following compounds:

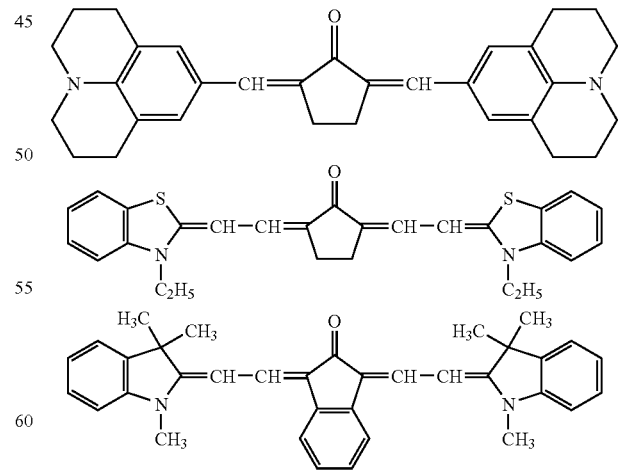

-continued

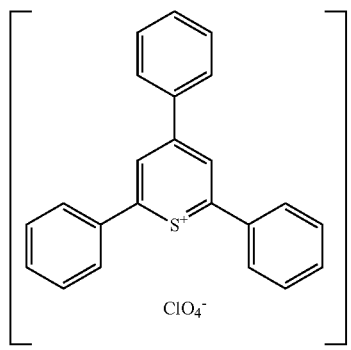

cyanines described in JP-B-46-42363, for example, the following compounds;

dyes described in JP-A-57-10605 and azocinnamylidene derivatives described in JP-B-2-30321, for example, the following compound:

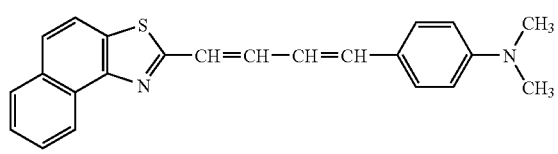

cyanine based dyes described in JP-A-1-287105, for example, the following compounds:

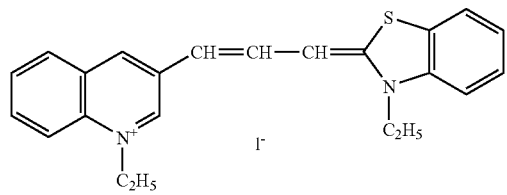

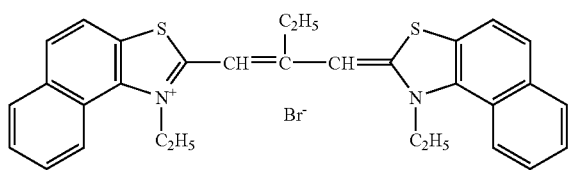

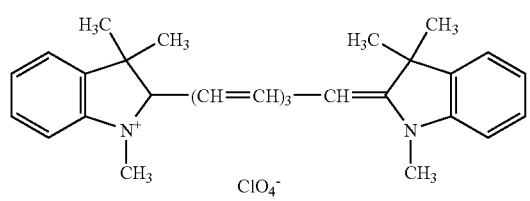

xanthene based dyes described in JP-A-62-31844, JP-A-62-31848, and JP-A-62-143043, for example, the following compounds:

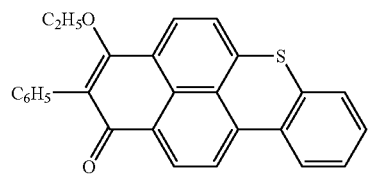

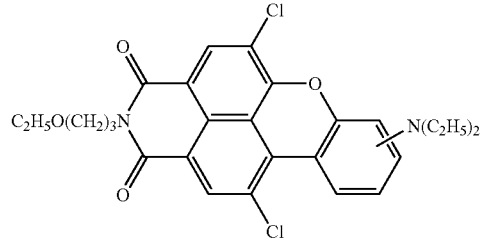

and aminostyryl ketones described in JP-B-59-28325, for example, the following compounds:

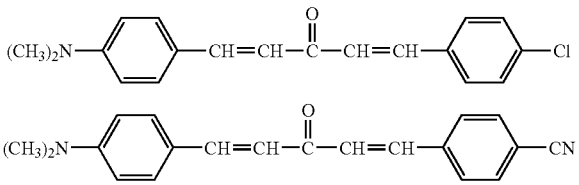

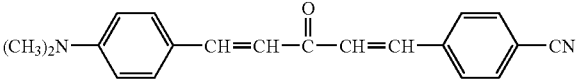

can be enumerated.

Also, the following infrared ray absorbents (dyestuffs or pigments) are especially suitably used as the sensitizing dye. Preferred examples of the dyestuff include cyanine dyestuffs described in JP-A-58-125246, JP-A-59-84356, JP-A-59-202829, and JP-A-60-78787; and cyanine dyestuffs described in British Patent No, 434,875.

Besides, examples of the cyanine dye that can be suitably used in the invention include those described in paragraph numbers [0017] to [0019] of JP-A-2001-133969, paragraph numbers [0012] to [0038] of JP-A-2002-40638, and paragraph numbers [0012] to [0023] of JP-A-2002-23360. Also, specific examples include ones illustrated below.

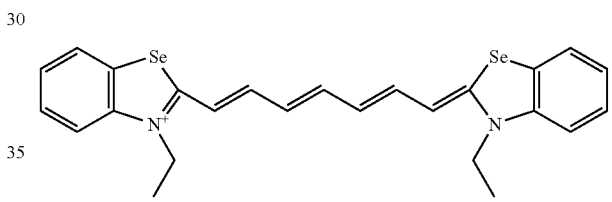

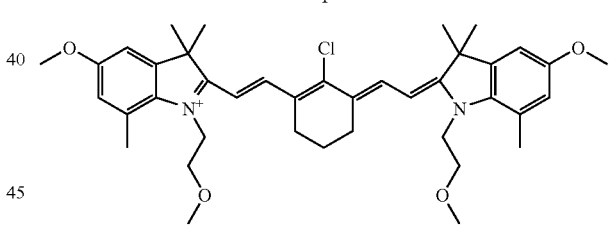

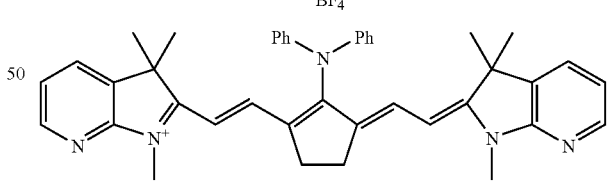

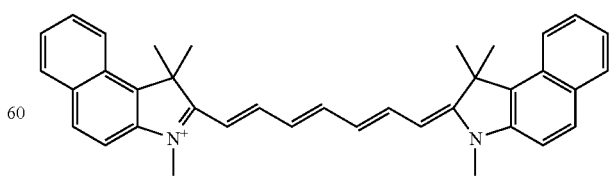

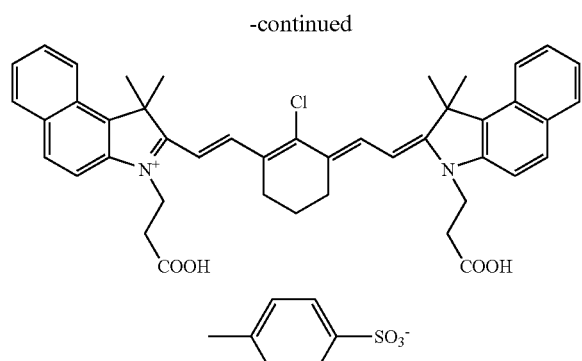
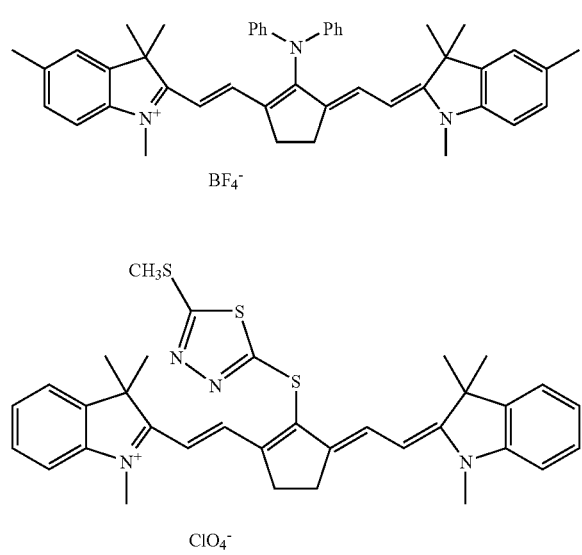
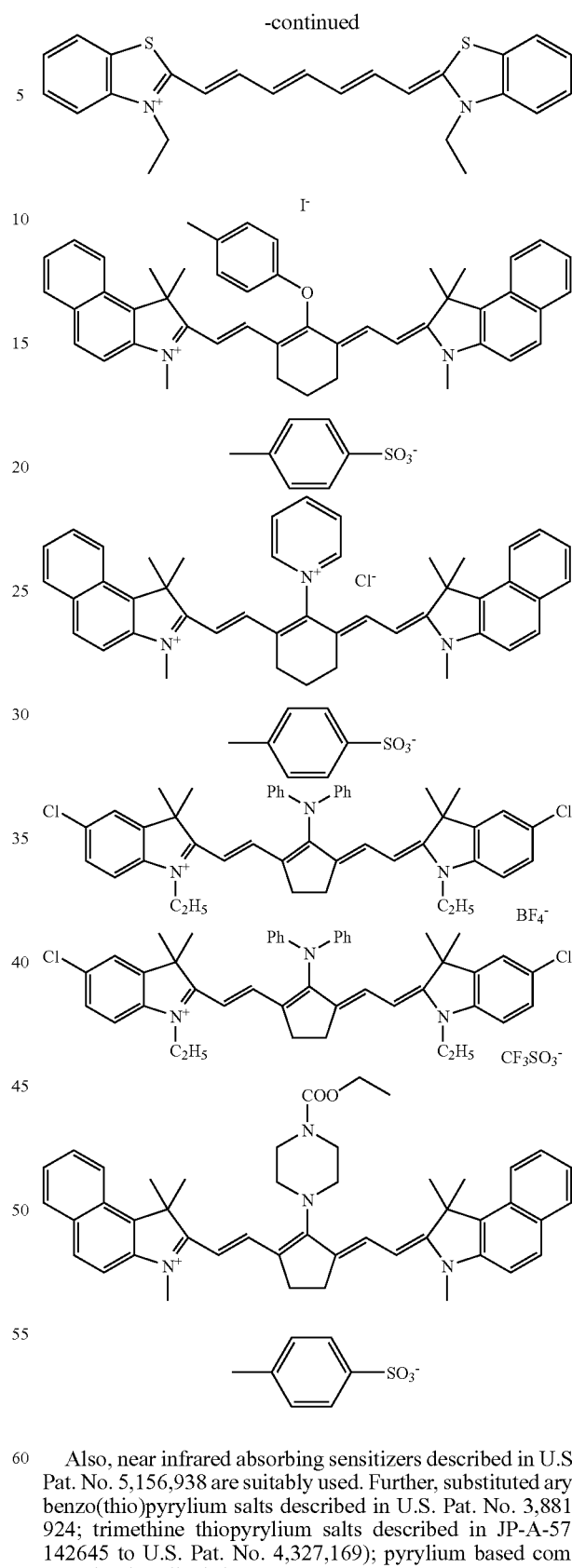
Also, near infrared absorbing sensitizers described in U.S. Pat. No. 5,156,938 are suitably used. Further, substituted aryl benzo(thio)pyrylium salts described in U.S. Pat. No. 3,881,924; trimethine thiopyrylium salts described in JP-A-57-142645 to U.S. Pat. No. 4,327,169); pyrylium based compounds described in JP-A-58-181051, JP-A-58-220143, JP-A-59-41363, JP-A-59-84248, JP-A-59-84249, JP-A-59-146063, and JP-A59-146061; cyanine dyes described in JP-A-59-216146; pentamethine thiopyrylium salts described in U.S. Pat. No. 4,283,475; and pyrylium compounds described in JP-B-5-13514 and JP-B-5-19702 are preferably used.

Also, near infrared absorbing dyestuffs described as the formulae (I) and (II) in U.S. Pat. No. 4,756,993 and phthalocyanine based dyestuffs described in EP916513A2 can be enumerated as the preferred dyestuff.

Further, anionic infrared ray absorbers described in Japanese Patent Application No. 10-79912 can be suitably used. The anionic infrared ray absorber as referred to herein means one in which the matrix of a dye substantially absorbing infrared rays does not have a cation structure but has an anion structure. Examples include (a) an anionic metal complex, (b) anionic carbon black, (c) an anionic phthalocyanine, and (d) a compound represented by the following formula (21). Counter cations of these anionic infrared ray absorbers are a proton-containing monovalent cation or polyvalent cation.

Formula (21)

The anionic metal complex (a) as referred to herein means one in which the whole of a central metal in the complex segment substantially absorbing light and a ligand becomes an anion.

As the anionic carbon black (b), carbon blacks in which an anion group such as a sulfonic acid group and a carboxylic acid group is bound as a substituent are enumerated. In order to introduce such a group into carbon black, there may be employed means for oxidizing carbon black with a prescribed acid as described on page 12 of *Carbon Black Handbook, Third Edition* (compiled by The Carbon Black Association and published on Apr. 5, 1995 by The Carbon Black Association).

The anionic phthalocyanine (c) means one in which an anion group as enumerated above in (b) is bound as a substituent on the phthalocyanine skeleton, whereby the whole becomes an anion.

Next, the compound represented by the foregoing formula (21) (d) will be described below in detail. In the formula (21), $G^9$ represents an anionic substituent; $G^{10}$ represents a neutral substituent; $(X^{10})^+$ represents a proton-containing cation having a valence of 1 to $\underline{m}$; $\underline{m}$ represents an integer of from 1 to 6; and $M^5$ represents a conjugated chain. This conjugated chain $M^5$ may have a substituent or a ring structure. The conjugated chain $M^5$ can be represented by the following formula.

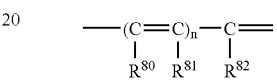

In the formula, $R^{80}$, $R^{81}$, and $R^{82}$ each independently represents a hydrogen atom, a halogen atom, a cyano group, an alkyl group, an aryl group, an alkenyl group, an alkynyl group, a carbonyl group, a thio group, a sulfonyl group, a sulfinyl group, an oxy group, or an amino group; $R^{80}$, $R^{81}$, and $R^{82}$ may be taken together to form a ring structure; and $\underline{n}$ represents an integer of from 1 to 8.

Among anionic infrared ray absorbers represented by the formula (21), the following IRA-1 to IRA-5 are preferably used.

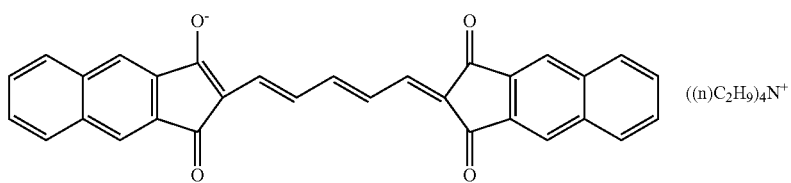

IRA-1

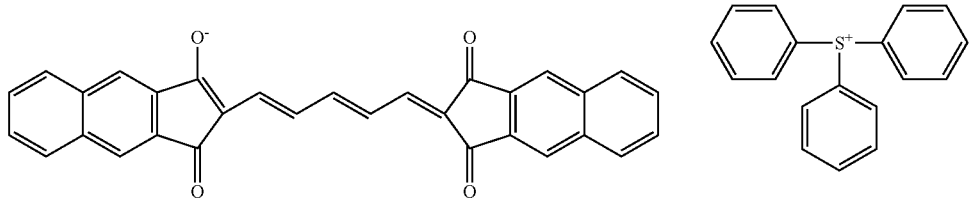

IRA-2

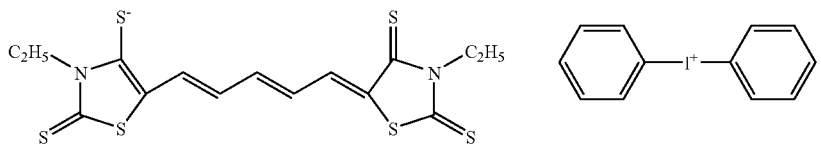

IRA-3

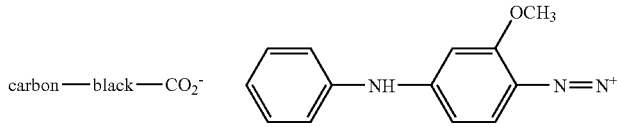

IRA-4

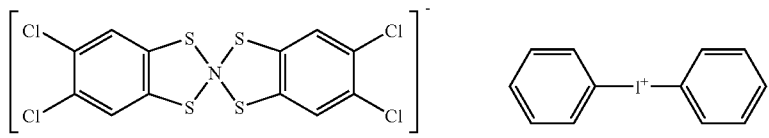
IRA-5
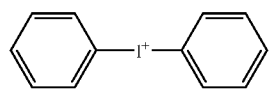
10
Also, cationic infrared ray absorbers represented by the following IRC-1 to IRC-44 can be preferably used.
IRC-1
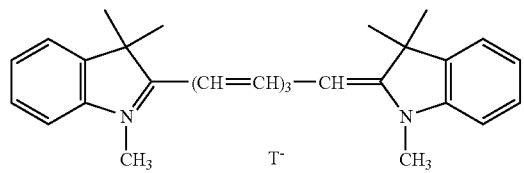
IRC-2
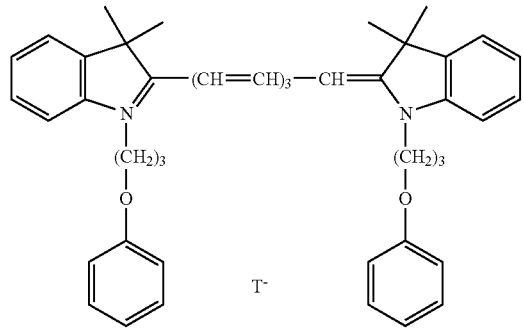
IRC-3
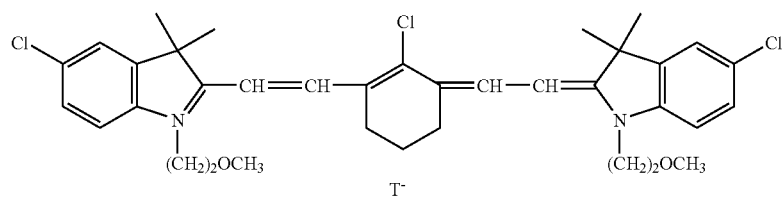
IRC-4
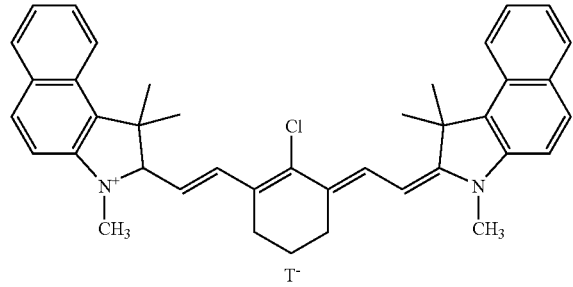
IRC-5
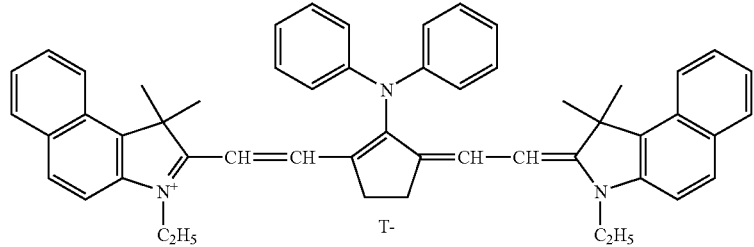

-continued
IRC-6
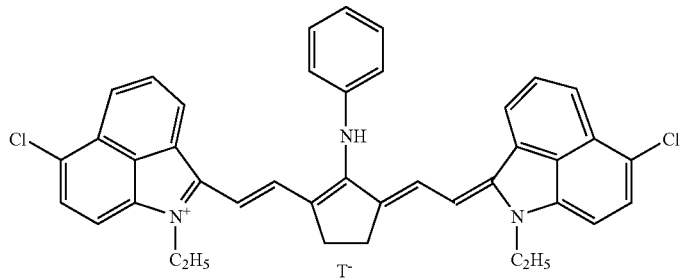
IRC-7
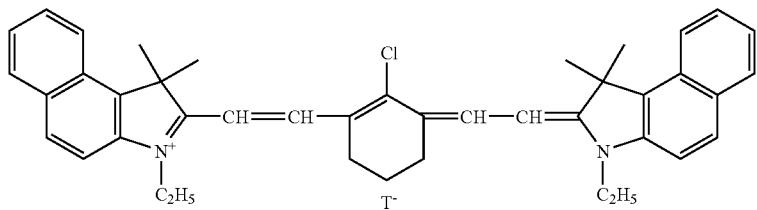
IRC-8
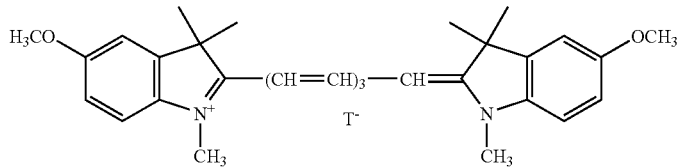
IRC-9
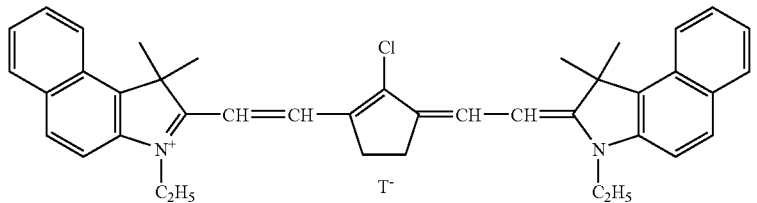
IRC-10
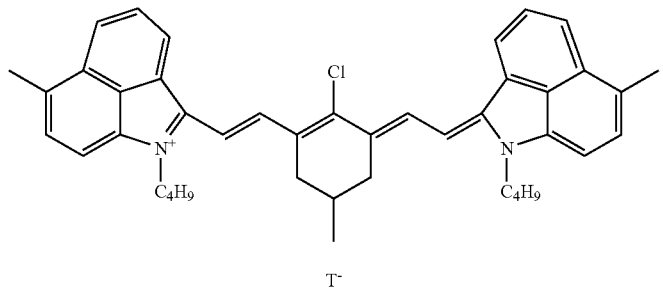
IRC-11
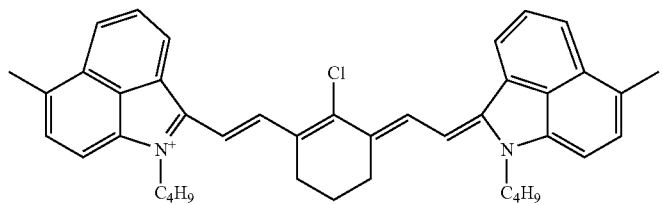
IRC-12
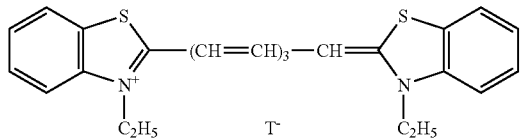

-continued
IRC-13
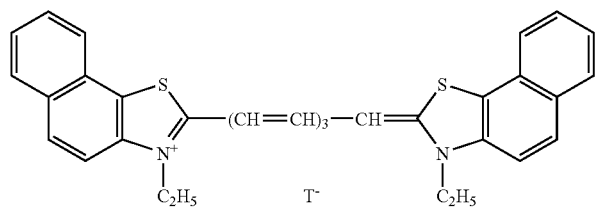
IRC-14
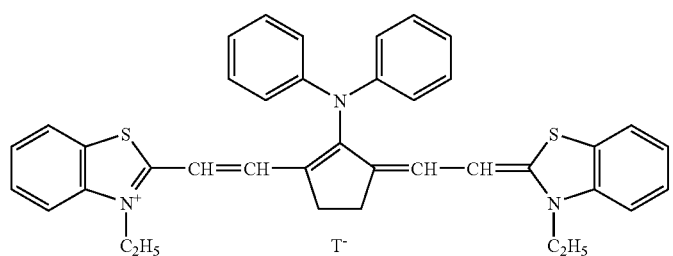
IRC-15
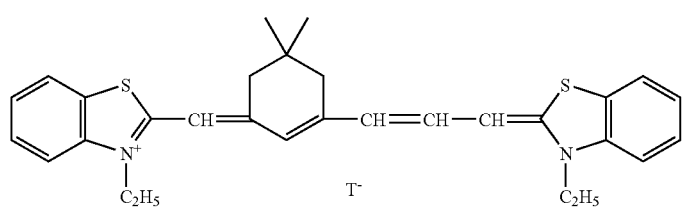
IRC-16
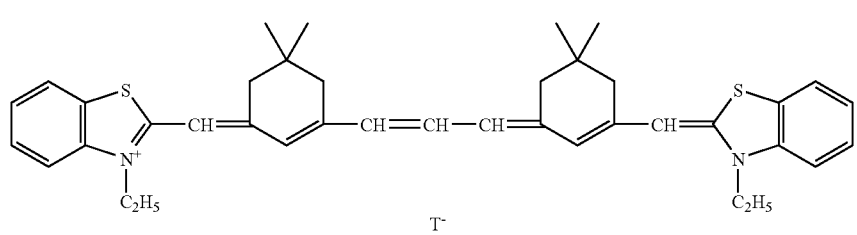
IRC-17
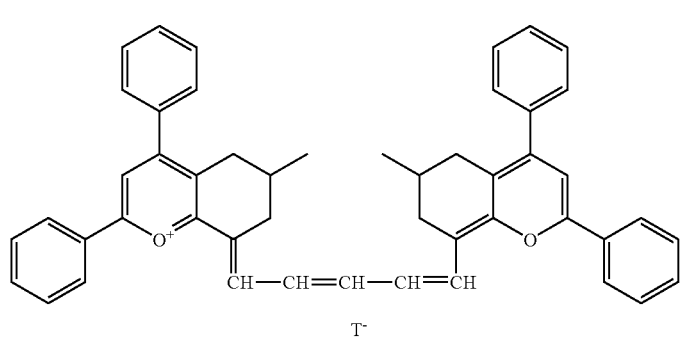
IRC-18
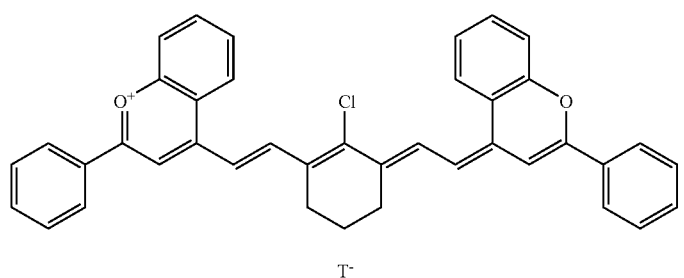

-continued
IRC-19
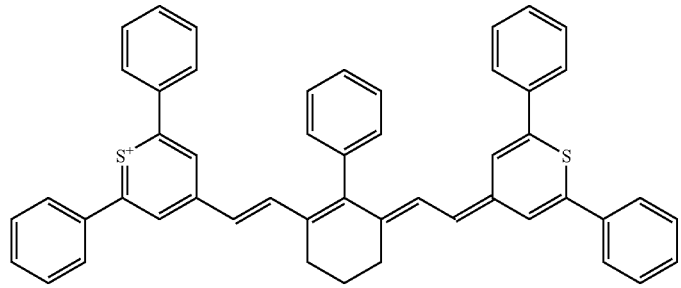
T⁻
IRC-20
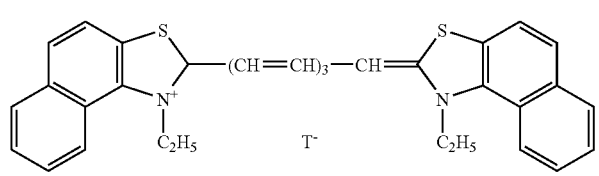
T⁻
IRC-21
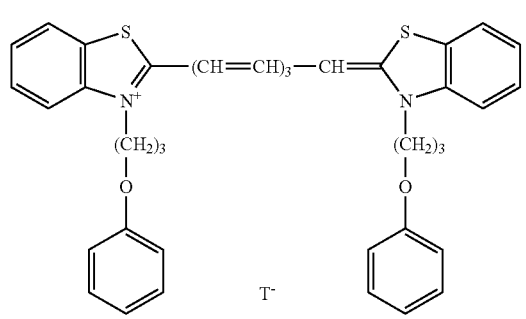
T⁻
IRC-22
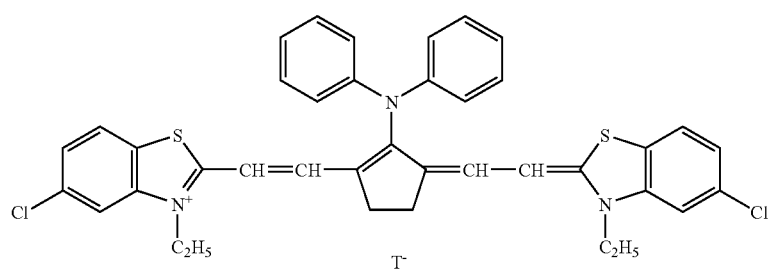
T⁻
IRC-23
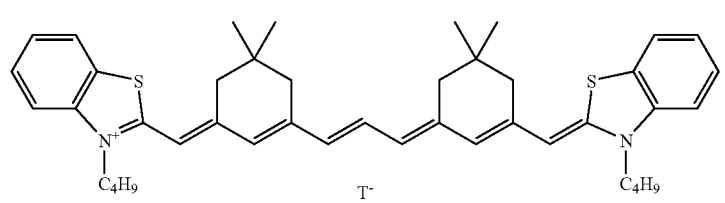
T⁻
IRC-24
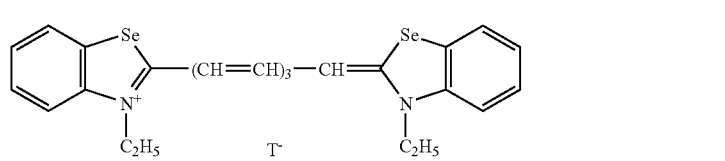
T⁻

-continued
IRC-25
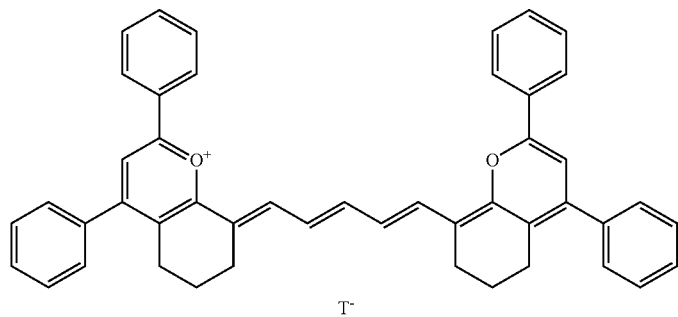
IRC-26
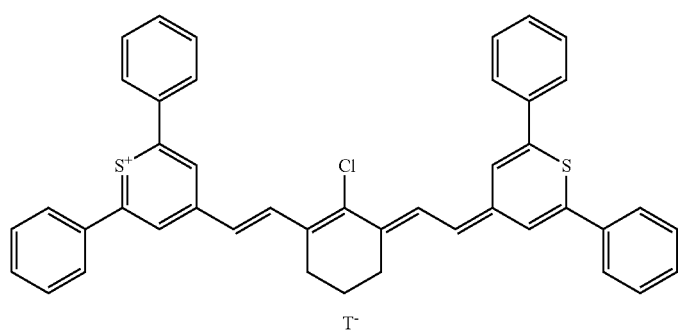
IRC-27
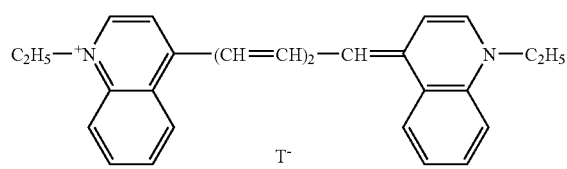
IRC-28
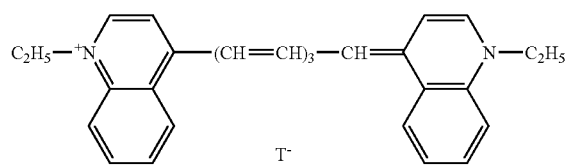
IRC-29
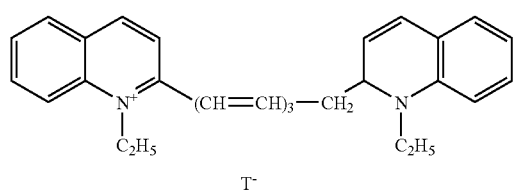
IRC-30
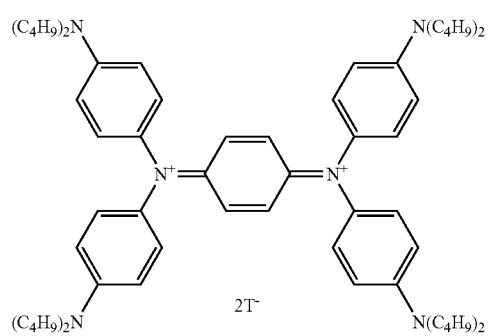

-continued
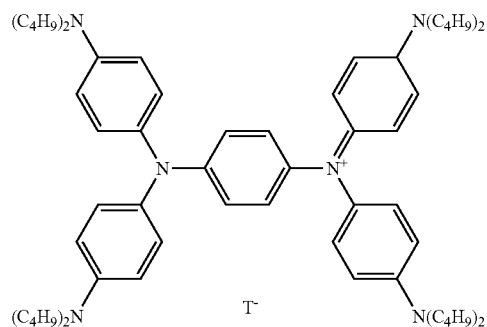
IRC-31
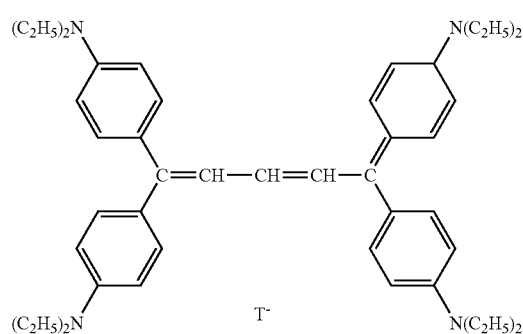
IRC-32
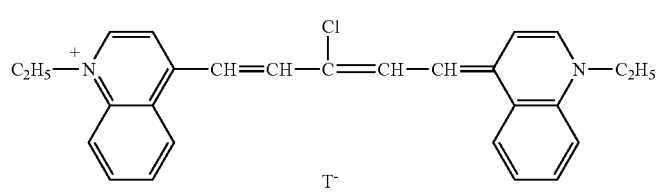
IRC-33
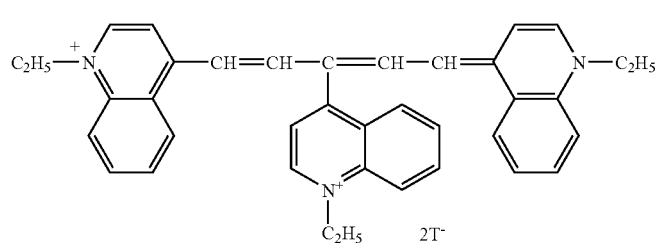
IRC-34
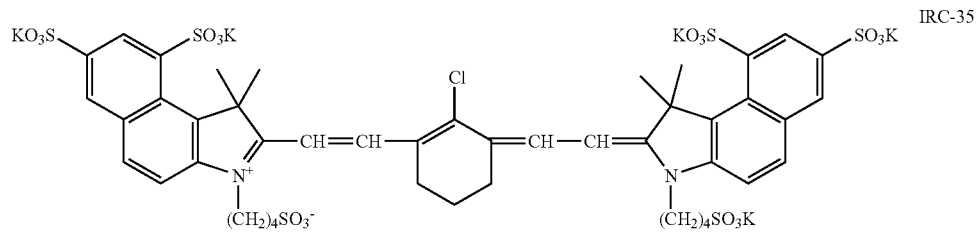
IRC-35
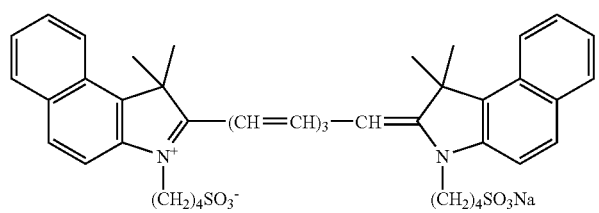
IRC-36

-continued
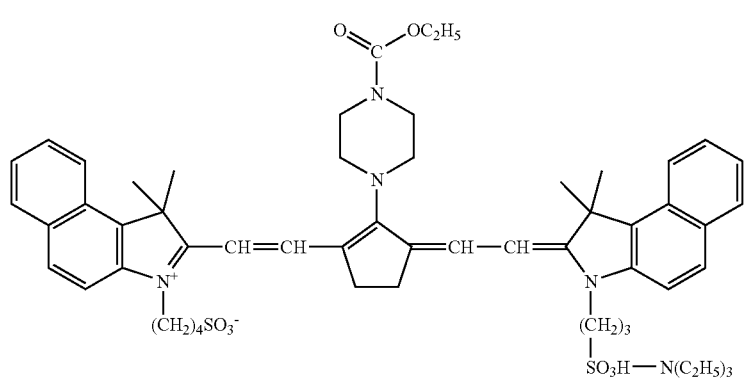
IRC-37
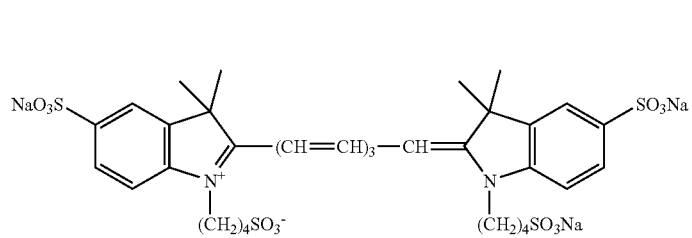
IRC-38
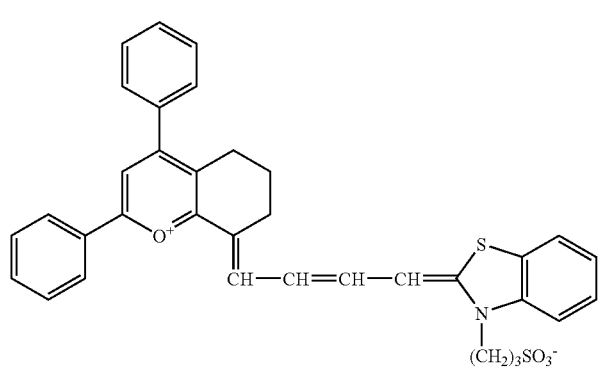
IRC-39
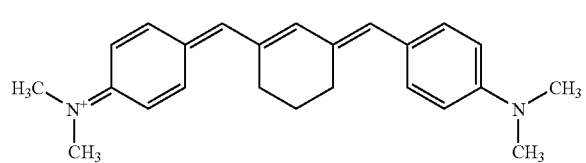
IRC-40
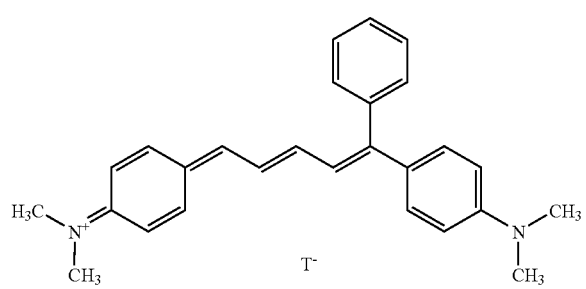
IRC-41

IRC-42

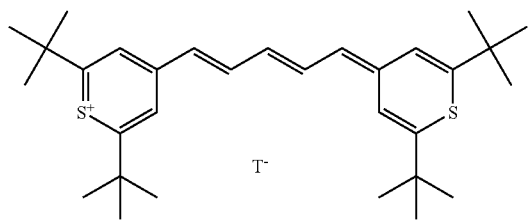

IRC-43

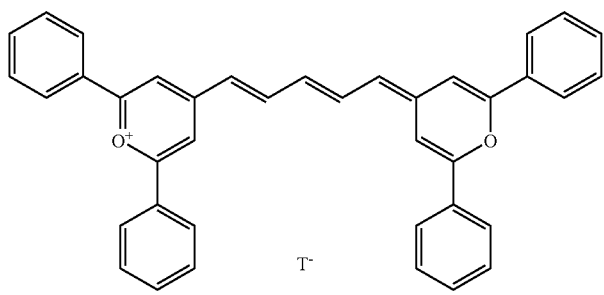

IRC-44

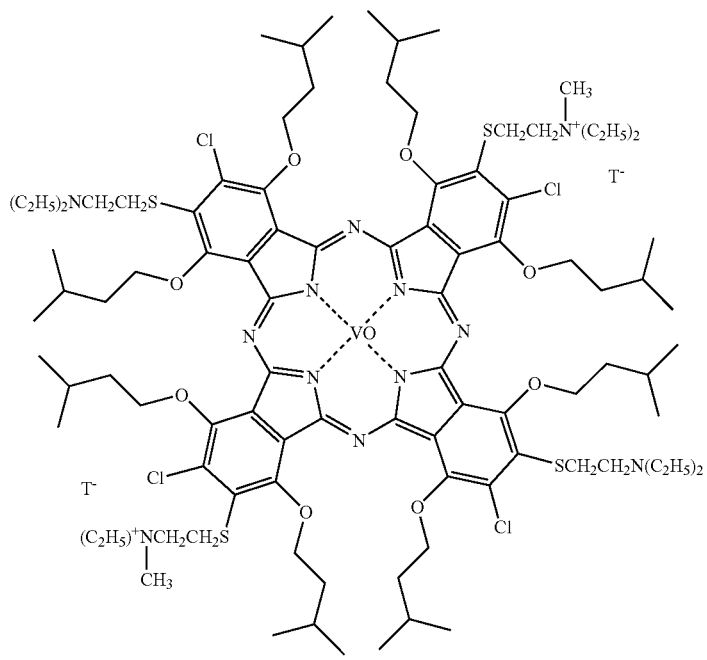

In the foregoing structural formulae, T⁻ represents a monovalent counter anion, and preferably a halogen anion (such as F⁻, Cl⁻, Br⁻, and I⁻), a Lewis acid anion (such as $BP_4^-$, $PP_6^-$, $SbCl_6^-$, and $ClO_4^-$), an alkylsulfonic acid anion, or an arylsulfonic acid anion.

The term "alkyl" of the foregoing alkylsulfonic acid means a linear, branched or cyclic alkyl group having from 1 to 20 carbon atoms. Specific examples include a methyl group, an ethyl group, a propyl group, a butyl group, a pentyl group, a hexyl group, a heptyl group, an octyl group, a nonyl group, a decyl group, an undecyl group, a dodecyl group, a tridecyl group, a hexadecyl group, an octadecyl group, an eicosyl group, an isopropyl group, an isobutyl group, a sec-butyl group, a t-butyl group, an isopentyl group, a neopentyl group, a 1-methylbutyl group, an isohexyl group, a 2-ethylhexyl group, a 2-methylhexyl group, a cyclohexyl group, a cyclopentyl group, and a 2-norbonyl group. Of these, linear alkyl groups having from 1 to 12 carbon atoms, branched alkyl groups having from 3 to 12 carbon atoms, and cyclic alkyl groups having from 5 to 10 carbon atoms are more preferable.

The term "aryl" of the foregoing arylsulfonic acid means one formed of one benzene ring, a fused ring formed of two or three benzene rings, or a fused ring formed of a benzene ring and a 5-membered unsaturated ring. Specific examples include a phenyl group, a naphthyl group, an anthryl group, a phenanthryl group, an indenyl group, an acenaphthenyl group, and a fluorenyl group. Of these, a phenyl group and a naphthyl group are more preferable.

Also, nonionic infrared ray absorbers represented by the following IRN-1 to IRN-9 can be preferably used.

IRN-1
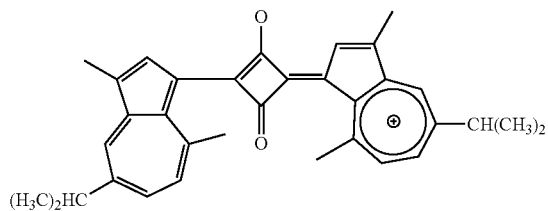
IRN-2
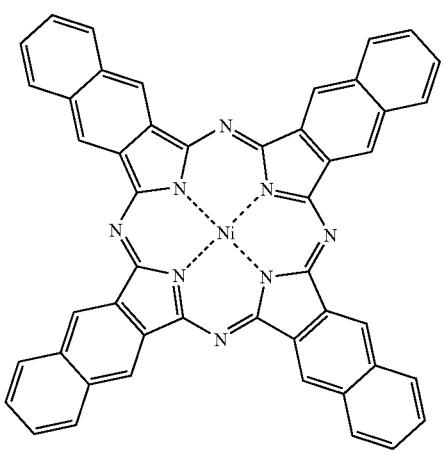
IRN-3
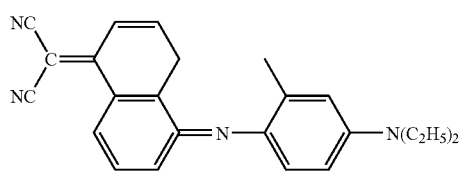
IRN-4
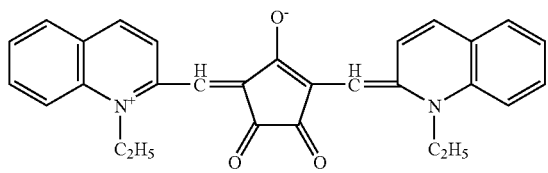
IRN-5
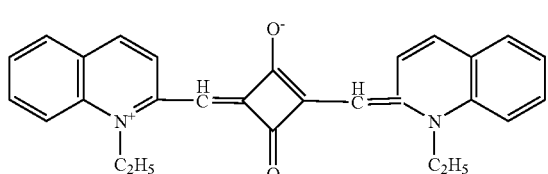
IRN-6
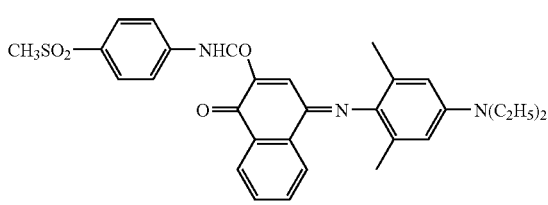
-continued
IRN-7
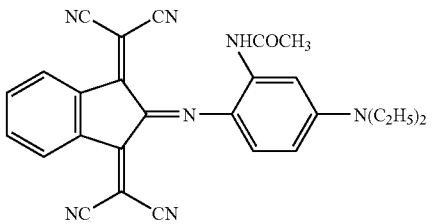
IRN-8
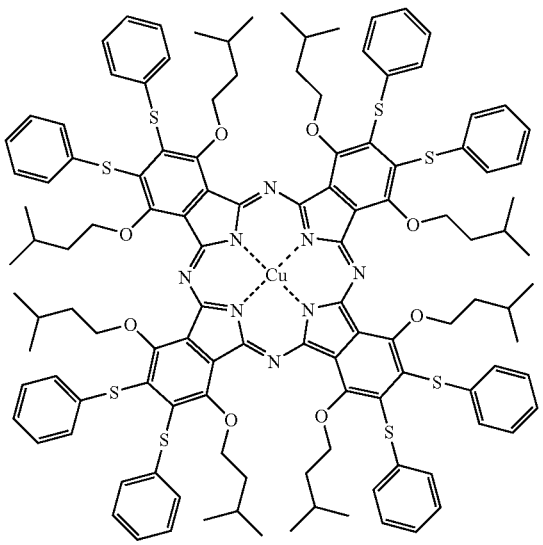
IRN-9
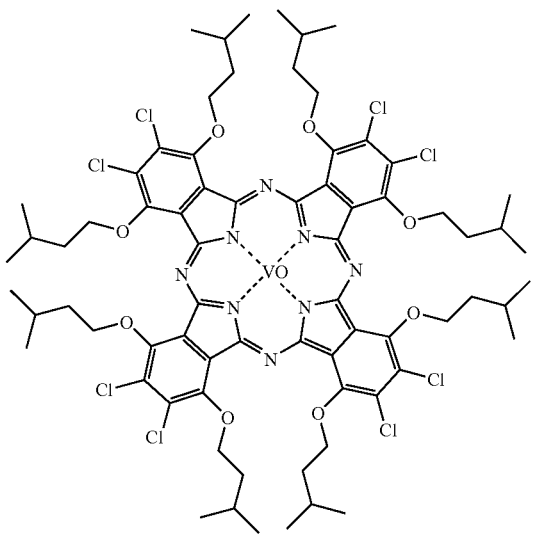
Among the foregoing illustrative compounds, IRA-1 is especially preferable as the anionic infrared ray absorber; IRC-7, IRC-30, IRC-40, and IRC-42 are especially preferable as the cationic infrared ray absorber; and IRN-9 is especially preferable as the nonionic infrared ray absorber, respectively.

<Pigment>

As the pigments that can be used in the invention, commercially available pigments and pigments described in *Color Index (C.I.) Handbook; Saishin Ganryo Binran* (Current Pigment Handbook), compiled by Nippon Ganryo Pigment Kyokai (1977); *Saishin Ganryo Ohyo Gijutsu* (Current Pigment Application Technologies), published by CHC Publishing Co., Ltd. (1986); and *Insatsu Inki Gijutsu* (Printing Ink Technologies), published by CMC Publishing co., Ltd. (1984).

Examples of the pigment include black pigments, yellow pigments, orange pigments, brown pigments, red pigments, violet pigments, blue pigments, green pigments, fluorescent pigments, metal powder pigments, and other polymer-binding dyes. Specific examples include insoluble azo pigments, azo lake pigments, condensed azo pigment, chelate azo pigments, phthalocyanine based pigments, anthraquinone based pigments, perylene based pigments, perinone based pigments, thioindigo based pigments, quinacridone based pigments, dioxazine based pigments, isoindolinone based pigments, quinophthalone based pigments, dyeing lake pigments, azine pigments, nitroso pigments, nitro pigments, natural pigments, fluorescent pigments, inorganic pigments, and carbon black. Of these pigments, carbon black is preferable.

The pigments that can be used in the invention may be used without surface treatment or upon surface treatment. As the surface treatment method, there can be considered a method of coating the surface with a resin or a wax, a method of adhering a surfactant, and a method of binding a reactive substance (such as silane coupling agents, epoxy compounds, and polyisocyanates) to the pigment surface. These methods are described in *Kinzoku Sekken No Seishitsu To Ohyo* (Properties and Applications of Metallic Soaps), published by Saiwai Shobo; *Insatsu Inki Gijutsu* (Printing Ink Technologies), published by CMC Publishing Co., Ltd. (1984); and *Saishin Ganryo Ohyo Gijutsu* (Current Pigment Application Technologies), published by CMC Publishing Co., Ltd. (1986).

The particle size of the pigment is preferably in the range of from 0.01 µm to 10 µm, more preferably from 0.05 µm to 1 µm, and especially preferably from 0.1 µm to 1 µm. When the particle size of the pigment is less than 0.01 µm, such is not preferable from the standpoint of stability of the dispersion in the coating solution for image recording layer. On the other band, when it exceeds 10 µm, such is not preferable from the standpoint of uniformity of the image recording layer.

As a method of dispersing the pigment, known dispersion technologies to be used at the time of ink production or toner production can be employed. Examples of dispersing machines include a ultrasonic dispersion machine, a sand mill, an attritor, a pearl mill, a super mill, a ball mill, an impeller, a disperser, a KD mill, a colloid mill, a dynatron, a three-roll mill, and a pressure kneader. The details are described in *Saishin Ganryo Ohyo Gijutsu* (Current Pigment Application Technologies), published by CMC Publishing Co., Ltd. (1986).

Incidentally, though the infrared ray absorber to be added for the purpose of accelerating curing reaction of the polymerizable composition of the invention may be directly added in the composition together with other components, the same effect can be obtained by providing another layer adjacent thereto and adding the infrared ray absorber in this adjacent layer.

In particular, in the case where the polymerizable composition of the invention is used as a negative working image recording material of lithographic printing plate precursor as described later, the infrared ray absorber may be added in the same layer as in the image recording material or may be added in another layer as provided. However, it is preferable that in preparing the negative working image recording material, an optical density at the absorption maximum of wavelength of the recording layer in the range of from 300 nm to 1,200 nm falls between 0.1 and 3.0. When the optical density falls outside this range, the sensitivity is liable to become low. Since the optical density is determined depending upon the addition amount of the sensitizing dye and the thickness of the recording layer, a prescribed optical density is obtained by controlling the both conditions. The optical density of the recording layer can be measured by the customary manners. Examples of the measurement method include a method in which a recording layer whose thickness has been properly determined within the range where the coating amount after drying is required as a lithographic printing plate is formed on a transparent or white support, the optical density of which is then measured using a transmission type optical densitometer and a method in which a recording layer is formed on a reflective support such as aluminum, the reflection density of which is then measured.

[(E) Binder Polymer]

In the polymerizable composition of the invention, for the purpose of enhancing the film characteristics, (E) a binder polymer can be used as the need arises. As the binder polymer, linear organic polymers are preferable. As such "linear organic polymers", known ones can be arbitrarily used. Preferably, in order to make it possible to undergo water development or weakly alkaline water development, linear organic polymers that are soluble in or swelling with water or weakly alkaline water are chosen. The linear organic polymer is selected and used according to the applications as not only a film forming agent of the image recording material but also as a water, weakly alkaline water or organic solvent developer. For example, when a water-soluble organic polymer is used, it is possible to undergo water development. Examples of such linear organic polymers include radical polymers having a carboxylic acid group in the side chains thereof, as described in, for example, JP-A-59-44615, JP-B-54-34327, JP-B-58-12577, JP-B-54-25957, JP-B-54-92723, JP-A-59-53836, and JP-A-59-71048, that is, methacrylic acid copolymers, acrylic acid copolymers, itaconic acid copolymers, crotonic acid copolymers, maleic acid copolymers, partially esterified maleic acid copolymers, and the like. Also, acidic cellulose derivatives having a carboxylic acid group in the side chains thereof are enumerated. Besides, hydroxyl group-containing polymers to which a cyclic acid anhydride has been added are useful.

In particular, (meth)acrylic resins having a benzyl group or an allyl group and a carboxyl group in the side chains thereof and alkali-soluble resins having a double bond in the side chains thereof, as described in JP-A-2000-187322, JP-A-2002-62648, Japanese Patent Application Nos. 2001-253217 and 2002-287920, and JP-A-2002-62648 are excellent in balance among film strength, sensitivity and developability and therefore, are suitable.

Also, acid group-containing urethane based binder polymers described in JP-B-7-12004, JP-B-7-120041, JP-B-7-120042, JP-B-8-12424, JP-A-63-287944, JP-A-63-287947, JP-A-1-271714, and Japanese Patent Application No. 10-116232 are very excellent in strength and therefore, are advantageous from the standpoints of printing resistance of low-exposure adaptability.

Further, as other water-soluble linear organic polymers, polyvinylpyrrolidone and polyethylene oxide are useful. Also, for the sake of increasing the strength of the cured film, alcohol-soluble nylons and polyester between 2,2-bis-(4-hydroxyphenyl)-propane and epichlorohydrin are useful.

With respect to the polymer to be used in the invention, its weight average molecular weight is preferably 5,000 or more, and more preferably in the range of from 10,000 to 300,000; and its number average molecular weight is preferably 1,000 or more, and more preferably in the range of from 2,000 to 250,000. Its degree of polydispersion (weight average molecular weight/number average molecular weight) is preferably 1 or more, and more preferably in the range of from 1.1 to 10.

While these polymers may be any of a random polymer, a block polymer, or a graft polymer, they are preferably a random polymer.

The polymer used in the invention can be synthesized by the conventionally known methods. Examples of solvents that are used in the synthesis include tetrahydrofuran, ethylene dichloride, cyclohexanone, methyl ethyl ketone, acetone, methanol, ethanol, ethylene glycol monomethyl ether, ethylene glycol monoethyl ether, 2-methoxyethyl acetate; diethylene glycol dimethyl ether, 1-methoxy-2-propanol, 1-methoxy-2-propyl acetate, N,N-dimethylformamide, N,N-dimethylacetamide, toluene, ethyl acetate, methyl lactate, ethyl lactate, dimethyl sulfoxide, and water. These solvents are used singly or in admixture of two or more thereof.

Examples of radical polymerization initiators that are used in synthesizing the polymer to be used in the invention include known compounds such as azo based initiators and peroxide initiators.

The binder polymer to be used in the invention may be used singly or in admixture of two or more thereof. In the case where the polymerizable composition of the invention is used as an image recording material of lithographic printing plate precursor, the addition amount of the binder polymer is from 20 to 95% by weight, and preferably from 30 to 90% by weight based on the whole of solids of the image recording material. When the addition amount of the binder polymer is less than 20% by weight, an effect for increasing the strength of an image area is not sufficiently obtained in forming an image. On the other hand, when it exceeds 95% by weight, an image is not formed. Also, it is preferable that a weight ratio of the compound containing at least one ethylenically unsaturated double bond to the linear organic polymer is in the range of from 1/9 to 7/3.

The thus obtained polymerizable composition of the invention is excellent in sensitivity and storage stability and in particular, is suitably used as an image recording material of negative working lithographic printing plate precursor.

[Application to Lithographic Printing Plate Precursor]

In using the polymerizable composition of the invention as an image recording material of lithographic printing plate precursor, the image recording material can be produced by dissolving the polymerizable composition in a solvent and coating the solution on a proper support. Also, additives, a backcoat layer, an interlayer, a protective layer, and others as described later can be formed according to the purpose.

Dyestuffs having large absorption in visible light regions can be used as a coloring agent of image in the polymerizable composition of the invention. Specific examples include Oil Yellow #101, Oil Yellow #103, Oil Pink #312, Oil Green BG, Oil Blue BOS, Oil Blue #603, Oil Black BY, Oil Black BS, and Oil Black T-505 (all of which are manufactured by Orient Chemical Industries, Ltd.), Victoria Pure Blue, Crystal Violet (CI42555), Methyl Violet (CI42535), Ethyl Violet, Rhodamine B (CI145170B), Malachite Green (CI42000), Methylene Blue (CIS2015), and dyestuffs described in JP-A-62-293247. Also, pigments such as phthalocyanine based pigments, azo based pigments, carbon black, and titanium oxide can be suitably used.

It is preferable to add such a coloring agent because after the image formation, an image area and a non-Image area can be easily distinguished from each other. Incidentally, the addition amount of the coloring agent is from 0.01 to 10% by weight based on the whole of solids of the coating solution for recording layer.

Also, in the invention, for preventing unnecessary heat polymerization of the polymerizable compound from occurrence during preparation or preservation of the polymerizable composition, it is desired to add a small amount of a heat polymerization inhibitor. Suitable examples of heat polymerization inhibitors include hydroquinone, p-methoxyphenol, di-t-butyl-p-cresol, pyrogallol, t-butyl catechol, benzoquinone, 4,4,-thiobis(3-methyl-6-t-butylphenol), 2,2'-methylenebis(4-methyl-6-t-butylphenol), and N-nitroso-N-phenylhydroxylamine aluminum salt. The addition amount of the heat polymerization inhibitor is from about 0.01 to about 5% by weight on a basis of the weight of the whole of the composition. Also, if desired, for preventing polymerization inhibition by oxygen, a higher fatty acid derivative such as behenic acid and behenic amide may be added such that it is made locally present on the surface of the recording layer during drying step after coating. The addition amount of the higher fatty acid derivative is preferably from about 0.1% by weight to about 10% by weight of the whole of the composition.

Also, the polymerizable composition of the invention is mainly used for forming a recording layer of lithographic printing plate precursor. For broadening stability of the processing against the development condition of such a recording layer, nonionic surfactants described in JP-A-62-251740 and JP-A-3-208514 and ampholytic surfactants described in JP-A-59-121044 and JP-A-4-13149 can be added.

Specific examples of nonionic surfactants include sorbitan tristearate, sorbitan monopalmitate, sorbitan trioleate, stearic acid monoglyceride, and polyoxyethylene nonylphenyl ether.

Examples of ampholytic surfactants include alkyl di(aminoethyl) glycine, alkyl polyaminoethyl glycine hydrochloride, 2-alkyl-N-carboxyethyl-N-hydroxyethyl imidazolium betaines, and N-tetradecyl-N,N-betaine types (such as a trade name: Amorgen K manufactured by Daiichi Kogyo K.K.).

A proportion of the nonionic surfactant or ampholytic surfactant in the coating solution for recording layer is preferably from 0.05 to 15% by weight, and more preferably from 0.1 to 5% by weight.

In addition, for imparting flexibility of the coating film, etc., plasticizers are added to the coating solution for recording layer according to the invention, as the need arises. Examples include polyethylene glycol, tributyl citrate, diethyl phthalate, dibutyl phthalate, dihexyl phthalate, dioctyl phthalate, tricresyl phosphate, tributyl phosphate, trioctyl phosphate, and tetrahydrofurfuryl oleate.

In producing a lithographic printing plate precursor using the polymerizable composition of the invention, the constituent components of the polymerizable composition may be usually dissolved in a solvent along with respective components necessary for the coating solution, followed by coating the solution on an appropriate support. Examples of the solvent to be used herein include ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethyl sulfoxide, sulfolane, γ-butyrolactone, tolune, and water. However, it should not be construed that the invention is limited thereto. These solvents are used alone or in admixture. The concentration of the foregoing components (the whole of solids including the additives) in the solvent is preferably from 1 to 50% by weight.

Also, the coating amount (solids content) of the recording layer on the support obtained after coating and drying varies depending on the application, but so far as lithographic printing plate precursors are concerned, it is usually preferably from 0.5 to 5.0 g/m$^2$. When the coating amount decreases, while the apparent sensitivity becomes high, the film characteristics of the recording layer lower.

As the coating method, various methods can be employed. Examples include bar coater coating, rotary coating, spray coating, curtain coating, dip coating, air knife coating, blade coating, and roll coating.

Surfactants for improving the coating property, such as fluorine based surfactants described in JP-A-62-170950, can be added in the coating solution for recording layer according to the invention. The addition amount of such a surfactant is preferably from 0.01 to 1% by weight, and more preferably from 0.05 to 0.5% by weight in the solid contents of the whole of the recording layer.

(Support)

As the support to be used in the case of forming a lithographic printing plate precursor using the polymerizable composition of the invention, dimensionally stable plate-like materials can be used without particular limitations. Examples include papers, papers laminated with plastics (such as polyethylene, polypropylene, and polystyrene), metal plates (such as aluminum, zinc, and copper), and plastic films (such as cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, and polyvinyl acetal). These resin films or metal plates may be a plate made of a single material or a lamination made of two or more materials. Examples include papers or plastic films laminated or vapor deposited with the foregoing metals and laminate sheets of films of different plastics.

As the support, polyester films or aluminum plates are preferable. Above all, relatively cheap aluminum plates having good dimensional stability are particularly preferable. Suitable aluminum plates are pure aluminum plates and alloy plates containing aluminum as the major component and trace amounts of foreign elements, and further, plastic films laminated or vapor deposited with aluminum may be employed. Examples of foreign elements contained in aluminum alloys include silicon, iron, manganese, copper, magnesium, chromium, zinc, bismuth, nickel, and titanium. The content of foreign elements in the alloy is at most 10% by weight. In the invention, pure aluminum is particularly suitable. However, since it is difficult to produce completely pure aluminum from the standpoint of refining technology, those containing slightly foreign elements may be used. Aluminum plates that are applied in the invention are not specified with respect to their compositions, and those that have hitherto been known and used can be properly utilized.

The aluminum plates have a thickness of from about 0.1 to 0.6 mm, preferably from 0.15 to 0.4 mm, and especially preferably from 0.2 to 0.3 mm.

Prior to roughing the aluminum plate, if desired, the aluminum plate is subjected to degreasing processing with, for example, a surfactant, an organic solvent or an alkaline aqueous solution for the purpose of removing a rolling oil on the surface.

The roughing processing of the surface of the aluminum plate can be carried out by various methods such as a method of mechanically roughing the surface, a method of electrochemically dissolving and roughing the surface, and a method of chemically selectively dissolving the surface. As the mechanical method, known methods such as ball polishing, brush polishing, blast polishing, and buff polishing can be employed, As the electrochemical roughing method, a method of using an alternating current or direct current in a hydrochloric acid or nitric acid electrolytic solution can be employed. Also, a combination of the both methods disclosed in JP-A-54-63902 can also be utilized.

If desired, the thus roughed aluminum plate can be subjected to alkali etching processing, neutralization processing, and then anodic oxidation processing for the purpose of enhancing water retention or abrasion resistance of the surface. As electrolytes to be used for the anodic oxidation processing of the aluminum plate, various electrolytes capable of forming a porous oxidized film can be used. In general, sulfuric acid, phosphoric acid, oxalic acid, chromic acid, or mixed acids thereof can be used. A concentration of such an electrolyte is properly determined depending on the kind of electrolyte.

The processing condition of the anodic oxidation varies depending on the electrolyte and hence, cannot be unequivocally specified. In general, it is proper that: the concentration of electrolyte is from 1 to 80% by weight, the liquid temperature is from 5 to 70° C., the current density is from 5 to 60 A/dm$^2$, the voltage is from 1 to 100 V, and the electrolysis time is from 10 seconds to 5 minutes.

The amount of the anodically oxidized film is preferably 1.0 g/m$^2$ or more, and more preferably in the range of from 2.0 to 6.0 g/m$^2$. When the amount of the anodically oxidized film is less than 1.0 g/m$^2$, printing resistance is liable to be insufficient, or scuffs are likely formed in a non-image area of the lithographic printing plate, whereby so-called "scuff stain" in which an ink easily adheres to scuffs during printing is likely generated.

Incidentally, the anodic oxidation processing is applied on the surface of the support of the lithographic printing plate to be printed. However, it is general that an anodically oxidized film of from 0.01 to 3 g/m$^2$ is also formed on the aback surface due to spreading to back of electric lines of force.

After the anodic oxidation processing, the support surface is subjected to hydrophilic processing, and conventionally known processing methods are employed. As the hydrophilic processing, there is employed a method of using an alkali metal silicates (such as a sodium silicate aqueous solution) disclosed in U.S. Pat. Nos. 2,714,066, 3,181,461, 3,280,734 and 3,902,734. According to this method, the support is subjected to dip processing or electrolysis processing with a sodium silicate aqueous solution. Besides, there are employed a method of processing with potassium fluorozirconate disclosed in JP-B-36-22063 and a method of processing with polyvinylphosphonic acid disclosed in U.S. Pat. Nos. 3,276,868, 4,153,461 and 4,689,272.

Above all, the hydrophilic processing that is particularly preferable in the invention is silicate processing. The silicate processing will be described below.

The thus processed anodically oxidized film of aluminum plate is dipped in an aqueous solution having from 0.1 to 30% by weight, and preferably from 0.5 to 10% by weight of an alkali metal silicate and having a pH of from 10 to 13 at 25° C., for example, at from 15 to 80° C. for from 0.5 to 120 seconds. When the pH of the alkali metal silicate aqueous solution is lower than 10, the solution is gelled, whereas when it is higher than 13.0, the oxidized film is dissolved. Examples of the alkali metal silicate that is used in the invention include sodium silicate, potassium silicate, and lithium silicate. Examples of hydroxides that are used for increasing the pH of the alkali metal silicate aqueous solution include sodium hydroxide, potassium hydroxide, and lithium hydroxide. Incidentally, the processing solution may be compounded with alkaline earth metal salts or Group IVB metal salts. Examples of alkaline earth metal salts include water-soluble salts such as nitrates (such as calcium nitrate, strontium nitrate, magnesium nitrate, and barium nitrate), sulfates, hydrochlorides, phosphates, acetates, oxalates, and borates. Examples of Group IVB metal salts include titanium tetrachloride, titanium trichloride, potassium titanium fluoride, potassium titanium oxalate, titanium sulfate, titanium tetraiodide, zirconium chloride oxide, zirconium dioxide, zirconium oxychloride, and zirconium tetrachloride. These alkaline earth metal salts of Group IVB metal salts can be used alone or in combination of two or more thereof. The addition amount of such a metal salt is preferably in the range of from 0.01 to 10% by weight, and more preferably from 0.05 to 5.0% by weight.

Since hydrophilicity on the aluminum plate surface is further improved by the silicate processing, the ink hardly adheres to a non-image area during printing, whereby staining performance is enhanced.

(Backcoat Layer)

A backcoat is provided on the back surface of the support as the need arises. As such a backcoat, coating layers made of an organic high-molecular compound described in JP-A-5-45885 or of a metal oxide obtained by hydrolysis or polycondensation of an organic or inorganic metal compound described in JP-A-6-35174 are preferably used.

With respect to these coating layers, alkoxy compounds of silicon, such as $Si(OCH_3)_4$, $Si(OC_2H_5)_4$, $Si(OC_3H_7)_4$, and $Si(OC_4H_9)_4$, are cheap and readily commercially available, and coating layers made of a metal oxide obtained from such an alkoxy compound of silicon are excellent in development resistance and therefore, are especially preferable.

(Interlayer)

In the lithographic printing precursor of the invention, an interlayer nay be provided for the purpose of improving adhesion or staining property between the recording layer and the substrate. Specific examples of such an interlayer include those described in JP-B-50-7481, JP-A-54-72104, JP-A-59-101651, JP-A-60-149491, JP-A-60-232998, JP-A-3-56177, JP-A-4-282637, JP-A-5-16559, JP-A-5-246171, JP-A-7-159983, JP-A-7-314937, JP-A-8-202025, JP-A-8-320551, JP-A-9-34104, JP-A-9-236911, JP-A-9-269593, JP-A-10-69092, JP-A-10-115931, JP-A-10-161317, JP-A-10-260536, JP-A-10-282682, JP-A-11-84674, and Japanese Patent Application Nos. 8-225335, 8-270098, 9-195863, JP-A-9-195864, JP-A-9-89646, 9-106068, 9-183834, 9-264311, 9-127232, 9-245419, 10-127602, 10-170202, 11-36377, 11-165861, 11-284091 and 2000-14697.

(Protective Layer)

In the lithographic printing plate precursor of the invention, since exposure is usually carried out in air, a protective layer can further be provided on the recording layer. The protective layer prevents incorporation of low-molecular compounds such as oxygen and basic substances, which are present in air and are liable to inhibit image formation reaction caused by exposure in the recording layer, so that it becomes possible to realize exposure in air. Accordingly, such a protective layer is required to have characteristics such that it has low permeability of low-molecular compounds such as oxygen; it does not substantially inhibit permeation of light to be used for exposure; it has excellent adhesion to the recording layer; and it can readily be removed in the development step after the exposure. With respect to such protective layers, there have hitherto been made various devices r the details of which are described in U.S. Pat. No. 3,458,311 and JP-A-55-49729. As materials that can be used for protective layers, water-soluble high-molecular compounds having relatively excellent crystallinity can be used. Specific examples include water-soluble polymers such as polyvinyl alcohol, polyvinylpyrrolidone, acidic celluloses, gelatin, gum arabic, and polyacrylic acids. Especially, use of polyvinyl alcohol as the major component gives the best results with respect to basic characteristics such as oxygen shielding property and development removal property. The polyvinyl alcohol to be used in the protective layer may be partially substituted with an ester, an ether, or an acetal so far as it contains an unsubstituted vinyl alcohol unit for the sake of having necessary oxygen shielding property and water solubility. Also, the polyvinyl alcohol may partly have other copolymerization components. Examples of the polyvinyl alcohol include those having been hydrolyzed to an extent of from 71 to 100% by mole and having a weight average molecular weight in the range of from 300 to 2,400. Specific examples includes PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613, and L-8 (all of which are manufactured by Kuraray Co., Ltd.).

Components of the protective layer (inclusive of selection of PVA and use of additives), coating amount, etc. are selected while taking into account shielding property of oxygen, development removal property, fogging, adhesion, and scuff resistance. In general, the higher the degree of hydrolysis of PVA to be used (the higher the content of unsubstituted vinyl alcohol unit in the protective layer) and the thicker the film thickness, the higher the shielding property of low-molecular substances, therefore, such is advantageous on the point of sensitivity. However, where the shielding property of low-molecular substances is extremely increased, there are caused problems such that unnecessary polymerization reaction takes place at the time of manufacture and unprocessed stock storage and that unnecessary fogging and thickening of image lines are generated at the time of imagewise exposure. Also, adhesion to an image area and scuff resistance are also extremely important in handling printing plates. That is, when a hydrophilic layer made of a water-soluble polymer is laminated on an oleophilic recording layer, film separation is liable to take place due to shortage of adhesive force, whereby the separated part causes defects such as poor film curing due to polymerization inhibition by oxygen. In contrast, various proposals have been made for improving the adhesion between these two layers. For example, U.S. Pat. Nos. 292, 501 and 44,563 describe that by mixing from 20 to 60% by weight of an acrylic emulsion or a water-insoluble polyvinylpyrrolidone-vinyl acetal copolymer in a hydrophilic polymer mainly composed of polyvinyl alcohol and laminating the mixture on a recording layer, sufficient adhesion is obtained.

For the protective layer in the invention, any of these known technologies can be applied. Coating methods of such protective layers are described in detail in, for example, U. S. Pat. No. 3,458,311 and JP-A-55-49729.

(Exposure, Development and Printing)

In the lithographic printing plate precursor in which the polymerizable composition of the invention is formed as a recording layer on the surface of the support, recording can be carried out using infrared lasers. Also, thermal recording can be carried out using an ultraviolet lamp or a thermal head. In the invention, it is preferable that image exposure is carried out using solid lasers or semiconductor lasers capable of radiating infrared rays having a wavelength of from 760 nm to 1,200 nm.

After the exposure with infrared lasers, it is preferable that the polymerizable composition of the invention is developed with water or an alkaline aqueous solution.

In the case where an alkaline aqueous solution is used as a developing solution, conventionally known alkaline aqueous solutions can be used as the developing solution and replenisher of the polymerizable composition of the invention. Examples include inorganic alkali salts such as sodium silicate, potassium silicate, sodium tertiary phosphate, potassium tertiary phosphate, ammonium tertiary phosphate, sodium secondary phosphate, potassium secondary phosphate, ammonium secondary phosphate, sodium carbonate, potassium carbonate, ammonium carbonate, sodium hydrogencarbonate, potassium hydrogencarbonate, ammonium hydrogencarbonate, sodium borate, potassium borate, ammonium borate, sodium hydroxide, ammonium hydroxide, potassium hydroxide, and lithium hydroxide. Also, organic alkaline agents such as monoethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine, and pyridine can be used.

These alkaline agents are used alone or in combination of two or more thereof,

In addition, in the case where development is carried out using an automatic processor, it is known that by adding one the same as in the developing solution or an aqueous solution (replenisher) having a higher alkaline strength than the developing solution to the developing solution, a large amount of lithographic printing plate precursors can be processed without exchanging the developing solution as used in a developing bath over a long period of time. This replenishment mode is preferably applied, too in the invention.

For the purposes of accelerating or retarding developability, diffusing development scums, and enhancing ink-philic property of image areas of printing plates, various surfactants and organic solvents can be added to the developing solution and replenisher, as the need arises. As surfactants, anionic, cationic, nonionic and ampholytic surfactants are preferable. As organic solvents, benzyl alcohol is preferable. Also, it is also preferable to add polyethylene glycol or its derivatives, or propylene glycol or its derivatives. Also, non-reducing sugars such as arabitol, sorbitol, and mannitol can be added.

In addition, it is possible to add hydroquinone, resorcin, inorganic salt based reducing agents such as sodium salts or potassium salts of sulfurous acid or hydrogensulfurous acid, organic carboxylic acids, defoaming agent, or hard water softeners to the developing solution and replenisher, as the need arises.

The printing plate thus developed using the developing solution and replenisher is subjected to post treatment with, for example, washing water, a rinse solution containing a surfactant, etc., and a desensitizing solution containing gum arabic or starch derivatives. In the case where the polymerizable composition of the invention is used as a printing plate material, these treatments can be employed through various combinations as the post treatment.

In recent years, in the industries of plate making and printing, for the purposes of rationalization and standardization, an automatic processor for printing plate material is widely used. Such an automatic processor generally includes a development section and a post treatment section and further includes a unit for conveying a printing plate and respective processing solution tanks and spray units, in which an exposed printed plate is conveyed horizontally and developed while spraying each of processing solutions drawn up by a pump from spray nozzles. Also, recently, there is also known a method in which printing plate materials are processed in a processing solution tank filled with a processing solution while dipping and conveying by guide rollers. In such automatic processing, the processing can be performed while replenishing a replenisher to each processing solution according to the processing amount and operation time. Also, the processing solution can be automatically replenished upon detection of the electric conductivity by a sensor.

Also, a so-called non-returnable processing system of treating with a substantially virgin processing solution can be applied.

The thus obtained lithographic printing plate can be provided for printing step after coating a desensitizing gum, if desired. In the case where a lithographic printing plate is required to have higher printing resistance, the lithographic printing plate is subjected to burning processing.

In the case where a lithographic printing plate is subjected to burning processing, it is preferable to treat the lithographic printing plate with a surface conditioning solution described in JP-B-61-2518, JP-B-55-28062, JP-A-62-31859, and JP-A-61-159655 prior to the burning processing.

Examples of methods of performing such processing include a method in which a surface conditioning solution is coated on a lithographic printing plate using a sponge or absorbent cotton impregnated with the surface conditioning solution, a method in which the lithographic printing plate is dipped in a vat filled with a surface conditioning solution and coated with the surface conditioning solution, and a method in which a surface conditioning solution is coated using an automated coater. Also, what a coating amount is made uniform after coating by a squeegee or a squeegee roller gives rise more preferred results.

A suitable coating amount of the surface conditioning solution is in general from 0.03 to 0.8 $g/m^2$ (on a dry weight).

The surface conditioning solution-coated lithographic printing plate is heated at high temperatures by a burning processor (for example, a burning processor "BP-1300", sold by Fuji Photo Film Co., Ltd.), etc. after drying, as the need arises. In this case, the heating temperature and time vary depending on the kind of components forming an image, and the heating is preferably carried out at a temperature in the range of from 180 to 300° C. for a period of time in the range of from 1 to 20 minutes.

If desired, the burning processed lithographic printing plate can be properly subjected to conventionally employed processings such as water washing and gumming. In the case where a surface conditioning solution containing a water-soluble high-molecular compound is used, so-called desensitizing processing such as gumming can be omitted.

The lithographic printing plate obtained from the polymerizable composition of the invention through such processings is fixed in an offset printer and used for producing a number of prints.

EXAMPLES

The invention will be described below in more detail with reference to the following Examples, but it should not be construed that the invention is limited thereto. Incidentally, in the Examples of the present application, lithographic printing plates using the polymerizable composition of the invention as a recording material were evaluated, and the evaluation thereof is made evaluation of the polymerizable composition of the invention.

[Confirmation of Polarity Conversion]

Compound (A) and comparative compounds to be used in the following Examples were subjected to differential thermal analysis to determine the temperature at which a weight loss occurred (described in Table as "polarity conversion temperature"). Then the pyrolysis compound was identified at that temperature by means of NMR to confirm the occurrence of decarboxylation or dehydration.

Polarity conversion temperature of each compound is shown in the following Table 1.

TABLE 1

| Exemplified compound | Polarity conversion temperature (° C.) |
|---|---|
| (4) | 227 |
| (43) | 200 |
| (41) | 137 |
| (25) | 180 |
| (28) | 198 |
| (35) | 201 |
| (46) | 210 |
| (51) | 223 |
| (52) | 184 |
| (53) | 196 |
| (A-1) | 205 |
| (A-10) | 197 |
| (A-15) | 182 |
| H-1 | No polarity conversion |
| H-2 | No polarity conversion |
| H-3 | No polarity conversion |

Examples 1 to 23 and Comparative Examples 1 to 2

(Preparation of Support)

A melt of an alloy of JIS A1050 containing 99.5% or more of aluminum, 0.30% of Fe, 0.10% of Si, 0.02% of Ti, and 0.013% of Cu was subjected to cleaning processing and cast. In the cleaning processing, for the sake of removing unnecessary gases such as hydrogen in the melt, degassing processing was carried out, and ceramic tube filter processing was carried out. The casting method was a DC casting method. The solidified ingot having a plate thickness of 500 mm was subjected to surface grinding in a depth of 10 mm from the surface and then to homogenizing processing at 550° C. for 10 hours such that an intermetallic compound did not become coarse.

Next, the resulting ingot was subjected to hot rolling at 400° C., intermediate annealing at 500° C. for 60 seconds in a continuous annealing furnace, and then cold rolling to form an aluminum rolled plate having a plate thickness of 0.30 mm. By controlling roughness of the rolled role, the center line average surface roughness (Ra) after cold rolling was controlled to 0.2 μm. Thereafter, in order to enhance the flatness, the rolled plate was processed by a tension leveler.

Next, surface processing was carried out for processing the rolled plate into a support of lithographic printing plate.

First of all, for the purpose of removing a rolling oil on the surface of the aluminum plate, the aluminum plate was subjected to degreasing processing with a 10% sodium aluminate aqueous solution at 50° C. for 30 seconds and neutralized with a 30% sulfuric acid aqueous solution at 50° C. for 30 seconds to undergo desmutting processing.

Next, the resulting aluminum plate was subjected to so-called sandblasting processing for making adhesion between the support and the recording layer good and imparting water retention to a non-image area. Electrolytic sandblasting was carried out by keeping an aqueous solution containing 1% of nitric acid and 0.5% of aluminum nitrate at 45° C., passing the aluminum web into the aqueous solution, and applying an alternating waveform current at a current density of 20 $A/dm^2$, at a duty ratio of 1:1 and at an electrical quantity at anodization of 240 $C/dm^2$ from an indirect electric supply cell. Thereafter, the resulting aluminum plate was etched with a 10% sodium aluminate aqueous solution at 50° C. for 30 seconds and neutralized with a 30% sulfuric acid aqueous solution at 50° C. for 30 seconds to undergo desmutting processing.

Further, for the sake of enhancing abrasion resistance, chemical resistance and water retention, an oxidized film was formed on the support by anodic oxidation. A 20% sulfuric acid aqueous solution was used at 35° C. as an electrolyte, and the aluminum web was subjected to electrolytic processing with a direct current at 14 $A/dm^2$ from an indirect electric supply cell while passing it into the electrolyte, to prepare an anodically oxidized film of 2.5 $g/m^2$.

(Formation of Recording Layer)

A coating solution 1 for recording layer having the following formulation was prepared, coated on the aluminum support as obtained above using a wire bar, and dried at 115° C. for 45 seconds in a warm air dryer, to form a recording layer. The formed recording layer had a coating amount after drying falling within the range of from 1.2 to 1.3 $g/m^2$. Further, a coating solution for overcoat layer having the following formulation was coated using a slide hopper and dried at 120° C. for 75 seconds in a warm air dryer, to obtain a lithographic printing plate precursor according to the invention. The thus obtained overcoat layer had a coating amount of 2.3 $g/m^2$.

<Coating Solution 1 for Recording Layer>

| | |
|---|---|
| Component (A): (Mono)carboxylic acid (compound amd amount shown in Table 2): | |
| Component (B): Radical initiator (compound shown in Table 2): | 0.35 g |
| Component (C): Polymerizable compound (M-1) (having a structure shown below): | 2.00 g |
| Component (D): Infrared ray absorber (IR-1) (having a structure shown below): | 0.08 g |
| Component (E) Binder polymer (compound shown in Table 2): | 2.0 g |
| Naphthalenesulfonic acid salt of Victoria Pure Blue: | 0.04 g |
| Fluorine based surfactant (Megaface F-176 manufactured by Dainippon Ink and Chemicals, Incorporated) | 0.01 g |
| Methyl ethyl ketone: | 9.0 g |
| Methanol: | 10.0 g |
| 1-Methoxy-2-propanol: | 8.0 g |

<Coating Solution for Overcoat Layer>

| | |
|---|---|
| Polyvinyl alcohol (degree of hydrolysis: 98.5% by mole, degree of polymerization: 500): | 2.5 g |
| Polyvinylpyrrolidone (K30 manufactured by Tokyo Kasei Kogyo Co., Ltd., molecular weight: 40,000): | 0.5 g |
| Nonionic surfactant (EMAREX NP-10 manufactured by Nihon-Emulsion Co., Ltd.): | 0.05 g |
| Ion exchanged water: | 96.95 g |

Incidentally, the compound (A) used in the Examples of the invention are a compound having a group represented by the above-illustrated formula (I) or a compound represented by the above-illustrated formula (I-A), and the monocarboxylic acid compounds (H-1), (H-2) and (H-3) used in the Comparative Examples are a carboxylic acid compound falling outside the scope of the invention, the structures of which are illustrated below.

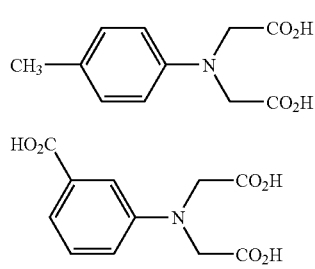

(H-1)

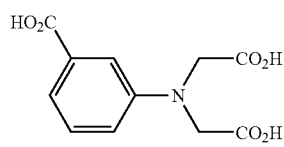

(H-2)

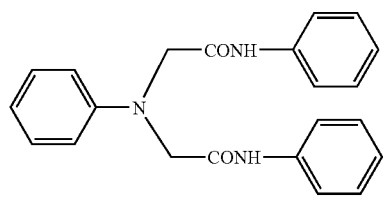

(H-3)

Next, the structures of the radical initiators (S-1) to (S-6) that are used in the Examples and Comparative Examples of the invention are illustrated below.

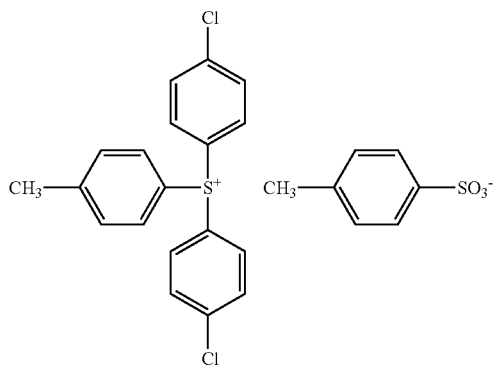

(S-1)

-continued

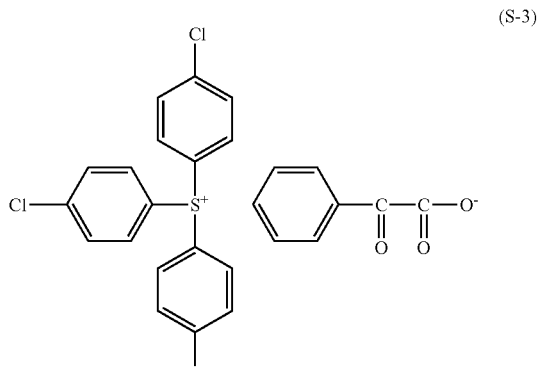

(S-2)

(S-3)

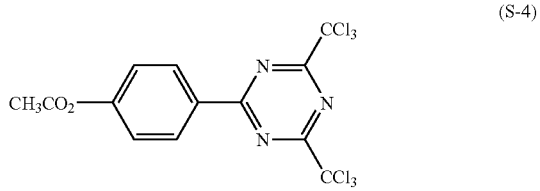

(S-4)

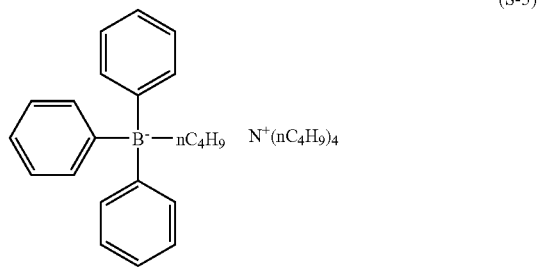

(S-5)

(S-6)

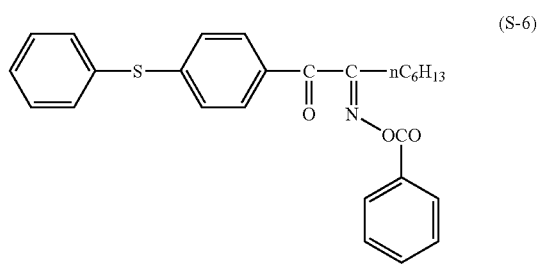

Next, the structures of the polymerizable compounds (M-1) to (M-3) that are used in the Examples and Comparative Examples of the invention are illustrated below.

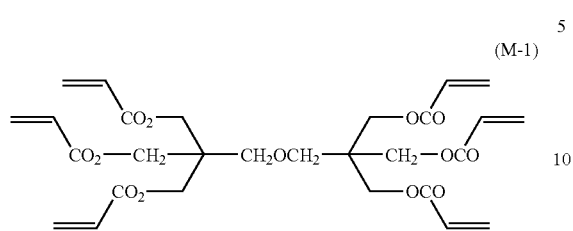
(M-1)

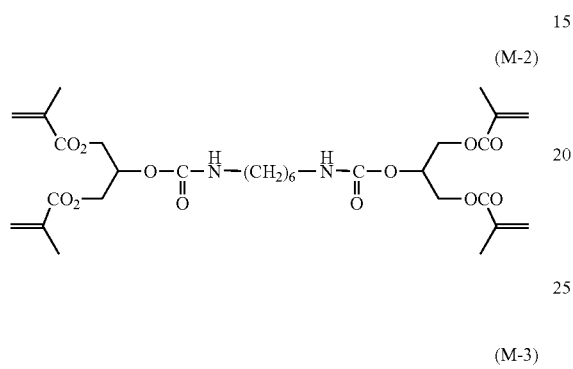
(M-2)

(M-3)

Next, the structures of the infrared ray absorbers (IR-1) to (IR-3) that are used in the Examples and Comparative Examples of the invention are illustrated below.

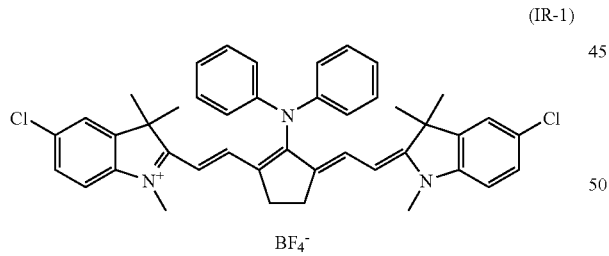
(IR-1)

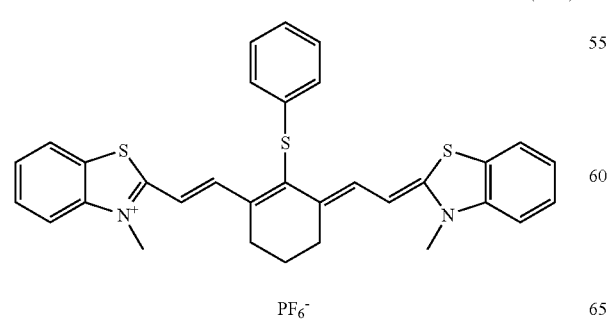
(IR-2)

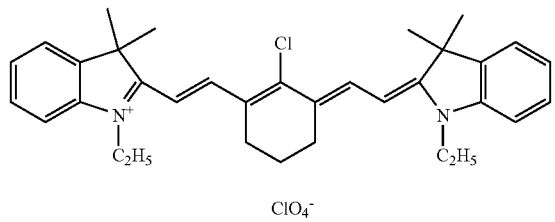
(IR-3)

Next, the structures of the binder polymers (P-1) to (P-3) that are used in the Examples and Comparative Examples of the invention are illustrated below.

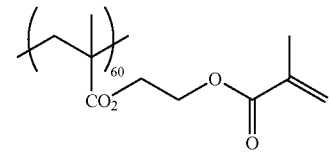

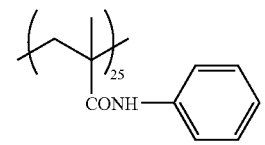

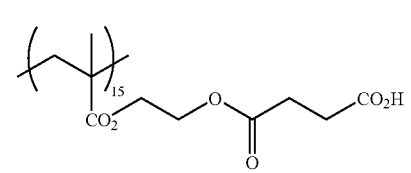
(P-1)

Mw 110,000

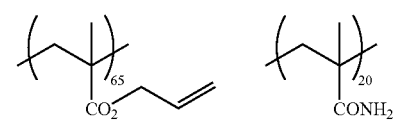

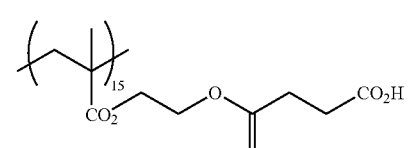
(P-2)

Mw 130,000

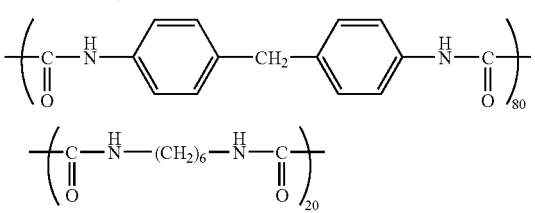

-continued

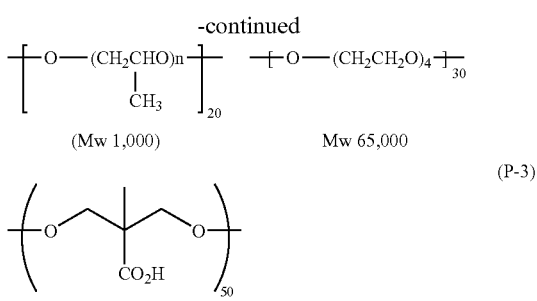

(P-3)

(Exposure)

Each of the thus obtained lithographic printing plate precursors was exposed using Creo's Trendsetter 3244VFS mounted with a water-cooled 40-W infrared semiconductor laser under conditions of an output of 9 W, a number of revolution of external drum of 210 rpm, a plate surface energy of 100 mJ/cm², and a resolution of 2,400 dpi.

(Development Processing)

After exposure, each of the exposed lithographic printing plate precursors was developed using an automatic processor, Stablon 900N manufactured by Fuji Photo Film Co., Ltd. As a developing solution, a (1/4) water-diluted solution of DV-2 manufactured by Fuji Photo Film Co., Ltd. was used for both of a charge solution and a replenisher. The temperature of the development bath was set up at 30° C. Also, a (1/1) water-diluted solution of FN-6 manufactured by Fuji Photo Film Co., Ltd. (pH=10.8) was used as a finisher.

[Evaluation of Printing Resistance]

Each of the resulting lithographic printing plates was printed using an ink of GEOS-G(N) manufactured by Dainippon Ink and Chemicals, Incorporated by a Roland's P201 printing machine. Printed matters of a solid image area were observed, and printing resistance was examined in terms of the number of sheets at which the image started to become faint. The larger the number of sheets, the more excellent the printing resistance is. The results are shown in Table 2.

[Evaluation of Sensitivity]

An amount of energy necessary for recording was computed based on a line width of the image obtained by the foregoing exposure (by infrared laser having a wavelength of from about 830 to 850 nm) and development, a laser output, a loss of the optical system, and a scanning rate. The smaller the numerical value, the higher the sensitivity is. The results are shown in Table 2.

TABLE 2

| | (Mono)carboxylic acid compound | Radical initiator | Binder polymer | Sensitivity (mJ/cm²) | Printing resistance (number of sheets, ×10,000) |
|---|---|---|---|---|---|
| Example 1 | (A-1) 0.12 g | S-1 | P-1 | 70 | 6.2 |
| Example 2 | (A-10) 0.15 g | S-1 | P-1 | 65 | 6.5 |
| Example 3 | (A-15) 0.17 g | S-1 | P-1 | 55 | 7.1 |
| Example 4 | (A-17) 0.13 g | S-1 | P-1 | 60 | 6.8 |
| Example 5 | (A-21) 0.15 g | S-1 | P-1 | 60 | 6.1 |
| Example 6 | (A-24) 0.12 g | S-1 | P-1 | 45 | 8.3 |
| Example 7 | (A-24) 0.14 g | S-2 | P-1 | 45 | 8.2 |
| Example 8 | (A-24) 0.17 g | S-3 | P-1 | 40 | 8.5 |
| Example 9 | (A-24) 0.14 g | S-1 | P-2 | 45 | 7.9 |
| Example 10 | (A-52) 0.16 g | S-2 | P-1 | 40 | 8.7 |
| Example 11 | (A-52) 0.18 g | S-2 | P-2 | 43 | 8.6 |
| Example 12 | (A-55) 0.15 g | S-1 | P-1 | 42 | 8.4 |
| Example 13 | (A-58) 0.18 g | S-1 | P-1 | 40 | 8.2 |
| Example 14 | (A-62) 0.19 g | S-2 | P-1 | 42 | 8.3 |
| Example 15 | (35) 0.12 g | S-1 | P-1 | 55 | 7.1 |
| Example 16 | (28) 0.13 g | S-1 | P-1 | 60 | 6.8 |
| Example 17 | (46) 0.12 g | S-1 | P-1 | 45 | 8.3 |
| Example 18 | (46) 0.14 g | S-2 | P-1 | 45 | 8.2 |
| Example 19 | (46) 0.17 g | S-3 | P-1 | 40 | 8.5 |
| Example 20 | (46) 0.14 g | S-1 | P-2 | 45 | 7.9 |
| Example 21 | (51) 0.15 g | S-1 | P-1 | 42 | 8.4 |
| Example 22 | (52) 0.18 g | S-1 | P-1 | 40 | 8.2 |
| Example 23 | (53) 0.19 g | S-2 | P-1 | 42 | 8.3 |
| Comparative Example 1 | Nil | S-1 | P-1 | 100 | 3.2 |
| Comparative Example 2 | (H-1) 0.12 g | S-1 | P-1 | 100 | 2.7 |

As is clear from Table 2, it has been noted that the lithographic printing plates of Examples 1 to 23, in which the compound (A) according to the invention is added, are excellent in printing resistance and sensitivity as compared with the lithographic printing plates of Comparative Examples 1 to 2, in which the monocarboxylic acid compound according to the invention is not added.

Examples 24 to 39 and Comparative Examples 3 to 5

(Formation of Undercoat Layer)

An undercoating solution having the following formulation was coated on an aluminum support the same as in Example 1 using a wire bar and dried at 90° C. for 30 seconds using a water air dryer. The thus obtained undercoat layer had a coating amount of 10 mg/m².

<Undercoating Solution>

| β-Alanine: | 0.1 g |
|---|---|
| Phenylsulfonic acid: | 0.1 g |
| Methanol: | 40 g |
| Pure water: | 60 g |

(Formation of Recording Layer)

Next, a coating solution 2 for recording layer having the following formulation was prepared, coated on the foregoing undercoated aluminum support using a wire bar, and dried at 115° C. for 45 seconds in a warm air dryer, to form a recording layer. The formed recording layer had a coating amount after drying falling within the range of from 1.2 to 1.3 g/m². Further, a coating solution for overcoat layer the same as in Example 1 was coated using a slide hopper and dried at 120° C. for 75 seconds in a warm air dryer, to obtain a lithographic printing plate precursor. The thus obtained overcoat layer had a coating amount of 2.3 g/m².

<Coating Solution 2 for Recording Layer>

| Component (A): (Mono)carboxylic acid (compound and amount shown in Table 3): | |
|---|---|
| Component (B): Radical initiator (S-1): | 0.35 g |
| Component (C): Polymerizable compound (compound shown in Table 3): | 2.00 g |
| Component (D): Infrared ray absorber (IR-1): | 0.08 g |
| Component (E) Binder polymer (compound shown in Table 3): | 2.0 g |

| Naphthalenesulfonic acid salt of Victoria Pure Blue: | 0.04 g |
|---|---|
| Fluorine based surfactant (Megaface F-176 manufactured by Dainippon Ink and Chemicals, Incorporated) | 0.01 g |
| Methyl ethyl ketone: | 9.0 g |
| Methanol: | 10.0 g |
| 1-Methoxy-2-propanol: | 8.0 g |

(Exposure and Development Processing)

Each of the thus obtained lithographic printing plate precursors was exposed with infrared laser and developed in the same manner as in Example 1 to obtain a lithographic printing plate.

[Evaluation of Printing Resistance and Staining Property and Storage Stability of Non-image Area]

Each of the thus obtained lithographic printing plates was printed using an ink of DIC GEOS-G(N) Black manufactured by Dainippon Ink and Chemicals, Incorporated by a Lithrone printing machine manufactured by Komori Corporation. During this time, how many sheets could be printed while keeping a sufficient ink density was visually measured, thereby evaluating printing resistance and staining property of non-image area.

Also, the thus obtained lithographic printing plate precursors were forcibly preserved with time at 60° C. for 3 days and at 45° C. and at a humidity of 75% RH for 3 days, respectively, and then subjected to the same printing processing, thereby evaluating printing resistance and staining property (storage stability) of non-image area. The results are shown in Table 3.

TABLE 3

| | Monocarboxylic acid compound | Polymerizable compound | Binder polymer | Printing resistance and staining property of non-image area | | |
|---|---|---|---|---|---|---|
| | | | | Without forced elapsing | At 60° C. for 3 days | At 45° C. and at a humidity of 75% for 3 days |
| Example 24 | (A-24) 0.16 g | M-1 | P-1 | 95,000 sheets, not stained | 95,000 sheets, not stained | 95,000 sheets, not stained |
| Example 25 | (A-24) 0.16 g | M-2 | P-1 | 95,000 sheets, not stained | 95,000 sheets, not stained | 95,000 sheets, not stained |
| Example 26 | (A-24) 0.16 g | M-3 | P-1 | 95,000 sheets, not stained | 95,000 sheets, not stained | 95,000 sheets, not stained |
| Example 27 | (A-24) 0.16 g | M-2 | P-3 | 120,000 sheets, not stained | 120,000 sheets, not stained | 120,000 sheets, not stained |
| Example 28 | (A-24) 0.16 g | M-3 | P-3 | 120,000 sheets, not stained | 120,000 sheets, not stained | 120,000 sheets, not stained |
| Example 29 | (A-52) 0.20 g | M-1 | P-1 | 98,000 sheets, not stained | 98,000 sheets, not stained | 98,000 sheets, not stained |
| Example 30 | (A-55) 0.21 g | M-1 | P-1 | 97,000 sheets, not stained | 97,000 sheets, not stained | 97,000 sheets, not stained |
| Example 31 | (A-83) 0.20 g | M-1 | P-1 | 100,000 sheets, not stained | 100,000 sheets, not stained | 100,000 sheets, not stained |
| Example 32 | (A-64) 0.19 g | M-1 | P-2 | 98,000 sheets, not stained | 98,000 sheets, not stained | 98,000 sheets, not stained |
| Example 33 | (A-69) 0.25 g | M-1 | P-1 | 105,000 sheets, not stained | 105,000 sheets, not stained | 105,000 sheets, not stained |
| Example 34 | (A-84) 0.25 g | M-1 | P-1 | 102,000 sheets, not stained | 102,000 sheets, not stained | 102,000 sheets, not stained |
| Example 35 | (53) 0.20 g | M-1 | P-1 | 98,000 sheets, not stained | 98,000 sheets, not stained | 98,000 sheets, not stained |
| Example 36 | (28) 0.21 g | M-1 | P-1 | 97,000 sheets, not stained | 97,000 sheets, not stained | 97,000 sheets, not stained |
| Example 37 | (52) 0.18 g | M-1 | P-1 | 100,000 sheets, not stained | 100,000 sheets, not stained | 100,000 sheets, not stained |
| Example 38 | (41) 0.19 g | M-1 | P-2 | 75,000 sheets, not stained | 75,000 sheets, not stained | 75,000 sheets, not stained |

TABLE 3-continued

|  |  |  |  | Printing resistance and staining property of non-image area | | |
|---|---|---|---|---|---|---|
| | Monocarboxylic acid compound | Polymerizable compound | Binder polymer | Without forced elapsing | At 60° C. for 3 days | At 45° C. and at a humidity of 75% for 3 days |
| Example 39 | (42) 0.25 g | M-1 | P-1 | 80,000 sheets, not stained | 80,000 sheets, not stained | 80,000 sheets, not stained |
| Comparative Example 3 | Nil | M-1 | P-1 | 62,000 sheets, not stained | 62,000 sheets, stained | 50,000 sheets, stained |
| Comparative Example 4 | (H-2) 0.18 g | M-1 | P-1 | 50,000 sheets, not stained | 50,000 sheets, stained | 25,000 sheets, stained |
| Comparative Example 5 | (H-3) 0.18 g | M-1 | P-1 | 50,000 sheets, not stained | 50,000 sheets, stained | 25,000 sheets, stained |

As is clear from Table 3, it has been confirmed that the lithographic printing plates of Examples 24 to 39, in which the compound (A) according to the invention is added, are free from staining in non-image area and excellent in printing resistance and storage stability as compared with the lithographic printing plates of Comparative Examples 3 to 5, in which the compound according (A) to the invention is not added.

Examples 40 to 56 and Comparative Examples 6 to 9

(Formation of Undercoat Layer)

A liquid composition (sol liquid) of the SG method was prepared on a support the same as in Example 1 according the following procedures, to provide an undercoat layer.

<Sol Liquid Composition>

| Methanol: | 130 g |
|---|---|
| Water: | 20 g |
| 85% by weight phosphoric acid: | 16 g |
| Tetraethoxysilane: | 50 g |
| 3-Methacryloxypropyltrimethoxysilane: | 60 g |

The foregoing sol liquid composition was mixed and stirred. As a result, heat generation was found about 5 minutes after start of mixing and stirring. After reaction for 60 minutes, the contents were transferred to another vessel, to which was then added 3,000 g of methanol to obtain a sol liquid.

This sol liquid was diluted with a mixture of methanol and ethylene glycol (weight ratio: 9/1) and coated on a support the same as in Example 1 such that the amount of Si on the support was 30 mg/m$^2$, followed by drying at 100° C. for one minute to form an undercoat layer.

(Formation of Recording Layer)

Next, a coating solution 3 for recording layer having the following formulation was coated on the foregoing undercoated aluminum support using a wire bar and dried at 115° C. for 45 seconds in a warm air dryer, to form a recording layer. The formed recording layer had a coating amount after drying falling within the range of from 1.2 to 1.3 g/m$^2$. Further, a coating solution for overcoat layer the same as in Example 1 was coated using a slide hopper and dried at 120° C. for 75 seconds in a warm air dryer, to obtain a lithographic printing plate precursor. The thus obtained overcoat layer had a coating amount of 2.3 g/m$^2$.

<Coating Solution 3 for Recording Layer>

| Component (A): (Mono)carboxylic acid (compound and amount shown in Table 4): | |
|---|---|
| Component (B): Radical initiator (compound shown in Table 4): | 0.35 g |
| Component (C): Polymerizable compound (M-1): | 2.00 g |
| Component (D): Infrared ray absorber (compound shown in Table 4): | 0.08 g |
| Component (E) Binder polymer (P-1): | 2.0 g |
| Naphthalenesulfonic acid salt of Victoria Pure Blue: | 0.04 g |
| Fluorine based surfactant (Megaface F-176 manufactured by Dainippon Ink and Chemicals, Incorporated) | 0.01 g |
| Methyl ethyl ketone: | 9.0 g |
| Methanol: | 10.0 g |
| 1-Methoxy-2-propanol: | 8.0 g |

(Exposure and Development Processing)

Each of the thus obtained lithographic printing plate precursors was exposed with infrared laser and developed in the same manner as in Example 1 to obtain a lithographic printing plate.

[Evaluation of Printing Resistance and Staining Property and Storage Stability of Non-image Area]

Each of the thus obtained lithographic printing plates was evaluated with respect to sensitivity in the same manner as in Example 1.

Also, each of the thus obtained lithographic printing plate precursors was evaluated with respect to staining property (storage stability) of non-image area in the same manner as in Example 15. The results are shown in Table 4.

TABLE 4

| | (Mono)carboxylic acid compound | Radical initiator | Infrared ray absorber | Sensitivity (mJ/cm²) | Staining property of non-image area Without forced elapsing | At 60° C. for 3 days | At 45° C. and at a humidity of 75% for 3 days |
|---|---|---|---|---|---|---|---|
| Example 40 | (A-52) 0.19 g | S-2 | IR-1 | 40 | Not stained | Not stained | Not stained |
| Example 41 | (A-52) 0.19 g | S-4 | IR-1 | 40 | Not stained | Not stained | Not stained |
| Example 42 | (A-52) 0.23 g | S-4 | IR-2 | 40 | Not stained | Not stained | Not stained |
| Example 43 | (A-52) 0.25 g | S-5 | IR-3 | 45 | Not stained | Not stained | Not stained |
| Example 44 | (A-52) 0.23 g | S-6 | IR-1 | 40 | Not stained | Not stained | Not stained |
| Example 45 | (A-86) 0.19 g | S-2 | IR-1 | 33 | Not stained | Not stained | Not stained |
| Example 46 | (A-77) 0.18 g | S-2 | IR-1 | 38 | Not stained | Not stained | Not stained |
| Example 47 | (A-79) 0.21 g | S-2 | IR-1 | 40 | Not stained | Not stained | Not stained |
| Example 48 | (A-82) 0.18 g | S-2 | IR-1 | 35 | Not stained | Not stained | Not stained |
| Example 49 | (46) 0.19 g | S-2 | IR-1 | 40 | Not stained | Not stained | Not stained |
| Example 50 | (46) 0.19 g | S-4 | IR-1 | 40 | Not stained | Not stained | Not stained |
| Example 51 | (46) 0.23 g | S-4 | IR-2 | 40 | Not stained | Not stained | Not stained |
| Example 52 | (46) 0.25 g | S-5 | IR-3 | 45 | Not stained | Not stained | Not stained |
| Example 53 | (46) 0.23 g | S-6 | IR-1 | 40 | Not stained | Not stained | Not stained |
| Example 54 | (4) 0.20 g | S-2 | IR-1 | 50 | Not stained | Not stained | Not stained |
| Example 55 | (41) 0.21 g | S-2 | IR-1 | 50 | Not stained | Not stained | Not stained |
| Example 56 | (42) 0.18 g | S-2 | IR-1 | 50 | Not stained | Not stained | Not stained |
| Comparative Example 6 | Nil | S-4 | IR-1 | 50 | Not stained | Stained | Stained |
| Comparative Example 7 | Nil | S-4 | IR-2 | 55 | Not stained | Stained | Stained |
| Comparative Example 8 | Nil | S-5 | IR-3 | 50 | Not stained | Stained | Stained |
| Comparative Example 9 | Nil | S-6 | IR-1 | 50 | Not stained | Stained | Stained |

As is clear from Table 4 it has been confirmed that the lithographic printing plates of Examples 40 to 56, in which the compound (A) according to the invention is added, are free from staining in non-image area and excellent in sensitivity and storage stability as compared with the lithographic printing plates of Comparative Examples 6 to 9, in which the compound (A) according to the invention is not added.

Examples 57 to 79 and Comparative Examples 10 to 11

(Formation of Undercoat Layer)

An aluminum support the same as in Example 1 was subjected to silicate processing for the purpose of ensuring hydrophilicity as a non-image area of printing plate. The processing was carried out by passing the aluminum web into a 1.5% aqueous solution of No. 3 sodium silicate for a contact time of 15 seconds and washing the aluminum web with water. The adhesion amount of Si was 10 mg/m². The thus prepared support had an Ra (center line average surface roughness) of 0.25 μm.

(Formation of Recording Layer)

Next, a coating solution 4 for recording layer having the following formulation was coated on the foregoing undercoated aluminum support using a wire bar and dried at 115° C. for 45 seconds in a warm air dryer, to form a recording layer. The formed recording layer had a coating amount after drying falling within the range of from 1.2 to 1.3 g/m². Further, a coating solution for overcoat layer the same as in Example 1 was coated using a slide hopper and dried at 120° C. for 75 seconds in a warm air dryer, to obtain a lithographic printing plate precursor. The thus obtained overcoat layer had a coating amount of 2.3 g/m².

<Coating Solution 4 for Recording Layer>

| | |
|---|---|
| Component (A): (Mono)carboxylic acid (compound and amount shown in Table 5): | |
| Component (B): Radical initiator (S-1): | 0.40 g |
| Component (C): Polymerizable compound (M-1): | 1.80 g |
| Component (D): Infrared ray absorber (IR-1): | 0.06 g |
| Component (E) Binder polymer (P-1): | 2.20 g |
| Naphthalenesulfonic acid salt of Victoria Pure Blue: | 0.04 g |
| Fluorine based surfactant (Megaface F-176 manufactured by Dainippon Ink and Chemicals, Incorporated) | 0.01 g |
| Methyl ethyl ketone: | 9.0 g |
| Methanol: | 10.0 g |
| 1-Methoxy-2-propanol: | 8.0 g |

(Exposure and Development Processing)

Each of the thus obtained negative working lithographic printing plate precursors was subjected to exposure with infrared laser and development processing, to obtain a lithographic printing plate.

[Evaluation of Printing Resistance and Sensitivity]

Each of the thus obtained lithographic printing plates was evaluated with respect to printing resistance and sensitivity in the same manner as in Example 1. the results are shown in Table 5.

TABLE 5

| | (Mono)carboxylic acid compound | Sensitivity (mJ/cm²) | Printing resistance (number of sheets, ×10,000) |
|---|---|---|---|
| Example 57 | (A-27) 0.20 g | 70 | 8.5 |
| Example 58 | (A-28) 0.22 g | 65 | 8.3 |
| Example 59 | (A-32) 0.20 g | 55 | 8.5 |

TABLE 5-continued

| | (Mono)carboxylic acid compound | Sensitivity (mJ/cm$^2$) | Printing resistance (number of sheets, ×10,000) |
|---|---|---|---|
| Example 60 | (A-34) 0.18 g | 60 | 8.2 |
| Example 61 | (A-42) 0.25 g | 60 | 8.6 |
| Example 62 | (A-44) 0.19 g | 45 | 8.4 |
| Example 63 | (A-52) 0.22 g | 45 | 8.4 |
| Example 64 | (A-87) 0.21 g | 38 | 9.3 |
| Example 65 | (A-73) 0.19 g | 45 | 9 |
| Example 66 | (A-85) 0.19 g | 36 | 9.8 |
| Example 67 | (A-90) 0.21 g | 38 | 9.4 |
| Example 68 | (A-92) 0.19 g | 37 | 9.5 |
| Example 69 | (A-96) 0.21 g | 37 | 9.4 |
| Example 70 | (A-99) 0.20 g | 36 | 9.8 |
| Example 71 | (A-101) 0.22 g | 36 | 9.7 |
| Example 72 | (28) 0.20 g | 70 | 8.5 |
| Example 73 | (41) 0.22 g | 65 | 7.9 |
| Example 74 | (63) 0.20 g | 55 | 8 |
| Example 75 | (35) 0.25 g | 60 | 8.6 |
| Example 76 | (67) 0.19 g | 45 | 8.4 |
| Example 77 | (33) 0.22 g | 45 | 8.4 |
| Example 78 | (51) 0.19 g | 45 | 9 |
| Example 79 | (52) 0.15 g | 40 | 9 |
| Comparative Example 10 | Nil | 110 | 4.2 |
| Comparative Example 11 | (H-1) 0.12 g | 110 | 3.5 |

As is clear from table 5, it has been confirmed that the lithographic printing plates of Examples 57 to 79, in which the compound (A) according to the invention is added, are excellent in printing resistance and sensitivity as compared with the lithographic printing plates of Comparative Examples 10 to 11, in which the compound (A) according to the invention is not added.

In the light of the above, it has been noted that according to the invention, the polymerizable compositions of the invention, in which the compound (A) represented by the formula (I) is added, are excellent in sensitivity, printing resistance and storage stability and are useful as an image recording material of lithographic printing plate precursor.

According to the invention, it is possible to obtain a polymerizable composition useful as an image recording material of negative working lithographic printing plate precursor having excellent sensitivity and storage stability.

This application is based on Japanese Patent application JP 2003-43087, filed Feb. 20, 2003, and Japanese Patent application JP 2003-194852, filed Jul. 10, 2003 the entire content of which is hereby incorporated by reference, the same as if set forth at length.

What is claimed is:

1. A polymerizable composition comprising:
(A) a monocarboxylic acid compound which causes at least one of decarboxylation and dehydration by heat;
(B) a radical initiator;
(C) a compound having at least one ethylenically unsaturated bond; and
(D) an infrared ray absorber,
wherein the compound (A) and the radical initiator (B) are separate and distinct compounds from each other, and
wherein the compound (A) is one having a group represented by the following formula:

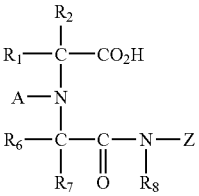

wherein

A represents an aromatic group or a heterocyclic group,
$R^1$, $R^2$, $R^6$, $R^7$ and $R^8$ each independently represents a hydrogen atom or a monovalent substituent, provided that $R^1$ and $R^2$, either one of $R^1$ and $R^2$ and A, or $R^8$ and Z may be taken together to form a ring structure, and
Z represents a monovalent substituent.

2. The polymerizable composition according to claim 1, wherein the compound (A) is one which causes at least one of decarboxylation and dehydration at a temperature of 100° C. to 300° C.

3. The polymerizable composition according to claim 1, wherein the compound (A) is one having a structure capable of forming a 4 to 6-membered lactone ring, a 4 to 6-membered lactam ring or a 4 to 6-membered cyclic acid anhydride.

4. A lithographic printing plate precursor comprising a support and a recording layer containing the polymerizable composition of claim 1.

5. A polymerizable composition comprising:
(A-1) a monocarboxylic acid compound represented by the following formula (I-2);
(B) a radical initiator;
(C) a compound having at least one ethylenically unsaturated bond; and
(D) an infrared ray absorber:

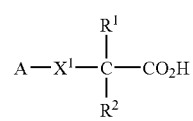

(I-2)

wherein

A represents an aromatic group or a heterocyclic group,
$R^1$ and $R^2$ each independently represents a hydrogen atom or a monovalent substituent, provided that $R^1$ and $R^2$, either one of $R^1$ and $R^2$ and $X^1$, either one of $R^1$ and $R^2$ and A, or A and $X^1$ may be taken together to form a ring structure,
$X^1$ represents a divalent connection group selected from —SO$_2$—, —N(R$^3$)—, —CH$_2$—, —CH(R$^4$)—, and —C(R$^4$)(R$^5$)—,
$R^3$ represents a monovalent substituent represented by one of the following formulae (i) and (ii):

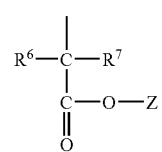

(i)

-continued

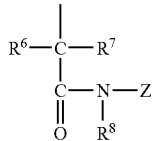

(ii)

wherein, $R^6$, $R^7$ and $R^8$ each independently represents a hydrogen atom or a monovalent substituent, Z represents a monovalent substituent, and $R^8$ and Z may be taken together to form a ring structure, and $R^4$ and $R^5$ each independently represents a hydrogen atom or a monovalent substituent.

6. The polymerizable composition according to claim 5, wherein the umnovalent substituent represented by $R^1$ and $R^2$ is a halogen atom, a optionally substituted amino group, a alkoxycarbonyl group, a hydroxyl group, a ether group, a thiol group, a thioether group, a silyl group, a nitro group, a cyano group, a optionally substituted alkyl group, a optionally substituted alkenyl group, a optionally substituted alkynyl group, a optionally substituted aryl group, or a optionally substituted heterocyclic group.

7. A lithographic printing plate precursor comprising a support and a recording layer containing the polymerizable composition of claim 5.

* * * * *